US012712246B2

(12) United States Patent
Ikemoto et al.

(10) Patent No.: US 12,712,246 B2
(45) Date of Patent: Aug. 18, 2026

(54) MULTILAYER SUBSTRATE INCLUDING INSULATING LAYERS, SIGNAL CONDUCTIVE LAYERS AND GROUND LAYERS AND HAVING THROUGH HOLES EXTENDING ALONG INTERSECTING DIRECTIONS

(71) Applicant: Murata Manufacturing Co., Ltd., Nagaokakyo (JP)

(72) Inventors: Nobuo Ikemoto, Nagaokakyo (JP); Kentarou Kawabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 450 days.

(21) Appl. No.: 18/201,212

(22) Filed: May 24, 2023

(65) Prior Publication Data

US 2023/0299453 A1 Sep. 21, 2023

Related U.S. Application Data

(63) Continuation of application No. PCT/JP2021/043729, filed on Nov. 30, 2021.

(30) Foreign Application Priority Data

Nov. 30, 2020 (JP) ................................ 2020-198381

(51) Int. Cl.
*H01P 3/08* (2006.01)
*H05K 1/02* (2006.01)
*H05K 1/14* (2006.01)

(52) U.S. Cl.
CPC .............. *H01P 3/088* (2013.01); *H01P 3/082* (2013.01); *H05K 1/028* (2013.01); *H05K 1/144* (2013.01); *H05K 2201/095* (2013.01)

(58) Field of Classification Search
CPC ................................ H01P 3/082; H01P 3/088
(Continued)

(56) References Cited

U.S. PATENT DOCUMENTS 6,535,088 B1 * 3/2003 Sherman et al. ...... H05K 1/024 333/246
2014/0028413 A1 1/2014 Ishii et al.
(Continued)

FOREIGN PATENT DOCUMENTS

JP 57192022 U 12/1982
JP 09298407 A 11/1997
(Continued)

OTHER PUBLICATIONS

International Search Report in PCT/JP2021/043729, mailed Feb. 22, 2022, 3 pages.
(Continued)

*Primary Examiner* — Benny T Lee
(74) *Attorney, Agent, or Firm* — Keating & Bennett, LLP

(57) ABSTRACT

A multilayer substrate includes layers stacked on each other in an up-down direction of a multilayer body. The layers include a first spacer, a first ground conductive layer above the first spacer, and a signal conductive layer that overlaps the first ground conductive layer and is located below the first spacer. First through-holes pass through the first spacer and are arranged along a first direction. A distance between centroids of first through-holes adjacent to each other in the first direction is uniform or substantially uniform. Sets of first through-holes are provided in the first spacer. Sets of first through-holes are arranged along a second direction. A distance between centroids of first through-holes adjacent to each other in the second direction is uniform or substantially uniform. At least one first through-hole is a first hollow through-hole overlapping the signal conductive layer.

23 Claims, 22 Drawing Sheets

(58) Field of Classification Search
USPC .......................................................... 333/238
See application file for complete search history.

(56) References Cited

U.S. PATENT DOCUMENTS

| | | | | |
|---|---|---|---|---|
| 2015/0305142 | A1 | 10/2015 | Matsuda | |
| 2018/0309182 | A1 | 10/2018 | Iida et al. | |
| 2020/0411940 | A1* | 12/2020 | Liang et al. | H05K 1/0278 |

FOREIGN PATENT DOCUMENTS

| | | | |
|---|---|---|---|
| JP | 2012119786 | A | 6/2012 |
| JP | 2014216449 | A | 11/2014 |
| JP | 2018121076 | A | 8/2018 |
| WO | 2017130731 | A1 | 8/2017 |

OTHER PUBLICATIONS

Written Opinion in PCT/JP2021/043729, mailed Feb. 22, 2022, 5 pages.

* cited by examiner

Fig. 1

HGR
HGR7
D5 = D6
13R, 14R, 15R
R1 < R3
CR
HGR8
HGR9
HRR
G7
G8
G9
NHGR
R4 > R1
SL
R5 >R1
HCC
20a
R1 < R2
SLD
C
HLL
CL
HGL
NHGL
13L, 14L, 15L
r
f
b
l
u
d

10a

H1 C 13L 14a H1 H1 C 13R
13a 20a2
12a
12b 14R
12c 20b2
13b
14L C H1 15L 14b H1 SL C H1 15R

10d2
DFHP
DBHP
20a
20b
UFHP
UBHP
SB
Sd
Sd2
Sd1
13a
14a
13R, 13L
12a
12b
12c
15R, 15L
14b
13b
A1
A2
A3
u
f
b
d
l
r

2
EP1
EP2
18a
18b
10e
20a
20b
300
301
302
303
200
201
Z+
Z−
Y−
Y+
X−
X+

2
EP2
201
18a
20a, 20b
30b
h12
h13
h16
h11
h18
h14
20a
30a
18b
200
h17
h15
EP1
10e
X+
Y−
Y+
Z+
Z−
X−

10m
20a
14R
15R
20b
13R
H1
C
SL4
14M
15M
13M
SL
14a
13L
14L
13a
12a
12b
12c
15L
13b
u
d
r
l
b
f

MULTILAYER SUBSTRATE INCLUDING INSULATING LAYERS, SIGNAL CONDUCTIVE LAYERS AND GROUND LAYERS AND HAVING THROUGH HOLES EXTENDING ALONG INTERSECTING DIRECTIONS

CROSS REFERENCE TO RELATED APPLICATIONS

This application claims the benefit of priority to Japanese Patent Application No. 2020-198381 filed Nov. 30, 2020 and is a Continuation Application of PCT Application No. PCT/JP2021/043729 filed on Nov. 30, 2021 and corresponding to WO 2022/114205 published on Jun. 2, 2022. The entire contents of each application are hereby incorporated herein by reference.

BACKGROUND OF THE PRESENT INVENTION

1. Field of the Present Invention

The present invention relates to a multilayer substrate and an electronic device.

2. Description of the Related Art

A multilayer substrate that can transmit a radio-frequency signal having a higher frequency therethrough is in demand. As an invention of a known multilayer substrate that can transmit a radio-frequency signal having a higher frequency therethrough, the multilayer substrate disclosed in Japanese Unexamined Patent Application Publication No. 2018-121076, (published 2 Aug. 2018) for example, is known. This multilayer substrate includes a multilayer body, a signal conductive layer, and a ground conductive layer. The multilayer body includes multiple insulating layers stacked on each other. The signal conductive layer and the ground conductive layer are disposed in the multilayer body.

A hollow portion is provided in the multilayer body. The hollow portion is disposed between the signal conductive layer and the ground conductive layer. The hollow portion is a space sealed by multiple insulating layers. In this case, the hollow portion is formed by air. The dielectric constant of air is low. Disposing the hollow portion having a low dielectric constant around the signal conductive layer in this manner can reduce a dielectric loss that occurs to a radio-frequency signal transmitted through the signal conductive layer. Thus, the transmission loss of a radio-frequency signal in the multilayer substrate can be reduced.

However, when pressure, for example, is applied to the multilayer substrate disclosed in Japanese Unexamined Patent Application Publication No. 2018-121076, the hollow portion may be deformed. If the hollow portion is deformed, the positional relationship between the signal conductive layer through which a signal is transmitted and the ground conductive layer may be changed. This may change the distance between the signal conductive layer and the ground conductive layer. As a result, the characteristic impedance of the multilayer substrate may deviate from a desired characteristic impedance (50Ω, for example).

SUMMARY OF THE PRESENT INVENTION

Preferred embodiments of the present invention provide multilayer substrates that are each able to transmit a radio-frequency signal having a higher frequency through a signal conductive layer and reduce a deviation of the characteristic impedance of the multilayer substrate.

A multilayer substrate according to a preferred embodiment of the present invention includes a plurality of layers stacked on each other in an up-down direction of a multilayer body. The plurality of layers include at least one insulating layer, a first spacer, a first ground conductive layer, and a signal conductive layer. The first ground conductive layer is located above the first spacer in the up-down direction of the multilayer body. The signal conductive layer overlaps the first ground conductive layer and is located below the first spacer, as viewed in the up-down direction of the multilayer body. A plurality of first through-holes pass through the first spacer in the up-down direction of the multilayer body. A first direction that is parallel or substantially parallel with a first straight line extends along the first spacer, as viewed in the up-down direction of the multilayer body. A second direction that is parallel or substantially parallel with a second straight line extends along the first spacer, as viewed in the up-down direction of the multilayer body. The second straight line is not parallel or substantially parallel with the first straight line. A plurality of the first through-holes are arranged along the first direction as viewed in the up-down direction of the multilayer body, and a distance between centroids of first through-holes adjacent to each other in the first direction is uniform or substantially uniform as viewed in the up-down direction of the multilayer body. A plurality of sets of the first through-holes, each set including a plurality of the first through-holes, are provided in the first spacer. A plurality of sets of the first through-holes are arranged along the second direction, and a distance between centroids of first through-holes adjacent to each other in the second direction is uniform or substantially uniform as viewed in the up-down direction of the multilayer body. At least one of the first through-holes is a first hollow through-hole which overlaps the signal conductive layer as viewed in the up-down direction of the multilayer body.

Multilayer substrates according to preferred embodiments of the present invention make it possible to transmit a radio-frequency signal having a higher frequency through a signal conductive layer and reduce a deviation of the characteristic impedance of the multilayer substrate.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a perspective view of a multilayer substrate according to a first preferred embodiment of the present invention.

DETAILED DESCRIPTION OF THE PREFERRED EMBODIMENTS

First Preferred Embodiment

Structure of Multilayer Substrate 10

A multilayer substrate 10 according to a first preferred embodiment of the present invention will be described below, where like features are denoted by like reference labels throughout the detailed description of the drawings. In the specification, directions are defined as follows. The stacking direction of the multilayer substrate 10 is defined as an up-down (hereinafter designated by U-D) direction of a multilayer body. The extending direction of a signal conductive layer SL is defined as a left-right (hereinafter designated by L-R) direction of the multilayer body. The up-down direction of the multilayer body and the left-right direction of the multilayer body are perpendicular or substantially perpendicular to each other. The direction perpendicular or substantially perpendicular to the up-down direction and the left-right direction of the multilayer body is defined as a front-back (hereinafter designated by F-B) direction of the multilayer body. The above-described definitions of the directions and the stacking direction in the specification are examples. It is not necessary that the directions of the multilayer substrate 10 when it is actually used coincide with the directions defined in the specification.

Hereinafter, X generically refers to a “component” or a “member” of the multilayer substrate 10 of the present preferred embodiment that is described herein. In the specification, the individual portions of the multilayer substrate 10 are defined as follows and are used as such unless otherwise stated. A front portion of X means a front half of X, while a back portion of X means a back half of X. A left portion of X means a left half of X.

A right portion of X means a right half of X. A top portion of X means a top half of X. A bottom portion of X means a bottom half of X. A front edge of X means the edge of X in the front direction. A back edge of X means the edge of X in the back direction. A left edge of X means the edge of X in the left direction. A right edge of X means the edge of X in the right direction. A top edge of X means the edge of X in the up direction. A bottom edge of X means the edge of X in the down direction. A front edge portion of X means the front edge of X and the vicinity thereof. A back edge portion of X means the back edge of X and the vicinity thereof. A left edge portion of X means the left edge of X and the vicinity thereof. A right edge portion of X means the right edge of X and the vicinity thereof. A top edge portion of X means the top edge of X and the vicinity thereof. A bottom edge portion of X means the bottom edge of X and the vicinity thereof.

Figure 1:
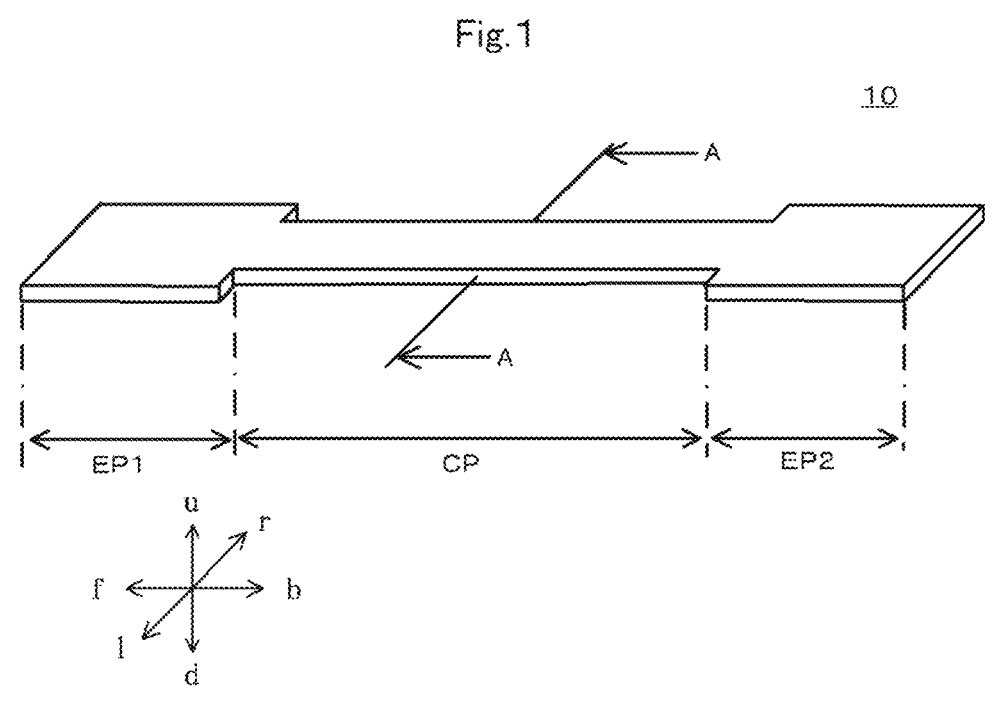
Figure 2:
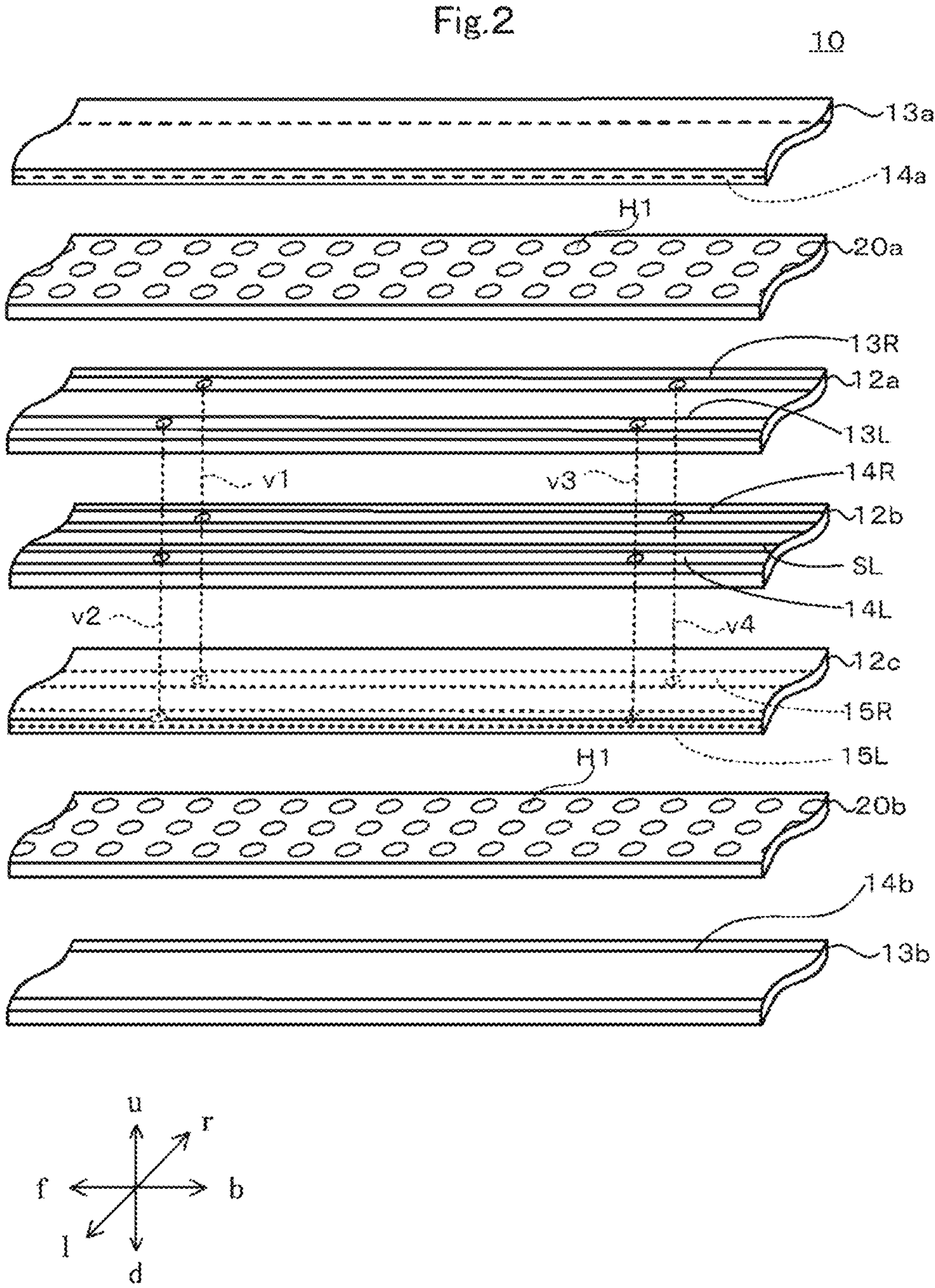
FIG. 2 is an exploded perspective view of the multilayer substrate.
Figure 3:
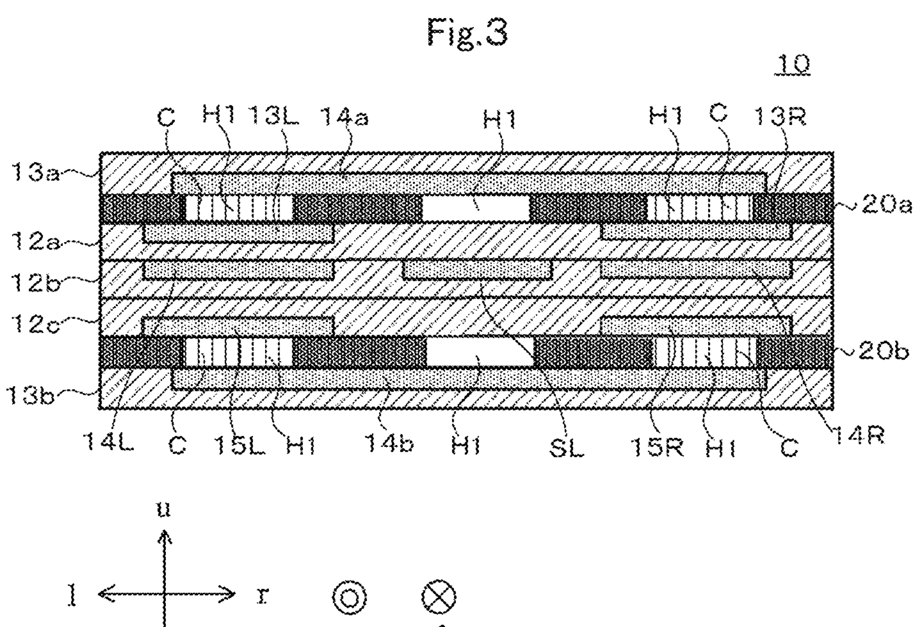
FIG. 3 is a sectional view of the multilayer substrate taken along line A-A in FIG. 1.
Figure 4:
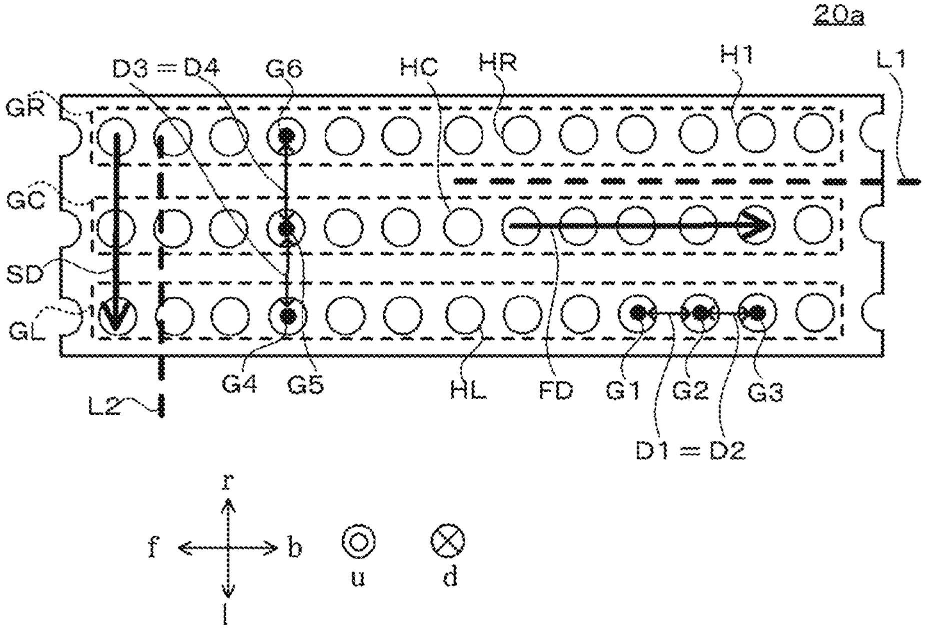
FIG. 4 is a top view of a spacer.

The multilayer substrate 10 will first be explained below with reference to FIGS. 1, 2, 3, and 4. FIG. 1 is a perspective view of the multilayer substrate 10 according to the first preferred embodiment. FIG. 2 is an exploded perspective view of the multilayer substrate 10. FIG. 3 is a sectional view of the multilayer substrate 10 taken along line A-A in FIG. 1. FIG. 4 is a top view of a spacer 20*a*.

The multilayer substrate 10 has a planar shape. More specifically, as illustrated in FIG. 1, as viewed in the up-down direction of the multilayer body, the multilayer substrate 10 has a rectangular or substantially rectangular shape including long sides extending in the front-back direction of the multilayer body. Accordingly, the length of the multilayer substrate 10 in the front-back direction of the multilayer body is longer than that of the multilayer substrate 10 in the left-right direction of the multilayer body.

As shown in FIG. 1, the multilayer substrate 10 includes mounting electrode units EP1 and EP2 and a center portion CP. The center portion CP is a section of the multilayer substrate 10 other than the mounting electrode units EP1 and EP2. The mounting electrode unit EP1 is positioned farther frontward than the center portion CP. The mounting electrode unit EP1 is thus located at the front edge portion of the multilayer substrate 10. The mounting electrode unit EP2 is positioned farther backward than the center portion CP. The mounting electrode unit EP2 is thus located at the back edge portion of the multilayer substrate 10. The width of the mounting electrode units EP1 and EP2 in the left-right direction of the multilayer body is longer than that of the center portion CP in the left-right direction of the multilayer body. The shape of the multilayer substrate 10 is not limited to that shown in FIG. 1.

The structure of the multilayer substrate 10 will now be described below with reference to FIGS. 2 and 3. The multilayer substrate 10 is formed by stacking multiple layers on each other. The multilayer substrate 10 thus includes multiple layers stacked on each other in the up-down direction of the multilayer body. More specifically, as illustrated in FIGS. 2 and 3, the multilayer substrate 10 includes insulating layers 12*a*, 12*b*, 12*c*, 13*a*, and 13*b*, ground conductive layers 14*a*, 14*b*, 13R, 13L, 14R, 14L, 15R, and 15L, a signal conductive layer SL, spacers 20*a* and 20*b*, and interlayer connecting conductors v1, v2, v3, and v4. In this case, the multiple layers include the insulating layers 12*a*, 12*b*, 12*c*, 13*a*, and 13*b*, ground conductive layers 14*a*, 14*b*, 13R, 13L, 14R, 14L, 15R, and 15L, signal conductive layer SL, and spacers 20*a* and 20*b*, for example. Accordingly, in the first preferred embodiment, the multilayer substrate 10 includes the interlayer connecting conductors v1, v2, v3, and v4 in addition to the multiple layers. In the first preferred embodiment, the multilayer substrate 10 includes one or more insulating layers. One or more insulating layers include the insulating layers 12*a*, 12*b*, 12*c*, 13*a*, and 13*b*. In FIG. 2, the front edge portion and the back edge portion of the multilayer substrate 10 are not shown.

As illustrated in FIGS. 2 and 3, the insulating layer 13*b*, ground conductive layer 14*b*, spacer 20*b*, ground conductive layers 15R and 15L, insulating layer 12*c*, insulating layer 12*b*, signal conductive layer SL and ground conductive layers 14R and 14L, insulating layer 12*a*, ground conductive layers 13R and 13L, spacer 20*a*, ground conductive layer 14*a*, and insulating layer 13*a* are stacked in the upward direction of the multilayer body in this order. In other words, the ground conductive layer 14*a* is located above the spacer 20*a* in the up-down direction of the multilayer body. The signal conductive layer SL is located below the spacer 20*a* in the up-down direction of the multilayer body.

The insulating layers 12*a*, 12*b*, 12*c*, 13*a*, and 13*b* have a shape including long sides extending in the front-back direction of the multilayer body. As illustrated in FIG. 2, the insulating layers 12*a*, 12*b*, 12*c*, 13*a*, and 13*b* have a shape extending in the front-back direction of the multilayer body, as viewed in the up-down direction of the multilayer body. The width of the insulating layers 12*a*, 12*b*, 12*c*, 13*a*, and 13*b* in the left-right direction of the multilayer body is thus smaller than the length thereof in the front-back direction of the multilayer body. The insulating layers 12*a*, 12*b*, 12*c*, 13*a*, and 13*b* are dielectric sheets having flexibility. Examples of the material for the insulating layers 12*a*, 12*b*, 12*c*, 13*a*, and 13*b* are a thermoplastic resin and a fluorine resin. Specific examples of the thermoplastic resin that can be used as the material for the insulating layers 12*a*, 12*b*, 12*c*, 13*a*, and 13*b* are polyimide and liquid crystal polymer. A specific example of the fluorine resin that can be used as the material for the insulating layers 12*a*, 12*b*, 12*c*, 13*a*, and 13*b* is PTFE.

The ground conductive layer 14*a* has a shape including long sides extending in the front-back direction, as viewed in the up-down direction of the multilayer body. The ground conductive layer 14*a* is disposed at the center or approximate center of the bottom main surface of the insulating layer 13*a* in the left-right direction of the multilayer body. As viewed in the up-down direction of the multilayer body, the position of the width of the ground conductive layer 14*a* in the left-right direction of the multilayer body matches or substantially matches that of the insulating layer 13*a*. However, as viewed in the up-down direction of the multilayer body, the width of the ground conductive layer 14*a* in the left-right direction of the multilayer body is smaller than that of the insulating layer 13*a*. Ground is connected to the ground conductive layer 14*a*, though it is not shown in FIGS. 2 and 3.

The ground conductive layer 14*b* has a shape including long sides extending in the front-back direction, as viewed in the up-down direction of the multilayer body. The ground conductive layer 14*b* is disposed at the center or approximate center of the top main surface of the insulating layer 13*b* in the left-right direction of the multilayer body. As viewed in the up-down direction of the multilayer body, the position of the width of the ground conductive layer 14*b* in the left-right direction of the multilayer body matches or substantially matches that of the insulating layer 13*b*. However, as viewed in the up-down direction of the multilayer body, the width of the ground conductive layer 14*b* in the left-right direction of the multilayer body is smaller than that of the insulating layer 13*b*. Ground is connected to the ground conductive layer 14*b*, though it is not shown in FIGS. 2 and 3.

As illustrated in FIG. 2, the signal conductive layer SL has a linear shape extending in the front-back direction of the multilayer body.

The signal conductive layer SL is located below the spacer 20*a*. The signal conductive layer SL is disposed at the center or approximate center of the top main surface of the insulating layer 12*b* in the left-right direction of the multilayer body. As illustrated in FIGS. 2 and 3, as viewed in the up-down direction of the multilayer body, the width of the signal conductive layer SL in the left-right direction of the multilayer body is smaller than that of the insulating layer 12*b* in the left-right direction of the multilayer body. The width of the signal conductive layer SL in the left-right direction of the multilayer body is about 170 μm, for example.

The signal conductive layer SL is located at a position at which it overlaps the ground conductive layer 14*a* in the up-down direction of the multilayer body. The signal conductive layer SL is also located at a position at which it overlaps the ground conductive layer 14*b* in the up-down direction of the multilayer body. With this arrangement, the signal conductive layer SL and the ground conductive layers 14*a* and 14*b* define a microstrip line structure. The signal conductive layer SL is a type of circuit pattern. The signal conductive layer SL is located at a position at which it does not overlap the ground conductive layers 14R and 14L in the left-right direction of the multilayer body.

As illustrated in FIG. 2, the ground conductive layer 13R has a linear shape extending in the front-back direction of the multilayer body. The ground conductive layer 13R is disposed at the right portion of the top main surface of the insulating layer 12*a* in the left-right direction of the multilayer body. As shown in FIG. 2, as is seen in the up-down direction of the multilayer body, the width of the ground conductive layer 15R in the left-right direction of the multilayer body is smaller than that of the insulating layer 12*c* in the left-right direction of the multilayer body. The configuration of the ground conductive layer 13L is the same as or similar to the configuration of the ground conductive layer 13R, except that the ground conductive layer 13L is disposed at the left portion of the top main surface of the insulating layer 12*a* in the left-right direction of the multilayer body. An explanation of the ground conductive layer 13L will thus be omitted.

As illustrated in FIG. 2, the ground conductive layer 14R has a linear shape extending in the front-back direction of the multilayer body. The ground conductive layer 14R is disposed at the right portion of the top main surface of the insulating layer 12*b* in the left-right direction of the multilayer body. The ground conductive layer 14R is thus disposed farther rightward than the signal conductive layer SL in the left-right direction of the multilayer body. As illustrated in FIGS. 2 and 3, as is seen in the up-down direction of the multilayer body, the width of the ground conductive layer 14R in the left-right direction of the multilayer body is smaller than that of the insulating layer 12*b* in the left-right direction of the multilayer body. The ground conductive layer 14R is located at a position at which it overlaps neither of the signal conductive layer SL nor the ground conductive layer 14L in the left-right direction of the multilayer body.

As illustrated in FIG. 2, the ground conductive layer 14L has a linear shape extending in the front-back direction of the multilayer body. The ground conductive layer 14L is disposed at the left portion of the top main surface of the insulating layer 12*b* in the left-right direction of the multilayer body. The ground conductive layer 14L is thus disposed farther leftward than the signal conductive layer SL in the left-right direction of the multilayer body. As illustrated in FIGS. 2 and 3, as is seen in the up-down direction of the multilayer body, the width of the ground conductive layer 14L in the left-right direction of the multilayer body is smaller than that of the insulating layer 12*b* in the left-right direction of the multilayer body. The ground conductive layer 14L is located at a position at which it overlaps neither of the signal conductive layer SL nor the ground conductive layer 14R in the left-right direction of the multilayer body.

As illustrated in FIG. 2, the ground conductive layer 15R has a linear shape extending in the front-back direction of the multilayer body. The ground conductive layer 15R is disposed at the right portion of the bottom main surface of the insulating layer 12*c* in the left-right direction of the multilayer body. As illustrated in FIGS. 2 and 3, as is seen in the up-down direction of the multilayer body, the width of the ground conductive layer 15R in the left-right direction of the multilayer body is smaller than that of the insulating layer 12*c* in the left-right direction of the multilayer body. The configuration of the ground conductive layer 15L is the same as or similar to the configuration of the ground conductive layer 15R, except that the ground conductive layer 15L is disposed at the left portion of the bottom main surface of the insulating layer 12*c* in the left-right direction of the multilayer body. An explanation of the ground conductive layer 15L will thus be omitted.

The width of the ground conductive layers 13R, 13L, 14R, 14L, 15R, and 15L in the left-right direction of the multilayer body is about 300 μm, for example.

As illustrated in FIG. 2, the interlayer connecting conductors v1 and v4 are positioned farther rightward than the signal conductive layer SL. The interlayer connecting conductor v1 is positioned farther frontward than the interlayer connecting conductor v4. The top edges of the interlayer connecting conductors v1 and v4 are connected to the ground conductive layer 13R. The bottom edges of the interlayer connecting conductors v1 and v4 are connected to the ground conductive layer 15R. With this configuration, the interlayer connecting conductors v1 and v4 electrically connect the ground conductive layers 13R, 14R, and 15R to each other.

As illustrated in FIG. 2, the interlayer connecting conductors v2 and v3 are positioned farther leftward than the signal conductive layer SL. The interlayer connecting conductor v2 is positioned farther frontward than the interlayer connecting conductor v3. The top edges of the interlayer connecting conductors v2 and v3 are connected to the ground conductive layer 13L. The bottom edges of the interlayer connecting conductors v2 and v3 are connected to the ground conductive layer 15L. With this configuration, the interlayer connecting conductors v2 and v3 electrically connect the ground conductive layers 13L, 14L, and 15L to each other.

The interlayer connecting conductors v1 through v4 are through-hole conductors. The through-hole conductors are formed by plating through-holes in the insulating layers 12*a*, 12*b*, and 12*c*. The interlayer connecting conductors v1 through v4 may be via-hole conductors. The via-hole conductors are formed by filling a conductive paste into through-holes H1 in the insulating layers 12*a*, 12*b*, and 12*c* and by, for example, sintering the conductive paste.

If the interlayer connecting conductor v1 is a via-hole conductor, it is not necessary that portions of the interlayer connecting conductor v1 provided between the individual layers match each other, as viewed in the up-down direction of the multilayer body. More specifically, if the interlayer connecting conductor v1 is a via-hole conductor, the position of the portion of the interlayer connecting conductor v1 provided between the insulating layers 12*a* and 12*b* may be different from that provided between the insulating layers 12*b* and 12*c* as viewed in the up-down direction of the multilayer body. If the interlayer connecting conductors v2 through v4 are via-hole conductors, they may be formed similarly to the interlayer connecting conductor v1 formed as a via-hole conductor. An explanation of the interlayer connecting conductors v2 through v4 formed as via-hole conductors will thus be omitted.

The spacers 20*a* and 20*b* have a planar shape including long sides extending in the front-back direction. As shown in FIG. 2, as viewed in the up-down direction of the multilayer body, the spacers 20*a* and 20*b* have a shape extending in the front-back direction of the multilayer body. Accordingly, the width of the spacers 20*a* and 20*b* in the left-right direction of the multilayer body is smaller than the length thereof in the front-back direction of the multilayer body.

The spacer 20*a* is located below the ground conductive layer 14*a*. The spacer 20*a* is located above the signal conductive layer SL.

The spacers 20*a* and 20*b* are made of a material having a low dielectric constant and a low dissipation factor, such as LCP and PTFE, for example. This configuration can reduce the transmission loss of a radio-frequency signal transmitted through the multilayer substrate 10. The material for the spacers 20*a* and 20*b* is the same as the material (for example, thermoplastic resin, such as polyimide or liquid crystal polymer) for the insulating layers 12*a*, 12*b*, 12*c*, 13*a*, and 13*b*. In other words, the material for the spacers 20*a* and 20*b* is the same as that of the insulating layers 12*b*, 12*c*, and 13*a*, which are located below the signal conductive layer SL, and is the same as that of the insulating layers 12*a* and 13*b*, which are located above the signal conductive layer SL. In this case, the coefficient of thermal expansion of the spacers 20*a* and 20*b* becomes equivalent or substantially equivalent to the coefficient of thermal expansion of the insulating layers 12*a*, 12*b*, 12*c*, 13*a*, and 13*b*. Thus, phenomena, such as, for example, only the spacers 20*a* and 20*b* are deformed by heat, are less likely to occur. Using the same material for the spacers 20*a* and 20*b* and for the insulating layers 12*a*, 12*b*, 12*c*, 13*a*, and 13*b* can reduce or prevent the occurrence of defects, such as a warpage of the spacers 20*a* and 20*b*.

As illustrated in FIGS. 2 and 3, the spacer 20*a* includes a plurality of through-holes H1 passing through the spacer 20*a* in the up-down direction of the multilayer body.

As illustrated in FIGS. 3 and 4, in the first preferred embodiment, the diameter of the through-holes H1 is larger than the thickness of the spacers 20*a* and 20*b* (FIG. 3) in the up-down direction of the multilayer body. In other words, as viewed in the up-down direction of the multilayer body, the maximum diameter of the through-holes H1 is larger than the thickness of the spacers 20*a* and 20*b* in the up-down direction of the multilayer body. For example, if the shape of the through-holes H1 is circular or substantially circular as seen in the up-down direction of the multilayer body, the diameter of the through-holes H1 is larger than the thickness of the spacers 20*a* and 20*b* in the up-down direction of the multilayer body. If the shape of the through-holes H1 is elliptical or substantially elliptical as seen in the up-down direction of the multilayer body, the maximum diameter of the elliptical through-holes H1 is larger than the thickness of the spacers 20*a* and 20*b* in the up-down direction of the multilayer body. In FIG. 4, a reference sign is appended to only one through-hole. To put it another way, not all of the through-holes are appended with reference sign "H1" in FIG. 4. The configuration of the spacer 20*b* is the same as or similar to the configuration of the spacer 20*a*, except that the spacer 20*b* is located above the ground conductive layer 14*b* and below the signal conductive layer SL, as shown in FIG. 3. An explanation of the spacer 20*b* will thus be omitted.

As illustrated in FIGS. 2, 3, and 4, the shape of the through-holes H1 is the same or substantially the same. In the first preferred embodiment, the shape of the through-holes H1 is circular or substantially circular r as viewed in the up-down direction of the multilayer body.

As illustrated in FIGS. 2 and 4, the plurality of through-holes H1 are provided over the entirety or substantially the entirety of the spacer 20*a*. More specifically, as shown in FIG. 4, a direction FD, which is parallel or substantially parallel with a first straight line L1, is defined on the spacer 20*a*. Plural through-holes H1 are arranged along the direction FD. For example, as shown in FIG. 4, thirteen through-holes H1 are arranged along the direction FD. The direction FD coincides with the extending direction of the signal conductive layer SL, for example. It is not essential, however, that the direction FD coincides with the extending direction of the signal conductive layer SL.

The multilayer substrate 10 includes plural sets of through-holes H1, each set including plural through-holes H1. For example, the spacer 20*a* shown in FIG. 4 includes three sets of through-holes H1, each set including thirteen through-holes H1 along the direction FD. The three sets include sets GL, GC, and GR (see FIG. 4). The plural through-holes H1 in the set GL will be called the "plural through-holes HL". The plural through-holes H1 in the set GC will be called the "plural through-holes HC". The plural through-holes H1 in the set GR will be called the "plural through-holes HR".

As illustrated in FIG. 4, a direction SD, which is parallel or substantially parallel with a second straight line L2, which is not parallel or substantially parallel with the first straight line L1, is defined on the spacer 20*a*. The sets GR, GC, and GL of plural through-holes H1 are arranged along the direction SD, which is different from the direction FD. The direction SD coincides with the widthwise direction of the signal conductive layer SL, for example. It is not necessary, however, that the direction SD coincides with the widthwise direction of the signal conductive layer SL. With the above-described configuration, the plural through-holes H1 are arranged in the spacer 20*a* in a matrix form. The direction FD and the direction SD are perpendicular to each other. It is not essential, however, that the direction FD and the direction SD are perpendicular or substantially perpendicular to each other.

The arrangement of the plural through-holes H1 will be described below in greater detail. As shown in FIG. 4, as viewed in the up-down direction of the multilayer body, regarding plural through-holes H1, the pitch between through-holes H1 adjacent to each other in the direction FD is uniform or substantially uniform. In other words, regarding plural through-holes H1 arranged along the direction FD, the distance between the centroids of adjacent through-holes H1 is uniform or substantially uniform. For example, regarding plural through-holes H1 arranged along the direction FD, the distance between the centroids of adjacent through-holes H1 is about 250 μm, for example. For instance, as shown in FIG. 4, the respective centroids of three through-holes H1 arranged along the direction FD will be set to centroids G1, G2, and G3. The through-hole H1 including the centroid G1 and the through-hole H1 including the centroid G2 are adjacent to each other. The through-hole H1 including the centroid G2 and the through-hole H1 including the centroid G3 are adjacent to each other. In this case, as shown in FIG. 4, the distance D1 between the centroid G1 and the centroid G2 becomes equal or substantially equal to the distance D2 between the centroid G2 and the centroid G3.

As viewed in the up-down direction of the multilayer body, regarding plural through-holes H1, the pitch between through-holes H1 adjacent to each other in the direction SD is uniform or substantially uniform. In other words, regarding plural through-holes H1 arranged along the direction SD, the distance between the centroids of adjacent through-holes H1 is uniform or substantially uniform. For example, regarding plural through-holes H1 arranged along the direction SD, the distance between the centroids of adjacent through-holes H1 is about 405 μm, for example. More specifically, as shown in FIG. 4, the respective centroids of three through-holes H1 arranged along the direction SD will be set to centroids G4, G5, and G6. The through-hole H1 including the centroid G4 and the through-hole H1 including the centroid G5 are adjacent to each other. The through-hole H1 including the centroid G5 and the through-hole H1 including the centroid G6 are adjacent to each other. In this case, as shown in FIG. 4, the distance D3 between the centroid G4 and the centroid G5 becomes equal or substantially equal to the distance D4 between the centroid G5 and the centroid G6.

Figures 5, 6:
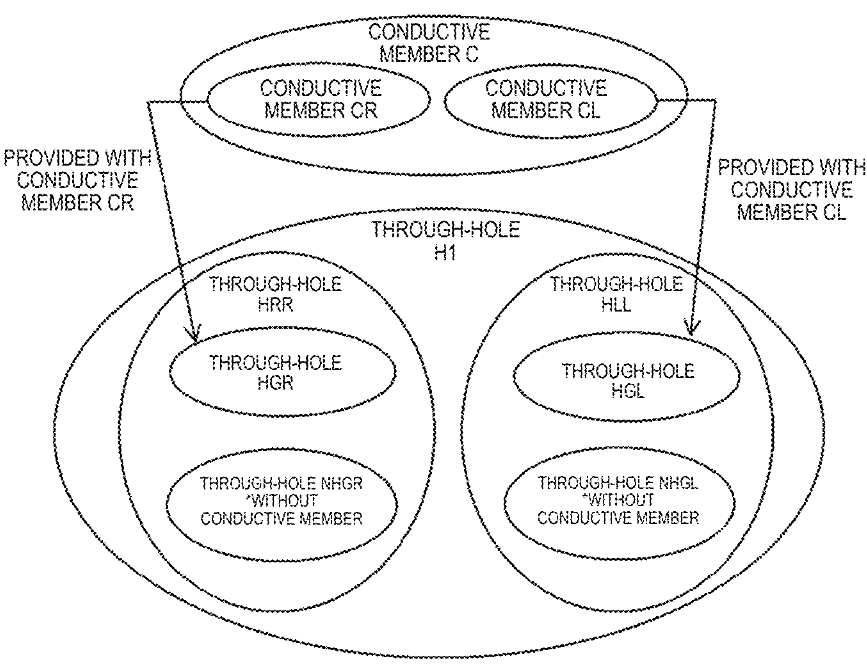
FIG. 5 is a top view of the spacer, a signal conductive layer, ground conductive layers, ground conductive layers, and conductive members.
FIG. 6 illustrates a relationship of the conductive members and through-holes.

The positional relationships among the spacer 20*a*, signal conductive layer SL, ground conductive layers 13R, 14R, and 15R, and ground conductive layers 13L, 14L, and 15L will be described below with reference to FIG. 5. FIG. 5 is a top view of the spacer 20*a*, signal conductive layer SL, ground conductive layers 13R, 14R, and 15R, ground conductive layers 13L, 14L, and 15L, and conductive members C (also illustrated in FIGS. 3 and 10-13). The signal conductive layer SL, ground conductive layers 13R, 14R, and 15R, and ground conductive layers 13L, 14L, and 15L are seen through in FIG. 5. FIG. 6 illustrates the relationship of the conductive members C ("CONDUCTIVE MEMBER C," "CONDUCTIVE MEMBER CR," and "CONDUCTIVE MEMBER CL") and the through-holes H1 ("THROUGH-HOLE H1," "THROUGH-HOLE HRR," "THROUGH-HOLE HGR," "THROUGH-HOLE NHGR," "THROUGH-HOLE HLL," "THROUGH-HOLE HGL," and "THROUGH-HOLE NHGL").

The diameter of the plural through-holes H1 is smaller than the distance between the signal conductive layer SL and the ground conductive layers 13R, 14R, and 15R. More specifically, as illustrated in FIG. 5, the diameter R1 of the plural through-holes H1 is smaller than the distance R4 between the right edge of the signal conductive layer SL and the left edges of the ground conductive layers 13R, 14R, and 15R in the left-right direction of the multilayer body. The distance R4 is about 170 μm, for example.

Similarly, as illustrated in FIG. 5, the diameter R1 of the plural through-holes H1 (FIG. 4) is smaller than the distance R5 between the left edge of the signal conductive layer SL and the right edges of the ground conductive layers 13L, 14L, and 15L in the left-right direction of the multilayer body. The distance R5 is about 170 μm, for example.

As illustrated in FIG. 5, the plural through-holes H1 include plural through-holes HCC (first hollow through-holes) that overlap the signal conductive layer SL as viewed in the up-down direction of the multilayer body. In the example shown in FIG. 5, the plural through-holes HCC are arranged along the direction FD. At least one of the plural through-holes HCC is hollow. In the example shown in FIG. 5, all of the through-holes HCC are hollow. In the first preferred embodiment, as shown in FIG. 5, as viewed in the up-down direction of the multilayer body, the diameter R1 of the plural through-holes HCC is smaller than the width R2 of the signal conductive layer SL in the left-right direction of the multilayer body. In one example, if the shape of the through-holes H1 as viewed in the up-down direction of the multilayer body is circular, the diameter of the through-holes H1 is smaller than the width R2. In another example, if the shape of the through-holes H1 as viewed in the up-down direction of the multilayer body is elliptical or substantially elliptical, the maximum diameter of the elliptical or substantially elliptical through-holes H1 is smaller than the width R2. With this configuration, the through-holes HCC are included in the signal conductive layer SL, as viewed in the up-down direction of the multilayer body.

As illustrated in FIG. 5, the plural through-holes H1 include plural through-holes HRR that overlap the ground conductive layers 13R, 14R, and 15R as viewed in the up-down direction of the multilayer body. The diameter R1 of the plural through-holes HRR is smaller than the width R3 of the ground conductive layers 13R, 14R, and 15R in the left-right direction of the multilayer body, as viewed in the up-down direction of the multilayer body. With this configuration, the through-holes HRR are included in the ground conductive layers 13R, 14R, and 15R, as viewed in the up-down direction of the multilayer body.

As illustrated in FIG. 5, the plural through-holes H1 include plural through-holes HLL that overlap the ground conductive layers 13L, 14L, and 15L as viewed in the up-down direction of the multilayer body. The diameter R1 of the plural through-holes HLL is smaller than the width R3 of the ground conductive layers 13L, 14L, and 15L in the left-right direction of the multilayer body, as viewed in the up-down direction of the multilayer body. With this configuration, the through-holes HLL are included in the ground conductive layers 13L, 14L, and 15L, as viewed in the up-down direction of the multilayer body.

It is not necessary that through-holes H1 are included in the signal conductive layer SL, the ground conductive layers 13R, 14R, and 15R, or the ground conductive layers 13L, 14L, and 15L, as viewed in the up-down direction of the multilayer body. For example, through-holes H1 may overlap the signal conductive layer SL, the ground conductive layers 13R, 14R, and 15R, or the ground conductive layers 13L, 14L, and 15L, as viewed in the up-down direction of the multilayer body.

Plural conductive members C (also shown in FIG. 3) are provided in some of the plural through-holes H1. The conductive member C is solder or a conductive adhesive, for example. If a solder is used for the conductive member C, moisture absorption is less likely to occur in the solder, thus improving the reliability of connection. If a conductive adhesive is used for the conductive member C, reflow soldering is not necessary. This allows the use of a low heat-resistance material for the multilayer substrate 10.

The plural conductive members C include plural conductive members CL and plural conductive members CR. The conductive members CL and CR will be explained below. In FIG. 5, the signal conductive layer SL, ground conductive layers 13R, 14R, and 15R, ground conductive layers 13L, 14L, and 15L, and conductive members C are indicated by dot patterns.

As shown in FIG. 5, plural conductive members CR are provided for some of the plural through-holes HRR. The conductive members CR can electrically connect the ground conductive layer 13R and the ground conductive layer 14*a* to each other. A through-hole HRR with a conductive member CR will be denoted as a through-hole HGR (see FIG. 6). A through-hole HRR without a conductive member CR will be denoted as a through-hole NHGR (see FIG. 6).

The plural through-holes HGR are arranged along a direction SLD, which is the extending direction of the signal conductive layer SL (see FIG. 5). Similarly, the plural through-holes NHGR are arranged along the direction SLD. In the example in FIG. 5, the direction SLD and the direction FD coincide with each other. It is not essential, however, that the direction SLD and the direction FD coincide with each other.

In the example in FIG. 5, the through-holes HGR and the through-holes NHGR are alternately arranged along the direction SLD. It is not necessary, however, that the through-holes HGR and the through-holes NHGR are alternately arranged. Plural conductive members CR may be continuously provided in through-holes HRR in the front-back direction of the multilayer body. In other words, through-holes HGR may be continuously provided. For example, a conductive member CR may be provided in each of three through-holes HRR continuously disposed in the direction SLD. In this case, the conductive members CR can be densely provided. This configuration improves the strength of the multilayer substrate 10 and also improves the shielding characteristics for the signal conductive layer SL.

In a manner similar to the plural conductive members CR, as shown in FIG. 5, plural conductive members CL are provided in some of the plural through-holes HLL. The conductive members CL can electrically connect the ground conductive layer 13L and the ground conductive layer 14*a* to each other. A through-hole HLL with a conductive member CL will be denoted as a through-hole HGL. A through-hole HLL without a conductive member CL will be denoted as a through-hole NHGL.

In a manner similar to the through-holes HGR, as shown in FIG. 5, the plural through-holes HGL are arranged along the direction SLD. Similarly, the plural through-holes NHGL are arranged along the direction SLD.

In the example shown in FIG. 5, the through-holes HGL and the through-holes NHGL are alternately arranged along the direction SLD. As in the through-holes HGR, however, through-holes HGL may be continuously disposed. In this case, the conductive members CL can be densely provided. This improves the strength of the multilayer substrate 10 and also improves the shielding characteristics for the signal conductive layer SL.

In the spacer 20*a*, at least one set of adjacent through-holes H1 including a conductive member C is provided, as viewed in the up-down direction of the multilayer body. Regarding at least one set of adjacent through-holes H1 including a conductive member C, the pitch between adjacent through-holes H1 is uniform or substantially uniform. In other words, regarding at least one set of adjacent through-holes H1 including a conductive member C, the distance between the centroids of adjacent through-holes H1 is uniform or substantially uniform.

For example, as shown in FIG. 5, in the spacer 20*a*, a set of three adjacent through-holes HGR7, HGR8, and HGR9 is defined. In this case, the through-holes HGR7, HGR8, and HGR9 define a set of through-holes HGR.

Then, the centroids G7, G8, and G9 are set in the adjacent through-holes HGR7, HGR8, and HGR9, respectively. In this case, as shown in FIG. 5, the distance D5 between the centroid G7 and the centroid G8 becomes equal or substantially equal to the distance D6 between the centroid G8 and the centroid G9.

As in a set of through-holes HGR, a set of through-holes HGL having an equal or substantially equal pitch therebetween may be provided in the spacer 20*a*. In other words, in a manner similar to a set of through-holes HGR, a set of through-holes HGL between which the center-to-center distance is uniform or substantially uniform may be provided in the spacer 20*a*.

In the spacer 20*a*, at least one set of through-holes HGR having an equal or substantially equal pitch therebetween and/or at least one set of through-holes HGL having an equal or substantially equal pitch therebetween may be provided. In other words, it is sufficient if at least one set of through-holes HGR between which the center-to-center distance is uniform and/or at least one set of through-holes HGL between which the center-to-center distance is uniform or substantially equal are provided in the spacer 20*a*.

The arrangement of the through-holes H1 in the spacer 20*b* is the same or substantially the same as that in the spacer 20*a*, and an explanation thereof will thus be omitted.

Electronic Device 1 Including Multilayer Substrate 10

Figure 7:
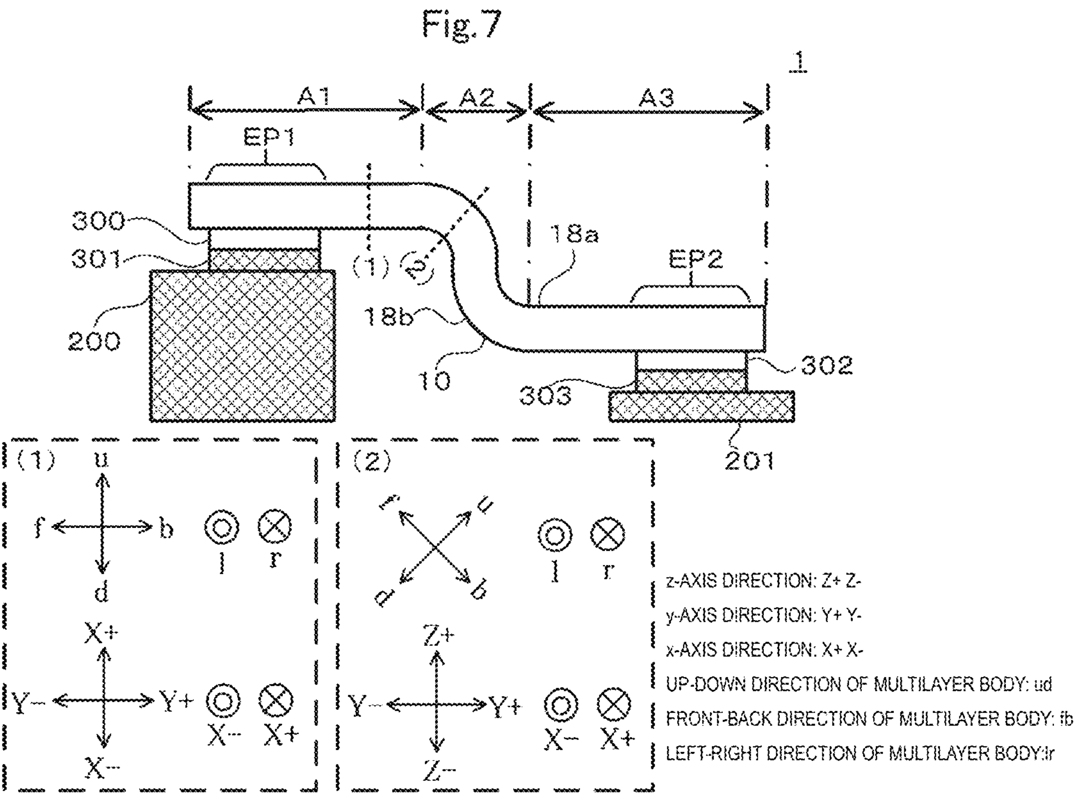
FIG. 7 is a side view of an electronic device including the multilayer substrate.
Figure 8:
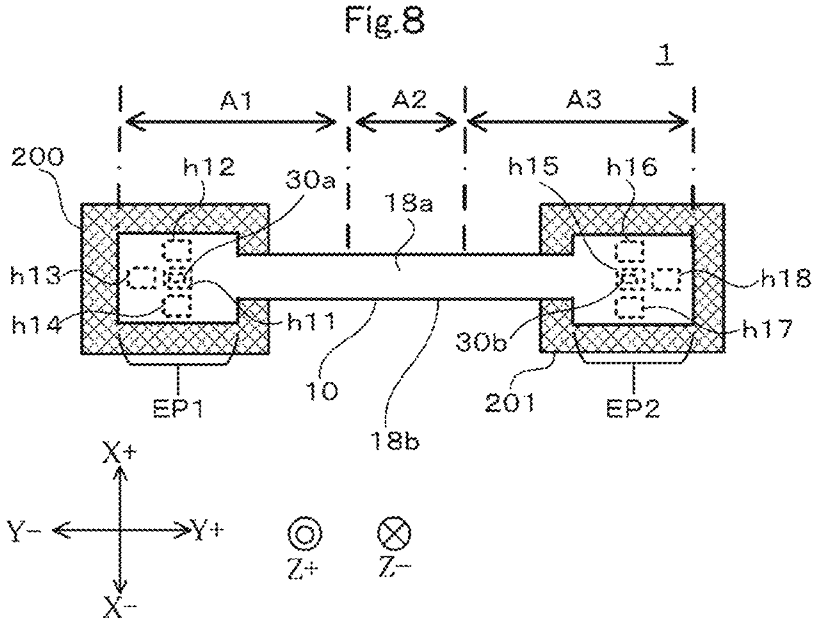
FIG. 8 is a top view of the electronic device including the multilayer substrate.

An electronic device 1 including the multilayer substrate 10 will be described below with reference to the drawings. FIG. 7 is a side view of the electronic device 1 including the multilayer substrate 10. FIG. 8 is a top view of the electronic device 1 including the multilayer substrate 10.

The multilayer substrate 10 transmits a radio-frequency signal therethrough. The multilayer substrate 10 is thus used to connect circuit boards 200 and 201 to each other in the electronic device 1, as illustrated in FIGS. 7 and 8. The multilayer substrate 10 is used to connect two circuit boards in an electronic device, such as a mobile phone.

As shown in FIG. 7, a connector 301 is mounted on the circuit board 200, while a connector 303 is mounted on the circuit board 201.

As shown in FIGS. 7 and 8, a top resist layer 18*a* is disposed above the multilayer substrate 10. The top resist layer 18*a* covers the entirety of substantially the entirety of the top main surface of the insulating layer 13*a*.

As shown in FIGS. 7 and 8, a bottom resist layer 18*b* is disposed below the multilayer substrate 10. The bottom resist layer 18*b* covers the entirety or substantially the entirety of the bottom main surface of the insulating layer 13*b*.

As illustrated in FIG. 8, cavities h11, h12, h13, h14, h15, h16, h17 and h18 are provided in the bottom resist layer 18*b*. The cavities h11 through h14 overlap the mounting electrode unit EP1, as viewed in the up-down direction of the multilayer body. The cavities h15 through h18 overlap the mounting electrode unit EP2, as viewed in the up-down direction of the multilayer body.

As illustrated in FIG. 8, the multilayer substrate 10 includes outer electrodes 30*a* and 30*b*. The outer electrodes 30*a* and 30*b* are electrically connected to the signal conductive layer SL. In FIG. 7, the outer electrodes 30*a* and 30*b* are not shown.

As illustrated in FIG. 8, the outer electrode 30*a* overlaps the cavity h11 in the up-down direction of the multilayer body. The outer electrode 30*a* is exposed at the cavity h11. The outer electrode 30*b* overlaps the cavity h15 in the up-down direction of the multilayer body. The outer electrode 30*b* is exposed at the cavity h15.

The ground conductive layer 14*b* overlaps the cavities h12 through h14 and h16 through h18, although it is not shown in FIGS. 7 and 8. The ground conductive layer 14*b* is exposed at the cavities h11 through h13 and h16 through h18.

As illustrated in FIG. 7, a connector 300 (also illustrated in FIG. 19) is mounted on the bottom main surface of the multilayer substrate 10 where the mounting electrode unit EP1 is located. More specifically, the connector 300 is mounted on the ground conductive layer 14*b* and the outer electrode 30$a$ exposed at the cavity h11. As illustrated in FIG. 7, a connector 302 is mounted on the bottom main surface of the multilayer substrate 10 where the mounting electrode unit EP2 is located. More specifically, the connector 302 is mounted on the ground conductive layer 14$b$ and the outer electrode 30$b$ exposed at the cavity h15.

Figures 18, 19:
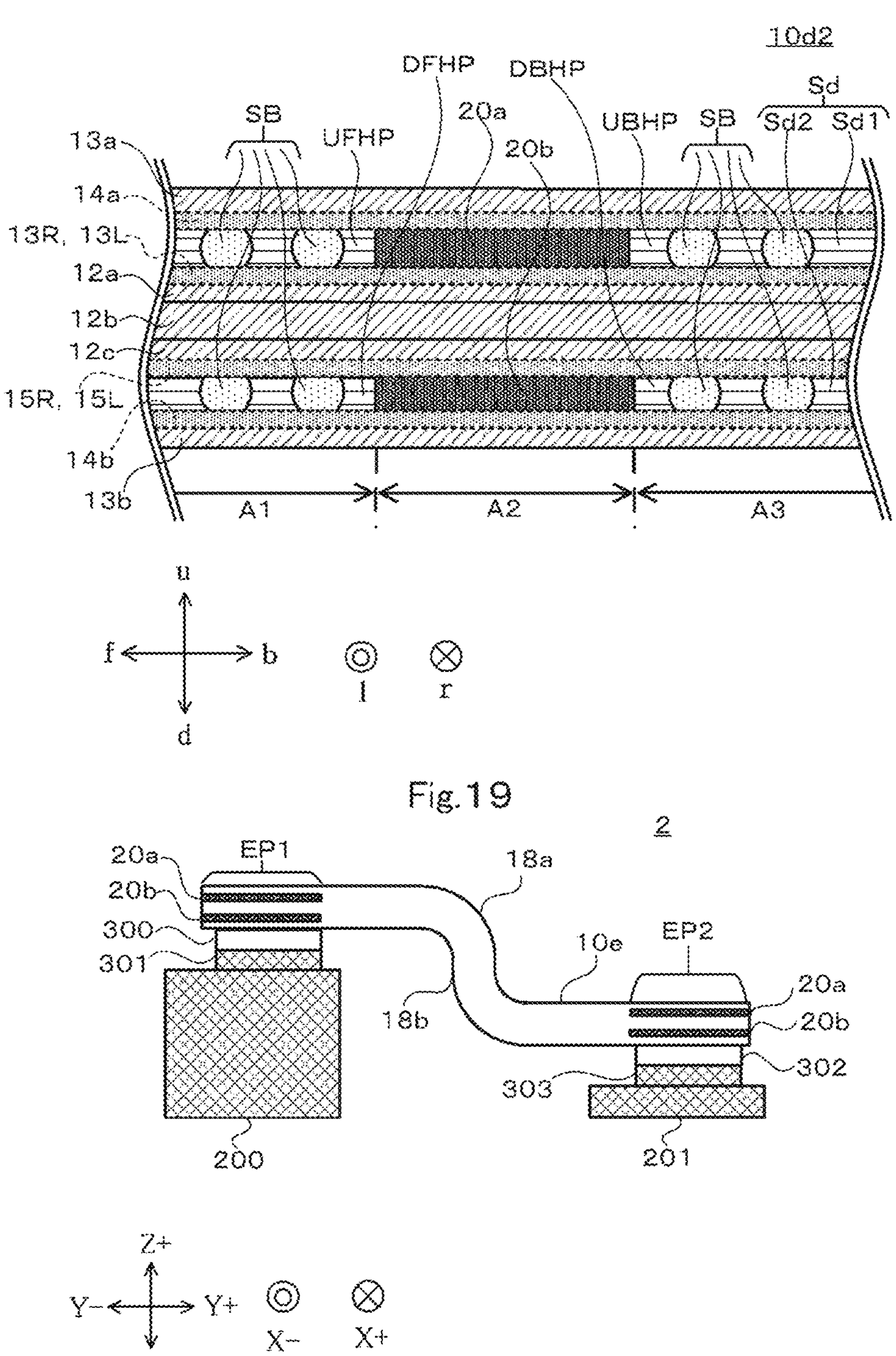
FIG. 18 is a side view of a multilayer substrate according to a first modified example of the fifth preferred embodiment of the present invention.
FIG. 19 is a side view of an electronic device including a multilayer substrate of a sixth preferred embodiment of the present invention.

The connector 300 is connected to the connector 301 (also illustrated in FIG. 19), while the connector 302 (also illustrated in FIG. 19) is connected to the connector 303 (also illustrated in FIG. 19). With this configuration, as shown in FIGS. 7 and 8, the signal conductive layer SL of the multilayer substrate 10 is electrically connected to the circuit board 200 via the outer electrode 30$a$ and is also electrically connected to the circuit board 201 via the outer electrode 30$b$.

The multilayer substrate 10 has flexibility so that it can be bent. The multilayer substrate 10 can thus be used in an electronic device in a state in which it is bent. The multilayer substrate 10 in a bending state will be described below in greater detail.

When the multilayer substrate 10 is bent, it includes uncurved sections A1 and A3 and a curved section A2, as shown in FIGS. 7 and 8. The x-axis direction (X+⇔X−, as illustrated in each of FIGS. 7-9 and 19), y-axis direction (Y+⇔Y−, as illustrated in each of FIGS. 7-9 and 19), and z-axis direction (Z+⇔Z−, as illustrated in each of FIGS. 7-9 and 19) of the multilayer substrate 10 are defined as follows. The x-axis direction is the left-right direction of the multilayer body in the uncurved section A1. The y-axis direction is the front-back direction of the multilayer body in the uncurved section A1. The z-axis direction is the up-down direction of the multilayer body in the uncurved section A1. The uncurved sections A1 and A3 are sections where the multilayer substrate 10 is not bent. The curved section A2 is a section where the multilayer substrate 10 is bent. In the first preferred embodiment, in the curved section A2, the multilayer substrate 10 is bent in the z-axis direction. The uncurved sections A1 and A3 are adjacent to the curved section A2. The uncurved section A1 is positioned in front of the curved section A2. The uncurved section A3 is positioned at the back of the curved section A2. In the specification, "being bent" refers to that a multilayer substrate is bent after being subjected to external force.

The multilayer substrate 10 includes the curved section A2 in which it is bent in the z-axis direction. Thus, as shown in FIG. 7, the up-down direction and the front-back direction of the multilayer body do not necessarily match the z-axis direction and the y-axis direction, depending on a section of the multilayer substrate 10. In the uncurved section A1 where the multilayer substrate 10 is not bent in the z-axis direction (the position indicated by (1) in FIG. 7, for example), the up-down direction and the front-back direction of the multilayer body match the z-axis direction and the y-axis direction, respectively. In contrast, in the curved section A2 where the multilayer substrate 10 is bent in the z-axis direction (the position indicated by (2) in FIG. 7, for example), the up-down direction and the front-back direction of the multilayer body do not match the z-axis direction and the y-axis direction, respectively.

The bent multilayer substrate 10 also has flexibility. It is thus possible that the multilayer substrate 10 bent in the z-axis direction is further bent in the z-axis direction.

Figure 9:
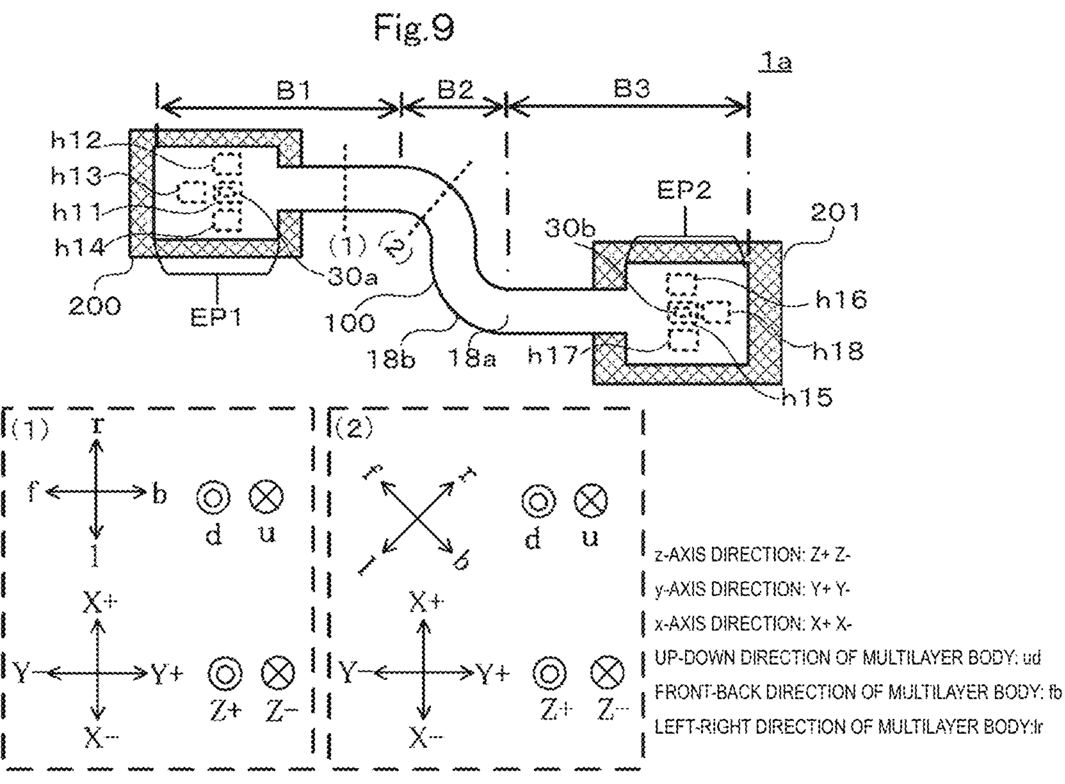
FIG. 9 is a top view of an electronic device including a multilayer substrate.

A multilayer substrate according to a preferred embodiment of the present invention may be a multilayer substrate 100 which is curved in an arc shape in the x-axis direction. The multilayer substrate 100 will be described below in detail with reference to the drawing. FIG. 9 is a top view of an electronic device 1$a$ including the multilayer substrate 100. In the specification, "being curved in an arc shape" refers to a multilayer substrate that has a curved shape without being subjected to external force.

As illustrated in FIG. 9, the multilayer substrate 100 can connect circuit boards 200 and 201 to each other in a state in which it is curved in an arc shape in the x-axis direction in the electronic device. As shown in FIG. 9, the multilayer substrate 100 is used for connecting the circuit boards 200 and 201 to each other in the electronic device 1$a$.

As shown in FIG. 9, the multilayer substrate 100 includes uncurved sections B1 and B3 and a curved section B2. The uncurved sections B1 and B3 are sections where the multilayer substrate 100 is not curved in an arc shape in the x-axis direction. The curved section B2 is a section including a portion where the multilayer substrate 100 is curved in an arc shape in the x-axis direction. The uncurved sections B1 and B3 are adjacent to the curved section B2. The uncurved section B1 is positioned in front of the curved section B2. The uncurved section B3 is positioned at the back of the curved section B2.

The multilayer substrate 100 includes the curved section B2 in which it is curved in an arc shape in the x-axis direction. Thus, as shown in FIG. 9, the up-down direction and the front-back direction of the multilayer body do not necessarily match the z-axis direction and the y-axis direction, depending on a section of the multilayer substrate 100. In the uncurved section B1 where the multilayer substrate 100 is not curved in an arc shape in the x-axis direction (the position indicated by (1) in FIG. 9, for example), the up-down direction and the front-back direction of the multilayer body match the z-axis direction and the y-axis direction, respectively. In contrast, in the curved section B2 where the multilayer substrate 100 is curved in an arc shape in the x-axis direction (the position indicated by (2) in FIG. 9, for example), the up-down direction and the front-back direction of the multilayer body do not match the z-axis direction and the y-axis direction, respectively.

As illustrated in FIG. 9, the multilayer substrate 100 can connect circuit boards 200 and 201 to each other in a state in which it is curved in an arc shape in the x-axis direction in the electronic device 1$a$.

The spacers 20$a$ and 20$b$ are located in the curved section B2 of the multilayer substrate 100, so that the through-holes H1 are uniformly provided in the curved section B2 of the multilayer substrate. Regarding a multilayer substrate including the curved section B2, it is possible to reduce the possibility that the impedance of the signal conductive layer SL deviates from a predetermined impedance.

The multilayer substrate 100 is formed by cutting one piece of substrate in an arc shape in the x-axis direction, for example.

The multilayer substrate 100, which is curved in an arc shape in the x-axis direction, also has flexibility. It is thus possible that the multilayer substrate 100 curved in an arc shape in the x-axis direction is further bent in the z-axis direction.

The configuration of the multilayer substrate 100 is the same or substantially the same as that of the multilayer substrate 10, except that the multilayer substrate 100 is curved in an arc shape in the x-axis direction. An explanation of the multilayer substrate 100 will thus be omitted.

Advantageous Effects

Using the multilayer substrate 10 (FIGS. 1-3) makes it possible to transmit a radio-frequency signal having a higher frequency through the signal conductive layer SL. This will be explained more specifically below. The multilayer substrate 10 includes the spacers 20_a_ and 20_b_ provided with multiple through-holes H1. The region where the dielectric constant is low (through-holes H1) is thus uniformly or substantially uniformly provided in the spacers 20_a_ and 20_b_. As a result, in the portions of the multilayer substrate 10 where the spacers 20_a_ and 20_b_ are provided, the dielectric loss of a radio-frequency signal transmitted through the signal conductive layer SL is reduced, which lowers the transmission loss of the radio-frequency signal. It is thus possible to transmit a radio-frequency signal having a higher frequency through the signal conductive layer SL.

Using the multilayer substrate 10 makes it possible to reduce deviation of the characteristic impedance of the multilayer substrate 10. This will be described more specifically below. As viewed in the up-down direction of the multilayer body, regarding the plural through-holes H1, the distance between the centroids of adjacent through-holes H1 in the direction FD is uniform or substantially uniform, and the distance between the centroids of adjacent through-holes H1 in the direction SD is also uniform or substantially uniform. With this arrangement, the region where the dielectric constant is low is uniformly provided in the spacers 20_a_ and 20_b_. As a result, in the portions of the multilayer substrate 10 where the spacers 20_a_ and 20_b_ are provided, the dielectric constant of the multilayer substrate 10 can be decreased uniformly. It is thus possible to reduce a deviation of the characteristic impedance of the multilayer substrate 10.

Among others, among the plural through-holes H1, at least one through-hole H1, which is hollow, overlaps the signal conductive layer SL, as viewed in the up-down direction of the multilayer body. Air fills the hollow through-hole H1, which makes the dielectric constant in the hollow through-hole H1 low. The use of the multilayer substrate 10 can thus lower the dielectric constant of the region around the signal conductive layer SL.

It is also possible to reduce a deviation of the characteristic impedance of the multilayer substrate 10. The multilayer substrate 10 will be explained below by comparing it with a multilayer substrate without the spacers 20_a_ and 20_b_. Hereinafter, such a multilayer substrate will be called a first comparative example.

In the first comparative example, a hollow portion filled with air is provided between a signal conductive layer and a ground conductive layer. The hollow portion is a region surrounded by plural insulating layers, the signal conductive layer, and the ground conductive layer. In other words, a large region filled with air (hollow portion) is provided in the multilayer substrate. When force is applied in the center direction of the hollow portion (when the multilayer substrate is bent, for example), the hollow portion defining the large region filled with air is highly likely to be crushed. If the hollow portion is crushed, the positional relationship (such as the distance) between the signal conductive layer and the ground conductive layer as viewed in the up-down direction of the multilayer body may be changed. This may cause a deviation of the characteristic impedance of the multilayer substrate.

In contrast, the multilayer substrate 10 includes the spacers 20_a_ and 20_b_ provided with multiple through-holes H1. The multiple through-holes H1 are filled with air. In other words, small regions filled with air (through-holes H1) are provided in the multilayer substrate 10. To put it another way, around the through-holes H1, a portion of the spacer 20_a_ and a portion of the spacer 20_b_ are located. When the multilayer substrate 10 is bent, for example, a portion of the spacer 20_a_ supports the ground conductive layer 14_a_ and the insulating layer 12_a_. This makes it less likely to crush the through-holes H1 positioned between the ground conductive layer 14_a_ and the insulating layer 12_a_. Similarly, a portion of the spacer 20_b_ makes it less likely to crush the through-holes H1 positioned between the ground conductive layer 14_b_ and the insulating layer 12_c_. To put it another way, with the above-described configuration, even when the multilayer substrate 10 is bent, for example, the through-holes H1 are unlikely to be crushed. It is thus less likely that the positional relationship (such as the distance) between the signal conductive layer SL and the ground conductive layer 14_a_ as seen in the up-down direction of the multilayer body will change, which would be caused when the through-holes H1 are crushed. In this manner, a deviation of the characteristic impedance of the multilayer substrate 10 can be reduced.

In the multilayer substrate 10, regarding plural through-holes H1 arranged along the direction FD, the distance between the centroids of adjacent through-holes H1 is uniform or substantially uniform. Even when a applied to the spacers 20_a_ and 20_b_, such a stress is likely to be applied uniformly. It is thus difficult for the spacers 20_a_ and 20_b_ to be locally deformed, which reduces the possibility that the through-holes H1 are crushed. It is thus unlikely that the positional relationship (such as the distance) between the signal conductive layer SL and the ground conductive layer 14_a_ as seen in the up-down direction of the multilayer body will change, thus reducing a deviation of the characteristic impedance of the multilayer substrate 10.

The multilayer substrate 10 can easily bend. This will be explained more specifically below. In the multilayer substrate 10, multiple through-holes H1 are arranged along the direction FD. The multilayer substrate 10 includes plural sets of through-holes H1, each set including plural through-holes H1. That is, the multilayer substrate 10 includes a larger number of through-holes H1. This means that more spaces filled with air (through-holes H1) are provided. The spacer 20_a_ can thus easily bend, which means that the multilayer substrate 10 can easily bend.

The multilayer substrate 10 can easily bend. This will be explained more specifically below. Regarding plural through-holes H1 arranged along the direction FD, the distance between the centroids of adjacent through-holes H1 is uniform or substantially uniform, as viewed in the up-down direction of the multilayer body. Regarding plural through-holes H1 arranged along the direction SD, the distance between the centroids of adjacent through-holes H1 is also uniform or substantially uniform, as viewed in the up-down direction of the multilayer body. With this arrangement, when the spacer 20_a_ is bent, the corners of the spacer 20_a_ are likely to overlap through-holes H1 as viewed in the up-down direction of the multilayer body. The spacer 20_a_ can thus easily bend, which means that the multilayer substrate 10 can easily bend.

In a similar manner, in the electronic device 1 including the multilayer substrate 10, it is possible to transmit a radio-frequency signal having a higher frequency through the signal conductive layer SL and also to reduce a deviation of the characteristic impedance of the electronic device 1.

In the multilayer substrate 10, the ground conductive layer 14_a_ and the ground conductive layers 13R and 13L can be connected to each other without the use of interlayer connecting conductors. This configuration will be explained more specifically below. The multilayer substrate 10 includes the ground conductive layer 14_a_ located above the spacer 20_a_ in the up-down direction of the multilayer body.

The multilayer substrate 10 also includes the ground conductive layers 13R and 13L located below the spacer 20*a* in the up-down direction of the multilayer body. The multilayer substrate 10 includes plural conductive members C. The plural conductive members C connect the ground conductive layer 14*a* and the ground conductive layers 13R and 13L by using the spacer 20*a*. In this manner, using the plural conductive members C provided in the spacer 20*a* can connect the ground conductive layer 14*a* and the ground conductive layers 13R and 13L without the use of interlayer connecting conductors.

In the multilayer substrate 10, the characteristic impedance of the signal conductive layer SL is unlikely to change.

This will be described more specifically below. The plural through-holes H1 including a conductive member C are arranged along the direction SLD, as seen in the up-down direction of the multilayer body. At least one set of adjacent through-holes H1 including a conductive member C is provided in each of the spacer 20*a* and 20*b*, as viewed in the up-down direction of the multilayer body. Regarding at least one set of adjacent through-holes H1 including a conductive member C, the distance between the centroids of adjacent through-holes H1 is uniform or substantially uniform. In this case, the conductive members C are arranged at equal or substantially equal spaces. The capacitance generated between the signal conductive layer SL and the conductive members C is thus likely to be uniform. This uniformity makes it less likely to change the characteristic impedance of the signal conductive layer SL.

The spacer 20*a* can be easily provided. This will be explained more specifically below. Since the shape of the multiple through-holes H1 is the same or substantially the same, the through-holes H1 can be formed continuously with the same processing method. This can simplify the forming step of the spacers 20*a* and 20*b*, so that the spacer 20*a* can be easily formed.

The multilayer substrate 10 is less likely to warp. This will be explained more specifically below. The material for the spacers 20*a* and 20*b* of the multilayer substrate 10 is the same as that of the insulating layers 12*a*, 12*b*, and 12*c*. In this case, the coefficient of thermal expansion of the spacers 20*a* and 20*b* becomes equivalent to the coefficient of thermal expansion of the insulating layers 12*a*, 12*b*, and 12*c*. A warpage is thus less likely to occur in the multilayer substrate 10 during heating (during hot pressing to stack layers of the multilayer substrate 10, for example).

For the multilayer substrate 10 including a curved section A2, the provision of the spacers 20*a* and 20*b* can reduce a deviation of the characteristic impedance of the multilayer substrate 10. The multilayer substrate 10 including a curved section A2 and provided with the spacers 20*a* and 20*b* will be described below by comparing it with a multilayer substrate having a curved section bent in the z-axis direction and without the spacers 20*a* and 20*b*. Hereinafter, such a multilayer substrate will be called a second comparative example.

In the second comparative example, a hollow portion filled with air is provided between a signal conductive layer and a ground conductive layer. When the multilayer substrate is bent in the z-axis direction to define a curved section, pressure is applied to the hollow portion located in the curved section. At this time, the hollow portion, which defines a large region filled with air, in the curved section is highly likely to be crushed. If the hollow portion is crushed, the positional relationship (such as the distance) between the signal conductive layer and the ground conductive layer as viewed in the up-down direction of the multilayer body may be changed. This may cause a deviation of the characteristic impedance of the multilayer substrate.

In contrast, in the case of the multilayer substrate 10 including a curved section A2, the spacers 20*a* and 20*b* provided with multiple through-holes H1 are provided in the curved section A2. That is, small regions filled with air (through-holes H1) are provided in the multilayer substrate 10 where the curved section A2 is located. With this configuration, even when the multilayer substrate 10 is bent, the through-holes H1 are unlikely to be crushed. It is thus less likely that the positional relationship (such as the distance) between the signal conductive layer SL and the ground conductive layer 14*a* as seen in the up-down direction of the multilayer body will change, which would be caused when the through-holes H1 are crushed. In this manner, providing the spacers 20*a* and 20*b* in the multilayer substrate 10 makes it possible to reduce a deviation of the characteristic impedance of the multilayer substrate 10.

The multilayer substrate 10 (FIGS. 1-3) including the spacer 20*a* can reduce the possibility that the characteristic impedance of the signal conductive layer SL will deviate. This will be explained more specifically below. As illustrated in FIGS. 4 and 5, the diameter R1 of the through-holes H1 is smaller than the width R2 of the signal conductive layer SL in the left-right direction of the multilayer body. In this case, the distance between the through-holes HCC (FIG. 5) that overlap the signal conductive layer SL as seen in the up-down direction of the multilayer body and the through-holes HGR that overlap the ground conductive layer 13R as seen in the up-down direction of the multilayer body becomes larger. Accordingly, as illustrated in FIG. 5, the distance between the through-holes HCC and the conductive members CR provided in the through-holes HGR as seen in the up-down direction of the multilayer body becomes larger. With this arrangement, for example, even if the conductive member CR leaks from the through-hole HGR, the leaked conductive member CR is less likely to enter the through-hole HCC. Similarly, even if the conductive member CL leaks from the through-hole HGL, the leaked conductive member CL is less likely to enter the through-hole HCC. This can reduce the possibility that the conductive member CR having leaked from the through-hole HGR and the conductive member CL having leaked from the through-hole HGL will cause a deviation of the characteristic impedance of the signal conductive layer SL.

In the multilayer substrate 10, the shape of the through-holes H1 is less likely to change. The diameter R1 of the through-holes H1 is larger than the thickness of the spacers 20*a* and 20*b* in the up-down direction of the multilayer body. That is, the size of the through-holes H1 in relation to the thickness of the spacers 20*a* and 20*b* is large. This configuration makes it less likely to close the through-holes H1 when the multilayer substrate 10 is bent, for example.

Using the multilayer substrate 10 (FIGS. 1-3) makes it possible to reduce a deviation of the characteristic impedance of the signal conductive layer SL. This configuration will be explained more specifically below. The diameter R1 of the through-holes H1 is smaller than the distance R4 between the right edge of the signal conductive layer SL and the left edges of the ground conductive layers 13R, 14R, and 15R in the left-right direction of the multilayer body. The diameter R1 of the through-holes H1 is smaller than the distance R5 between the left edge of the signal conductive layer SL and the right edges of the ground conductive layers 13L, 14L, and 15L in the left-right direction of the multilayer body. With this arrangement, no through-hole H1 overlaps both of the signal conductive layer SL and the ground conductive layers 13R and 13L, as viewed in the up-down direction of the multilayer body. Thus, the conductive members C are provided so as not to overlap the signal conductive layer SL as viewed in the up-down direction of the multilayer body. This configuration makes it possible to reduce a deviation of the characteristic impedance of the signal conductive layer SL, which would be caused by the conductive members C.

Manufacturing Method for Multilayer Substrate 10

A non-limiting example of a manufacturing method for the multilayer substrate 10 will be described below.

In a first step, an insulating layer 13*a* cladded with a metal foil layer on the bottom main surface, an insulating layer 13*b* cladded with a metal foil layer on the top main surface, an insulating layer 12*a* cladded with a metal foil layer on the top main surface, an insulating layer 12*b* cladded with a metal foil layer on the top main surface, and an insulating layer 12*c* cladded with a metal foil layer on the top main surface are first prepared.

Then, in a second step, the metal foil layer cladded to the bottom main surface of the insulating layer 13*a* is etched to form a ground conductive layer 14*a*. The metal foil layer cladded to the top main surface of the insulating layer 13*b* is etched to form a ground conductive layer 14*b*. The metal foil layer cladded to the top main surface of the insulating layer 12*a* is etched to form ground conductive layers 13R and 13L. The metal foil layer cladded to the top main surface of the insulating layer 12*b* is etched to form a signal conductive layer SL, ground conductive layers 14R and 14L, and outer electrodes 30*a* and 30*b*. The metal foil layer cladded to the top main surface of the insulating layer 12*c* is etched to form ground conductive layers 15R and 15L.

The surface of the ground conductive layer 14*a* in contact with the insulating layer 13*a* is roughened. Accordingly, the surface roughness of the surface of the ground conductive layer 14*a* in contact with the insulating layer 13*a* is higher than that of the surface which is not in contact with the insulating layer 13*a*. This configuration makes it difficult for the ground conductive layer 14*a* and the insulating layer 13*a* to separate from each other. Similarly, the ground conductive layer 14*b* and the insulating layer 13*b* are less likely to separate from each other.

Then, in a third step, through-holes are formed in the insulating layers 12*a*, 12*b*, and 12*c*. A conductor is formed within the through-holes by plating, thus forming interlayer connecting conductors v1 through v4. The formation of the through-holes is performed by processing, such as laser beam irradiation or drilling, for example.

Then, in a fourth step, a planar insulator made of a thermoplastic resin, such as polyimide or liquid crystal polymer, for example, is prepared, and through-holes H1 are formed in the planar insulator, thus forming spacers 20*a* and 20*b* provided with the through-holes H1. The formation of the through-holes H1 is performed by processing, such as drilling or etching using a chemical agent, for example. The shape of the through-holes H1 is the same or substantially the same and the distance between adjacent through-holes H1 is equal or approximately equal. The plural through-holes H1 can thus be formed continuously by the same processing. This process can simplify the forming step of the spacers 20*a* and 20*b*.

Then, in a fifth step, a conductive member C is applied to the ground conductive layers 14*a* and 14*b*.

Then, in a sixth step, the spacer 20*b* is stacked on the insulating layer 13*b*. At this time, the conductive member C applied to the ground conductive layer 14*b* is positioned in the through-holes H1 of the spacer 20*b*.

Then, in a seventh step, the insulating layer 12*c* is stacked on the spacer 20*b*. At this time, the conductive member C positioned in the through-holes H1 of the spacer 20*b* is connected to the ground conductive layers 15R and 15L. In other words, the ground conductive layer 14*b* and the ground conductive layers 15R and 15L are connected to each other by the conductive member C.

Then, in an eighth step, the insulating layer 12*b* is stacked on the insulating layer 12*c*, and the insulating layer 12*a* is stacked on the insulating layer 12*b*.

Then, in a ninth step, the spacer 20*a* is stacked on the insulating layer 12*a*.

Finally, in a tenth step, the insulating layer 13*a* is stacked on the spacer 20*a*. At this time, the conductive member C applied to the ground conductive layer 14*a* is positioned in the through-holes H1 of the spacer 20*a*. The conductive member C positioned in the through-holes H1 of the spacer 20*a* is connected to the ground conductive layers 13R and 13L. In other words, the ground conductive layer 14*a* and the ground conductive layers 13R and 13L are connected to each other by the conductive member C.

Through the above-described steps, the formation of the multilayer substrate 10 is completed.

In the multilayer substrate 10 formed as described above, the less rough surface of the ground conductive layer 14*a* and the less rough surface of the ground conductive layer 14*b* oppose each other so as to sandwich the signal conductive layer SL therebetween. This process can reduce the transmission loss of a radio-frequency signal transmitted through the signal conductive layer SL.

After forming the multilayer substrate 10, a top resist layer 18*a* and a bottom resist layer 18*b* are prepared. Cavities h11, h12, h13, h14, h15, h16, h17, and h18 are formed in the prepared bottom resist layer 18*b*. The top resist layer 18*a* is then stacked on the top of the multilayer substrate 10. The bottom resist layer 18*b* is then stacked on the bottom of the multilayer substrate 10.

The stacking method in the above-described steps is hot pressing, for example.

The stacking order of the insulating layers 12*a*, 12*b*, and 12*c* and the spacers 20*a* and 20*b* is not limited to that described in the sixth through tenth steps. For instance, the insulating layers 12*a*, 12*b*, and 12*c* may first be stacked on (integrated with) each other by processing, such as hot pressing, for example. Then, the spacers 20*a* and 20*b* may be stacked on the stacked (integrated) insulating layers 12*a*, 12*b*, and 12*c*.

The positioning of the conductive member C in the through-holes H1 may be performed by an approach other than the approach to stacking the ground conductive layers 14*a* and 14*b* coated with the conductive member C on the spacers 20*a* and 20*b*, respectively. For example, the conductive member C may be applied to the insulating layers 13*a*, 13*b*, 12*a*, and 12*c*. Then, the spacer 20*a* may be stacked on the insulating layers 13*a* and 12*a* coated with the conductive member C, while the spacer 20*b* may be stacked on the insulating layers 13*b* and 12*c* coated with the conductive member C, thereby charging the conductive member C into the spacers 20*a* and 20*b*.

First Modified Example of First Preferred Embodiment

Figure 10:
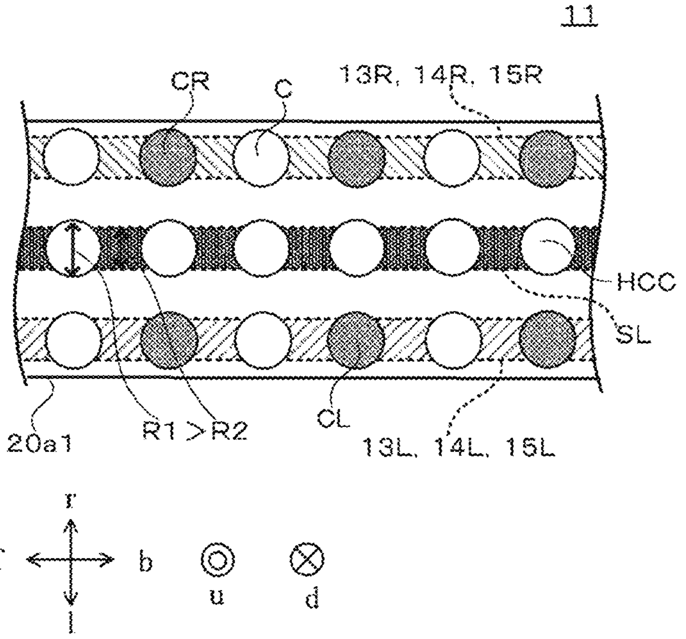
FIG. 10 illustrates a spacer included in the multilayer substrate according to a first modified example of the first preferred embodiment of the present invention.

A multilayer substrate 11 according to a first modified example of the first preferred embodiment will be described below with reference to FIG. 10. FIG. 10 illustrates a spacer 20*a*1 included in the multilayer substrate 11 according to the first modified example of the first preferred embodiment. The signal conductive layer SL, ground conductive layers 13R, 14R, and 15R, and ground conductive layers 13L, 14L, and 15L are seen through in FIG. 10.

The multilayer substrate 11 is different from the multilayer substrate 10 in that the shape of the spacer 20al is different from that of the spacer 20a. More specifically, as shown in FIG. 10, the diameter R1 of multiple through-holes HCC (multiple through-holes H1) of the spacer 20al is larger than the width R2 of the signal conductive layer SL in the left-right direction of the multilayer body. In this case, the volume of the through-holes of the spacer 20al becomes larger than that of the through-holes H1 of the spacer 20a, which increases the amount of air around the signal conductive layer SL. It is thus possible to lower the dielectric constant of the region around the signal conductive layer SL.

Second Preferred Embodiment

Structure of Multilayer Substrate 10a

Figure 11:
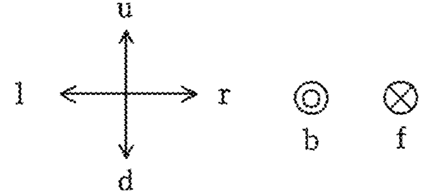
FIG. 11 is a sectional view of a multilayer substrate according to a second preferred embodiment of the present invention taken along line A-A in FIG. 1.
Figure 12:
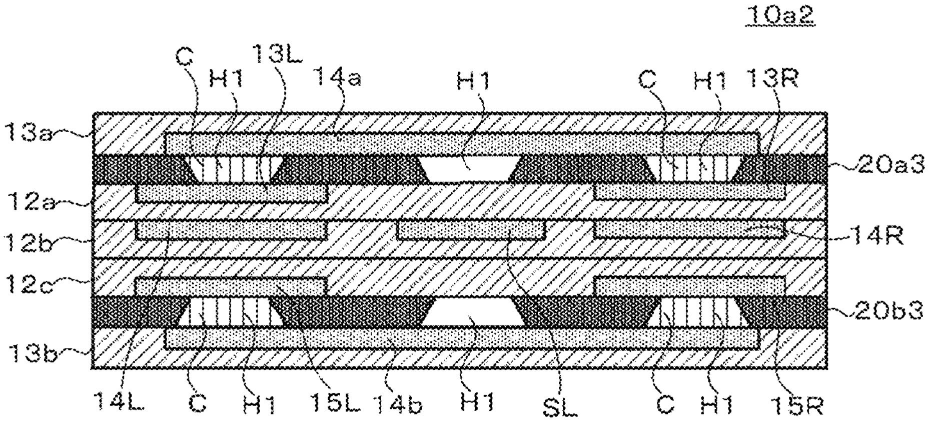
FIG. 12 is a sectional view of a multilayer substrate according to the second preferred embodiment of the present invention taken along line A-A in FIG. 1.
Figure 12:
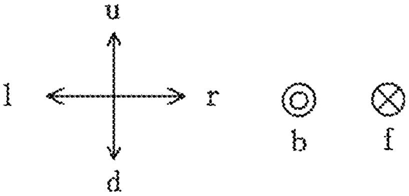

A multilayer substrate 10a according to a second preferred embodiment of the present invention will be described below with reference to the drawings. FIG. 11 is a sectional view of the multilayer substrate 10a according to the second preferred embodiment taken along line A-A (FIG. 1). FIG. 12 is a sectional view of a multilayer substrate 10a2 according to the second preferred embodiment taken along line A-A (FIG. 1).

The multilayer substrate 10a of the second preferred embodiment is different from the multilayer substrate 10 in that it includes spacers 20a2 and 20b2 having a shape different from that of the spacers 20a and 20b. More specifically, the shape of the through-holes H1 of the spacers 20a2 and 20b2 is different from that of the through-holes H1 of the spacers 20a and 20b.

As illustrated in FIG. 11, the diameter of the through-holes H1 on the top surface (the surface in contact with the ground conductive layer 14a) of the spacer 20a2 is smaller than that of the through-holes H1 on the bottom surface (the surface in contact with the ground conductive layers 13R and 13L) of the spacer 20a2. In other words, the sectional area of the through-hole H1 of the spacer 20a2 in a plane perpendicular or substantially perpendicular to the up-down direction of the multilayer body becomes larger as the through-hole H1 gets closer to the signal conductive layer SL. As in the spacer 20a2, the sectional area of the through-hole H1 of the spacer 20b2 in a plane perpendicular or substantially perpendicular to the up-down direction of the multilayer body becomes larger as the through-hole H1 gets closer to the signal conductive layer SL. Hereinafter, in the second preferred embodiment, the shape of the through-holes H1 of the spacers 20a2 and 20b2 whose sectional area in a plane perpendicular or substantially perpendicular to the up-down direction of the multilayer body becomes larger as the through-hole H1 gets closer to the signal conductive layer SL will be referred to as a tapered shape.

Manufacturing Method for Multilayer Substrate 10a

The multilayer substrate 10a is fabricated as follows, for example. In a manner the same as or similar to the multilayer substrate 10, the first, second, and third steps are performed, so that the insulating layers 12a, 12b, 12c, 13a, and 13b are formed.

Then, a planar insulator made of a thermoplastic resin, such as polyimide or liquid crystal polymer, for example, is prepared, and through-holes H1 having a tapered shape are formed by processing, such as etching of the planar insulator, thus forming spacers 20a2 and 20b2 provided with the through-holes H1 having a tapered shape.

After the spacers 20a2 and 20b2 are formed, the steps for manufacturing the multilayer substrate 10a are the same as or similar to those of the multilayer substrate 10, and an explanation thereof will thus be omitted.

Advantages of Second Preferred Embodiment

In the multilayer substrate 10a, the dielectric loss of a radio-frequency signal transmitted through the signal conductive layer SL is reduced.

This circumstance will be explained more specifically below. The sectional area of the through-hole H1 in a plane perpendicular or substantially perpendicular to the up-down direction of the multilayer body becomes larger as the through-hole H1 gets closer to the signal conductive layer SL. With this configuration, in the spacer, the ratio of air to the resin forming the spacer becomes greater as the through-hole H1 gets closer to the signal conductive layer SL. A region having a low dielectric constant is thus likely to be formed uniformly along the signal conductive layer SL. This uniformity lowers the dielectric loss of a radio-frequency signal transmitted through the signal conductive layer SL.

Additionally, the spacers 20a2 and 20b2 of the multilayer substrate 10a are less likely to be broken. This circumstance will be explained more specifically below. The sectional area of the through-hole H1 in a plane perpendicular or substantially perpendicular to the up-down direction of the multilayer body becomes smaller as the through-hole H1 is farther separated from the signal conductive layer SL. With this configuration, in the spacer, the ratio of the resin forming the spacer to air (region within the through-hole H1) becomes greater as the through-hole H1 is farther separated from the signal conductive layer SL. Increasing the ratio of the resin improves the strength of the spacers 20a2 and 20b2, so that the spacers 20a2 and 20b2 become less likely to be broken. In the spacers 20a2 and 20b2, the ratio of the resin becomes greater as the through-holes H1 get closer to the ground conductive layers 14a and 14b. In other words, the relatively increased amount of resin improves the holding force of the spacers 20a2 and 20b2 to the ground conductive layers 14a and 14b, respectively, thus making it difficult to deform the ground conductive layers 14a and 14b. Thus, the capacitance between the signal conductive layer SL and each of the ground conductive layers 14a and 14b is less likely to change.

Structure of Multilayer Substrate 10a2

As illustrated in FIG. 12, the multilayer substrate 10a2 according to the second preferred embodiment is different from the multilayer substrate 10a in that the substrate includes spacers 20a3 and 20b3 having a shape different from that of the spacers 20a2 and 20b2. As shown in FIG. 12, in the multilayer substrate 10a2, the sectional area of the through-holes H1 of the spacers 20a3 and 20b3 in a plane perpendicular or substantially perpendicular to the up-down direction of the multilayer body becomes larger as the through-holes H1 are farther separated from the signal conductive layer SL. To put it another way, the sectional area of the through-holes H1 of the spacers 20a3 and 20b3 in a plane perpendicular or substantially perpendicular to the up-down direction of the multilayer body becomes smaller as the through-holes H1 get closer to the signal conductive layer SL.

Manufacturing Method for Multilayer Substrate 10a2

The multilayer substrate 10a2 is manufactured in the following method, for example. In a manner the same as or similar to the multilayer substrate 10, the first, second, and third steps are performed, so that the insulating layers 12a, 12b, 12c, 13a, and 13b are formed.

Then, the insulating layers 12*c*, 12*b*, and 12*a* are stacked in the upward direction of the multilayer body in this order.

Then, a planar insulator made of a thermoplastic resin (such as polyimide or liquid crystal polymer, for example) is stacked above the insulating layer 12*a* in the up-down direction of the multilayer body. Additionally, a planar insulator made of a thermoplastic resin (such as polyimide or liquid crystal polymer, for example) is stacked under the insulating layer 12*c* in the up-down direction of the multilayer body.

Etching is then performed on the insulator stacked above the insulating layer 12*a* in the up-down direction of the multilayer body and on the planar insulator stacked under the insulating layer 12*c* in the up-down direction of the multilayer body, thus forming the spacers 20*a*3 and 20*b*3 provided with through-holes H1. That is, in the manufacturing of the multilayer substrate 10*a*2, the through-holes H1 of the spacers 20*a*3 and 20*b*3 are formed by processing, such as etching, for example, in a state in which the spacers 20*a*3 and 20*b*3 and the insulating layers 12*a*, 12*b*, and 12*c* are stacked on each other. The through-holes H1 are formed so that the sectional area of the through-holes H1 of the spacers 20*a*3 and 20*b*3 in a plane perpendicular or substantially perpendicular to the up-down direction of the multilayer body becomes smaller as the through-holes H1 get closer to the signal conductive layer SL.

Then, the insulating layer 13*a* is stacked above the spacer 20*a*3, and the insulating layer 13*b* is stacked under the spacer 20*b*3.

Through the above-described steps, the formation of the multilayer substrate 10*a*2 is completed.

Advantages of Multilayer Substrate 10*a*2

Using the multilayer substrate 10*a*2 makes it possible to form the through-holes H1 of the spacers 20*a*3 and 20*b*3 in accordance with the positions of the insulating layers 12*a*, 12*b*, and 12*c*. More specifically, since, in the multilayer substrate 10*a*2, the through-holes H1 are formed after the spacers 20*a*3 and 20*b*3 and the insulating layers 12*a*, 12*b*, and 12*c* are stacked on each other, the positions of the through-holes H1 to be provided in the spacers 20*a*3 and 20*b*3 can be adjusted in accordance with the positions of the insulating layers 12*a*, 12*b*, and 12*c*.

Third Preferred Embodiment

Structure of Multilayer Substrate 10*b*

Figure 13:
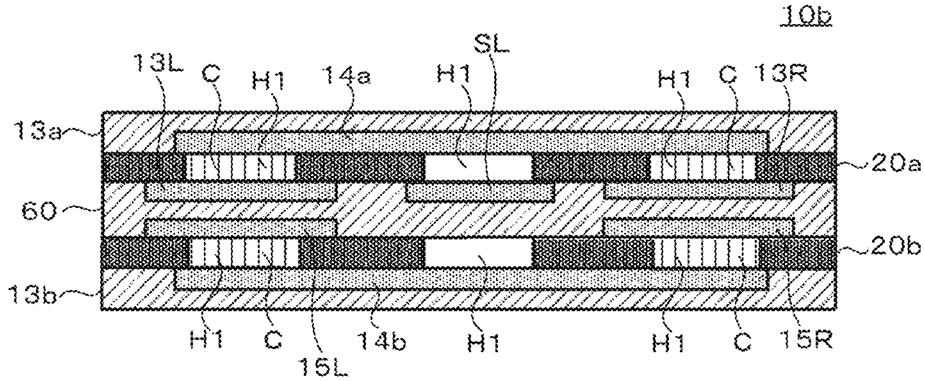
FIG. 13 is a sectional view of a multilayer substrate according to a third preferred embodiment of the present invention taken along line A-A in FIG. 1.
Figure 13:
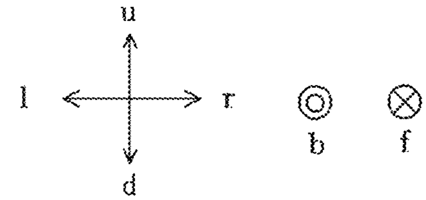

A multilayer substrate 10*b* according to a third preferred embodiment of the present invention will be described below with reference to the drawing. FIG. 13 is a sectional view of the multilayer substrate 10*b* according to the third preferred embodiment taken along line A-A (FIG. 1).

As illustrated in FIG. 13, the multilayer substrate 10*b* is different from the multilayer substrate 10 in that the substrate includes an insulating layer 60 instead of the insulating layers 12*a*, 12*b*, and 12*c*. In other words, the multilayer substrate 10*b* includes one insulating layer (insulating layer 60) positioned between the spacers 20*a* and 20*b*, instead of three insulating layers (insulating layers 12*a*, 12*b*, and 12*c*) positioned between the spacers 20*a* and 20*b*.

The insulating layer 60 is located at a lower position than the signal conductive layer SL and ground conductive layers 13R and 13L. The insulating layer 60 is located at a higher position than the ground conductive layers 15R and 15L. In other words, the insulating layer 60 includes a conductive layer that contacts the top surface of the insulating layer 60 and a conductive layer that contacts the bottom surface of the insulating layer 60.

The ground conductive layers 13R and 15R are electrically connected to each other using an interlayer connecting conductor, while the ground conductive layers 13L and 15L are electrically connected to each other using an interlayer connecting conductor, though the connection states are not shown in FIG. 13.

Advantages of Third Preferred Embodiment

Using the multilayer substrate 10*b* can reduce the amount of material used for the multilayer substrate 10*b*.

More specifically, in the multilayer substrate 10*b*, only one insulating layer (insulating layer 60) is positioned between two spacers (spacers 20*a* and 20*b*) in the up-down direction of the multilayer body. Accordingly, only a minimal number of insulating layers can form the multilayer substrate 10*b*. The multilayer substrate 10*b* can thus be fabricated with a small amount of material.

The multilayer substrate 10*b* can reduce a deviation of the characteristic impedance of the signal conductive layer SL. This will be explained more specifically below. Fewer insulating layers are used for the multilayer substrate 10*b* than for the multilayer substrate 10. That is, the multilayer substrate 10*b* can be fabricated with a smaller number of times layers are stacked. This configuration makes it less likely to cause a displacement of multiple insulating layers when they are stacked on each other. Thus, a deviation of the characteristic impedance of the signal conductive layer SL, which is caused by the displacement of insulating layers when they are stacked each other, is unlikely to occur.

Additionally, in the multilayer substrate 10*b*, the top surface of the signal conductive layer SL and the spacer 20*a* contact each other.

A through-hole H1, which is hollow, is thus located above the signal conductive layer SL. This improves the characteristics of a signal transmitted through the signal conductive layer SL.

Fourth Preferred Embodiment

Structure of Multilayer Substrate 10*c*

Figure 14:
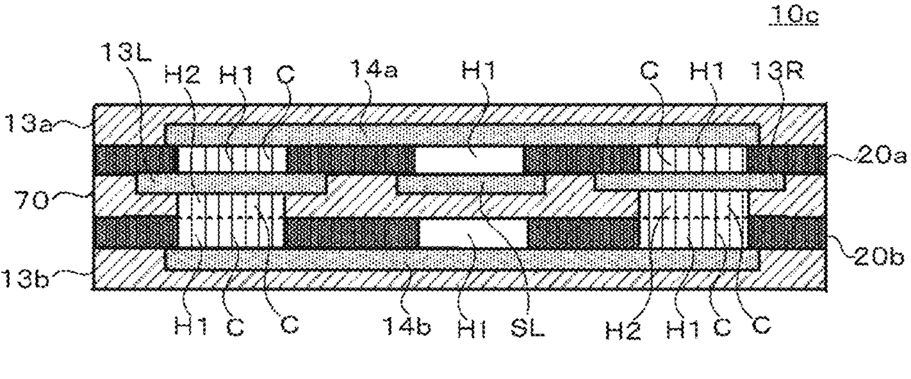
FIG. 14 is a sectional view of a multilayer substrate according to a fourth preferred embodiment of the present invention taken along line A-A in FIG. 1.
Figure 14:
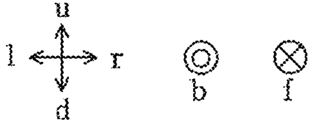

A multilayer substrate 10*c* according to a fourth preferred embodiment of the present invention will be described below with reference to the drawings. FIG. 14 is a sectional view of the multilayer substrate 10*c* according to the fourth preferred embodiment taken along line A-A (FIG. 1).

As illustrated in FIG. 14, the multilayer substrate 10*c* is different from the multilayer substrate 10 in that the substrate includes an insulating layer 70 instead of the insulating layers 12*a*, 12*b*, and 12*c*. The multilayer substrate 10*c* is also different from the multilayer substrate 10 in that only two ground conductive layers (ground conductive layers 13R and 13L) are positioned between the spacers 20*a* and 20*b* in the up-down direction of the multilayer body.

The multilayer substrate 10*c* will be described below in greater detail. The insulating layer 70 is located at a lower position than the spacer 20*a* in the up-down direction of the multilayer body and is located at a higher position than the spacer 20*b* in the up-down direction of the multilayer body.

The top surface of the insulating layer 70 contacts the bottom surfaces of the ground conductive layers 13R and 13L.

As illustrated in FIG. 14, multiple through-holes H2 passing through the insulating layer 70 in the up-down direction of the multilayer body are provided in the insulating layer 70. More specifically, as viewed in the up-down direction of the multilayer body, the multiple through-holes H2 overlap the ground conductive layers 13R and 13L. As illustrated in FIG. 14, the region defined by plural through-holes H1 and the region defined by plural through-holes H2 contact each other. To put it another way, plural regions, each defined by a through-hole H1 and a through-hole H2, are provided in the insulating layer 70. One region defined by a through-hole H1 and a through-hole H2 is larger than a region defined by one through-hole H1. One region defined by a through-hole H1 and a through-hole H2 is also larger than a region defined by one through-hole H2.

A conductive member C is provided in the through-holes H2. The through-holes H1 with a conductive member C and the through-holes H2 with a conductive member C thus connect the ground conductive layers 13R and 13L and the ground conductive layer 14*b* to each other, as shown in FIG. 14.

Advantages of Fourth Preferred Embodiment

Using the multilayer substrate 10*c* can reduce the number of interlayer connecting conductors. This will be described more specifically below. Providing a conductive member C in the through-holes H2 of the insulating layer 70 can electrically connect the ground conductive layers 13R and 13L and the ground conductive layer 14*b* to each other. Thus, without the use of interlayer connecting conductors v1 through v4, the ground conductive layers 13R and 13L and the ground conductive layer 14*b* can be electrically connected to each other. This eliminates the formation of interlayer connecting conductors v1 through v4 in the multilayer substrate 10*c* to connect the ground conductive layers 13R and 13L and the ground conductive layer 14*b*. Without using such interlayer connecting conductors v1 through v4, the multilayer substrate 10*c* can thus reduce the number of interlayer connecting conductors.

First Modified Example of Fourth Preferred Embodiment

Figure 15:
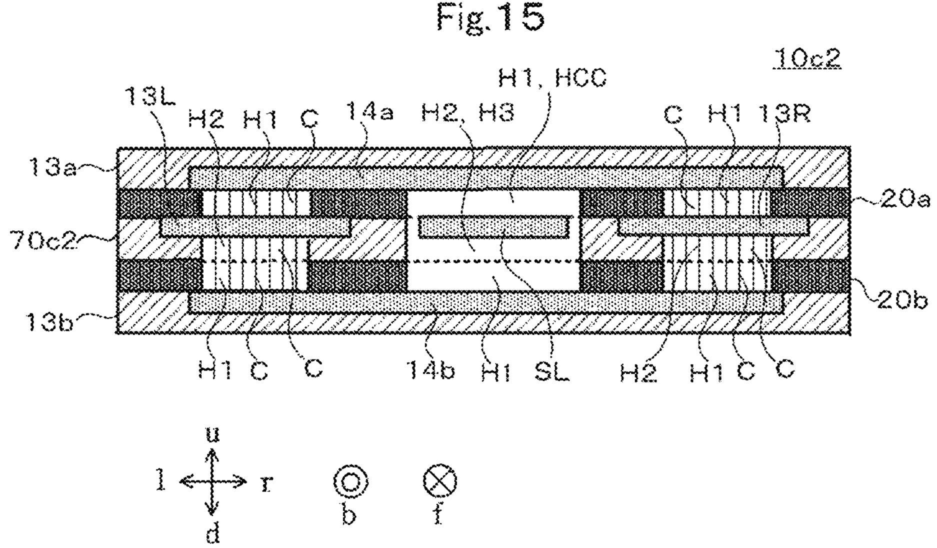
FIG. 15 is a sectional view of a multilayer substrate according to a first modified example of the fourth preferred embodiment of the present invention taken along line A-A in FIG. 1.

A multilayer substrate 10*c*2 according to a first modified example of the fourth preferred embodiment will be described below with reference to the drawings. FIG. 15 is a sectional view of the multilayer substrate 10*c*2 according to the first modified example of the fourth preferred embodiment taken along line A-A (FIG. 1).

The multilayer substrate 10*c*2 is different from the multilayer substrate 10*c* in that it includes an insulating layer 70*c*2 having a shape different from that of the insulating layer 70. More specifically, as illustrated in FIG. 15, one or more through-holes H3 passing through the insulating layer 70*c*2 in the up-down direction of the multilayer body are provided in the insulating layer 70*c*2. Plural through-holes H2 include one or more through-holes H3. As viewed in the up-down direction of the multilayer body, one or more through-holes H3 overlap plural through-holes HCC (first hollow through-holes) that overlap the signal conductive layer SL. In other words, at least one of the plural through-holes H2 overlaps a first hollow through-hole, as seen in the up-down direction of the multilayer body. With this configuration, the amount of air around the signal conductive layer SL becomes greater than that of the multilayer substrate 10. The dielectric constant of the region around the signal conductive layer SL can thus be lowered.

The diameter of the through-hole H3 is larger than the width of the signal conductive layer SL in the left-right direction of the multilayer body. In this case, the volume of the through-hole H3 becomes greater than that when the diameter of the through-hole H3 is smaller than the width of the signal conductive layer SL in the left-right direction of the multilayer body. The amount of air around the signal conductive layer SL is thus increased, so that the dielectric constant of the region around the signal conductive layer SL can be lowered. It is not necessary that the diameter of the through-hole H3 is larger than the width of the signal conductive layer SL in the left-right direction of the multilayer body. It is preferable, however, that the diameter of the through-hole H3 is larger than the width of the signal conductive layer SL in the left-right direction of the multilayer body.

In the fourth preferred embodiment, the diameter of the plural through-holes HCC (first hollow through-holes) that overlap the signal conductive layer SL is larger than the width of the signal conductive layer SL in the left-right direction of the multilayer body. In this case, the volume of the first hollow through-holes becomes greater than that when the diameter of the first hollow through-holes is smaller than the width of the signal conductive layer SL in the left-right direction of the multilayer body. The amount of air around the signal conductive layer SL is thus increased, so that the dielectric constant of the region around the signal conductive layer SL can be lowered. It is not necessary that the diameter of the first hollow through-holes is larger than the width of the signal conductive layer SL in the left-right direction of the multilayer body. It is preferable, however, that the diameter of the first hollow through-holes is larger than the width of the signal conductive layer SL in the left-right direction of the multilayer body.

Fifth Preferred Embodiment

Structure of Multilayer Substrate 10*d*

Figure 16:
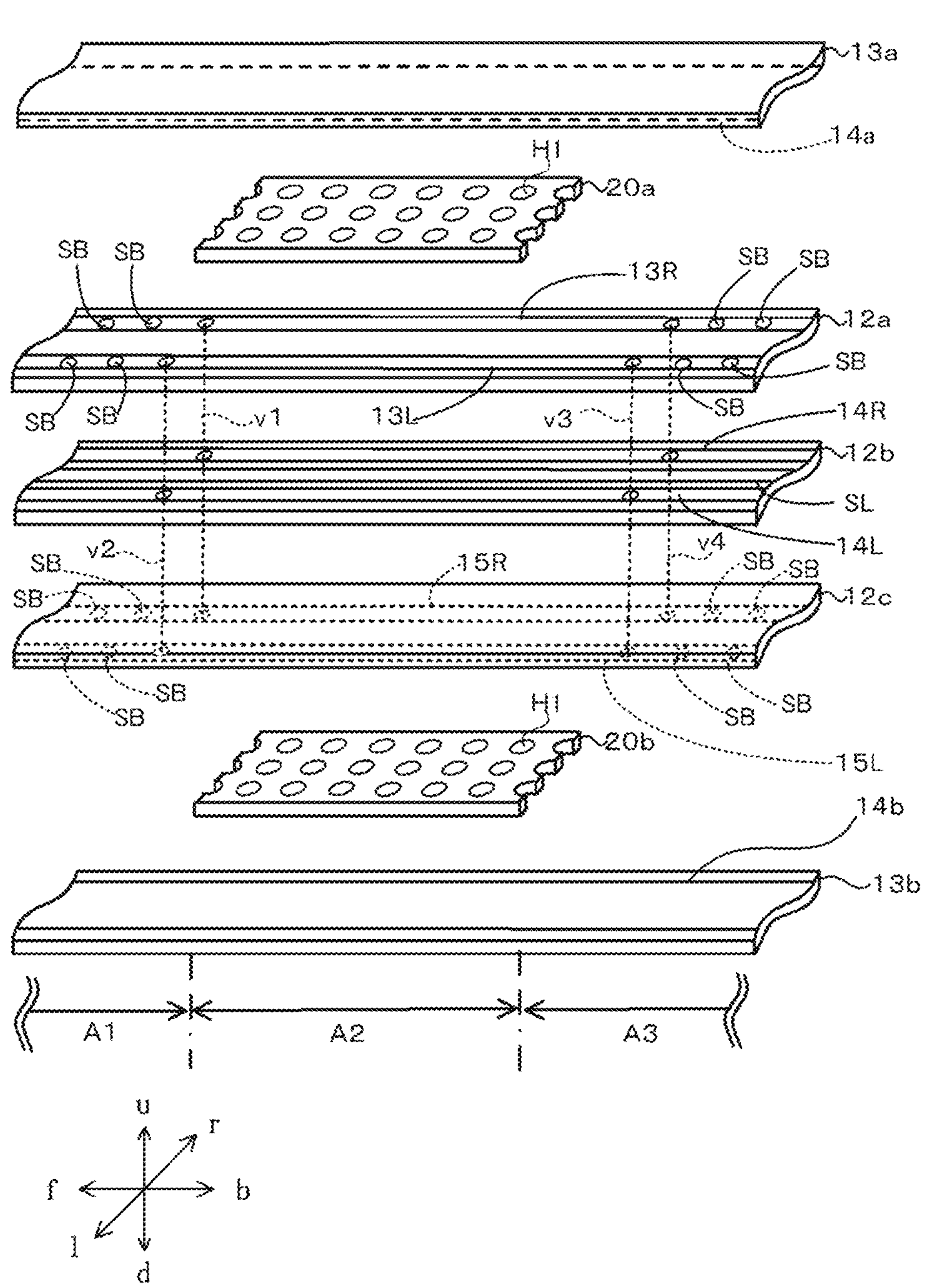
FIG. 16 is an exploded perspective view of a multilayer substrate according to a fifth preferred embodiment of the present invention.
Figure 17:
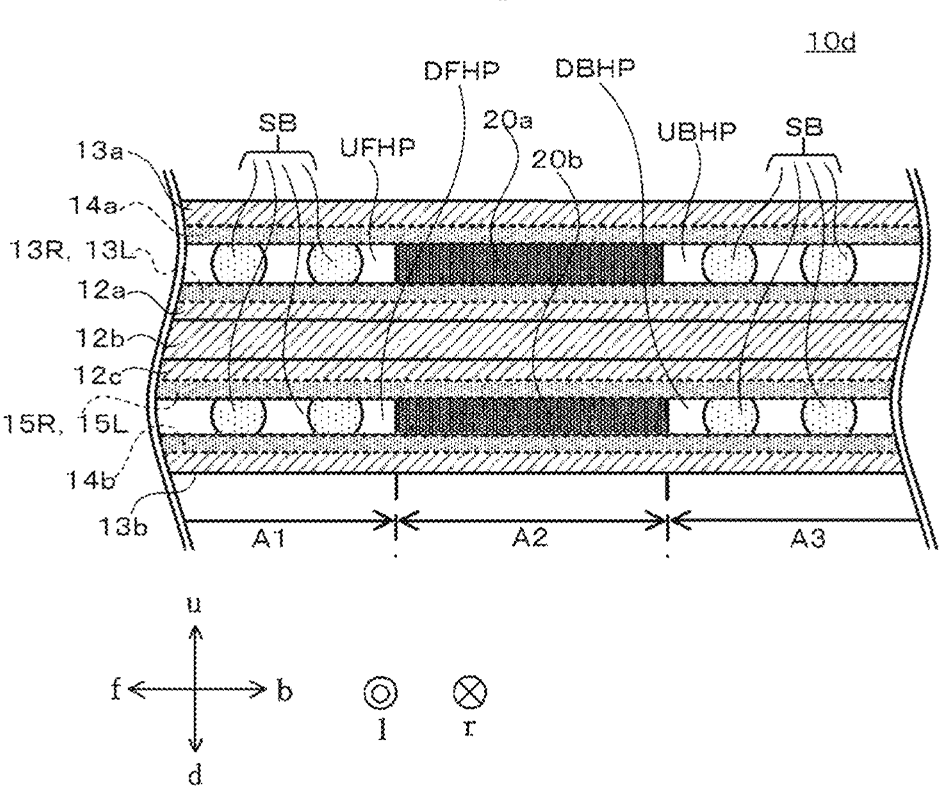
FIG. 17 is a side view of the multilayer substrate according to the fifth preferred embodiment of the present invention.

A multilayer substrate 10*d* according to a fifth preferred embodiment of the present invention will be described below with reference to the drawings. FIG. 16 is an exploded perspective view of the multilayer substrate 10*d* according to the fifth preferred embodiment. FIG. 17 is a side view of the multilayer substrate 10*d* according to the fifth preferred embodiment, as viewed in the front-back direction of the multilayer body. Ground conductive layers 14*a*, 14*b*, 13R, 13L, 15R, and 15L are seen through in FIG. 17.

The multilayer substrate 10*d* is different from the multilayer substrate 10 in that it includes a spacer 20*a* having a small length in the front-back direction of the multilayer body. The configurations of the other elements of the multilayer substrate 10*d* are the same as or similar to those of the multilayer substrate 10, and an explanation thereof will thus be omitted.

As shown in FIGS. 16 and 17, in the multilayer substrate 10*d*, the length of the spacers 20*a* and 20*b* in the front-back direction of the multilayer body is smaller than the length of the insulating layers 13*a*, 12*a*, 12*b*, 12*c*, and 13*b* in the front-back direction of the multilayer body. In other words, the spacers 20*a* and 20*b* are disposed in a portion of the multilayer substrate 10*d* in the front-back direction of the multilayer body.

A description will be provided below by taking an example in which the multilayer substrate 10*d* has uncurved sections A1 and A3 and a curved section A2 (see FIGS. 16 and 17). However, the multilayer substrate 10*d* shown in FIGS. 16 and 17 is the multilayer substrate 10*d* before it is bent in the z-axis direction. Accordingly, the curved section A2 is not bent in the z-axis direction in FIGS. 16 and 17. In FIGS. 16 and 17, the front edge portion of the uncurved section A1 and the back edge portion of the uncurved section A3 are not shown.

The spacers 20*a* and 20*b* having a small length in the front-back direction of the multilayer body as described above is provided in the curved section A2, for example, as shown in FIGS. 16 and 17. The spacers 20*a* and 20*b* are not provided in the uncurved sections A1 and A3, as shown in FIGS. 16 and 17.

As illustrated in FIG. 17, in the uncurved sections A1 and A3, hollow portions UFHP and UBHP filled with air are provided in regions below the insulating layer 13*a* and above the insulating layer 12*a*.

The hollow portion UFHP is located farther frontward than the spacer 20*a* in the front-back direction of the multilayer body. That is, if the spacer 20*a* were stretched in the front direction of the multilayer body, the hollow portion UFHP is provided in a space which would overlap the spacer 20*a* stretched in the front direction of the multilayer body. That is, the hollow portion UFHP, which is a portion sealed by plural insulating layers (insulating layers 13*a* and 12*a*), is provided in the uncurved section A1.

The hollow portion UBHP is located farther backward than the spacer 20*a* in the front-back direction of the multilayer body. That is, if the spacer 20*a* were stretched in the back direction of the multilayer body, the hollow portion UBHP is provided in a space which would overlap the spacer 20*a* stretched in the back direction of the multilayer body. That is, the hollow portion UBHP, which is a portion sealed by plural insulating layers (insulating layers 13*a* and 12*a*), is provided in the uncurved section A3.

In a manner the same as or similar to the hollow portions UFHP and UBHP, as shown in FIG. 17, in the uncurved sections A1 and A3, hollow portions DFHP and DBHP filled with air are provided in regions below the insulating layer 12*c* and above the insulating layer 13*b*.

The hollow portion DEHP is located farther frontward than the spacer 20*b* in the front-back direction of the multilayer body. That is, when the spacer 20*b* were stretched in the front direction of the multilayer body, the hollow portion DEHP is provided in a space which would overlap the spacer 20*b* stretched in the front direction of the multilayer body. That is, the hollow portion DEHP, which is a portion sealed by plural insulating layers (insulating layers 13*b* and 12*c*), is provided in the uncurved section A1.

The hollow portion DBHP is located farther backward than the spacer 20*b* in the front-back direction of the multilayer body. That is, when the spacer 20*b* were stretched in the back direction of the multilayer body, the hollow portion DBHP is provided in a space which would overlap the spacer 20*b* stretched in the back direction of the multilayer body. That is, the hollow portion DBHP, which is a portion sealed by plural insulating layers (insulating layers 13*b* and 12*c*), is provided in the uncurved section A3.

With this configuration, in the multilayer substrate 10*d*, the hollow portions UFHP, UBHP, DEHP, and DBHP filled with air having a low dielectric constant are provided, thus lowering the dielectric loss of a signal.

As illustrated in FIGS. 16 and 17, in the uncurved sections A1 and A3 of the multilayer substrate 10*d*, plural spherical conductors SB are provided between the ground conductive layers 15R and 15L and the ground conductive layer 14*b*, as illustrated in FIG. 16. Similarly, in the uncurved sections A1 and A3 of the multilayer substrate 10*d*, plural spherical conductors SB are provided between the ground conductive layers 13R and 13L and the ground conductive layer 14*a*. The spherical conductors SB and the ground conductive layers 13R and 13L are connected to each other with a solder. In the fifth preferred embodiment, the spherical conductor SB is specifically a spherical conductor whose surface is covered with a solder. The spherical conductors SB have a uniform or substantially uniform diameter. The spherical conductors have a higher melting point than the solder.

As shown in FIG. 17, the height of the spherical conductors SB in the up-down direction of the multilayer body provided between the ground conductive layers 15R and 15L and the ground conductive layer 14*b* is the same or substantially the same as that of the spacer 20*b* in the up-down direction of the multilayer body. This reduces the possibility that the multilayer substrate 10*d* is bent in the up-down direction of the multilayer body in the uncurved sections A1 and A3. Providing the spherical conductors SB can thus maintain the distance between the ground conductive layer 14*b* and the insulating layer 12*c* at a fixed distance over the front-end direction of the multilayer body.

Similarly, as shown in FIG. 17, providing the spherical conductors SB between the ground conductive layers 13R and 13L and the ground conductive layer 14*a* can maintain the distance between the ground conductive layer 14*a* and the insulating layer 12*a* at a fixed distance over the front-end direction of the multilayer body.

Advantages of Fifth Preferred Embodiment

The manufacturing cost for forming the multilayer substrate 10*d* can be lowered. This will be described more specifically below. In the multilayer substrate 10*d*, the spacers 20*a* and 20*b* are disposed in the curved section A2, which is a portion to be subjected to pressure, and are not disposed in the uncurved sections A1 and A3. In other words, the spacers 20*a* and 20*b* are not disposed anywhere other than the curved section A2, which is a portion that may cause a breakage of the multilayer substrate 10*d*. The volume of the spacers 20*a* and 20*b* can be decreased. This circumstance leads to a reduction of the cost for forming the multilayer substrate 10*d*.

In the multilayer substrate 10*d*, the dielectric loss of a radio-frequency signal transmitted through the signal conductive layer SL can be lowered. This will be explained more specifically below. In the multilayer substrate 10*d*, hollow portions filled with air are provided in the uncurved sections A1 and A3. In other words, in the multilayer substrate 10*d*, it is possible to provide hollow portions in areas other than the curved section A2, which is a portion that may cause a breakage of the multilayer substrate 10*d*. Providing the hollow portions increases the area of the multilayer substrate 10*d* filled with air having a low dielectric constant. The multilayer substrate 10*d* can thus reduce the dielectric loss of a signal.

It is preferable that, in the multilayer substrate 10*d*, the width of the signal conductive layer SL in the curved section A2 (the section where the spacers 20*a* and 20*b* are disposed) in the left-right direction of the multilayer body is smaller than the width of the signal conductive layer SL in the uncurved sections A1 and A3 (the sections where the spacers 20*a* and 20*b* are not disposed) in the left-right direction of the multilayer body. This circumstance can make it less likely to cause a difference of the characteristic impedance of the signal conductive layer SL between the section where the spacers 20*a* and 20*b* are disposed and the sections where the spacers 20*a* and 20*b* are not disposed.

First Modified Example of Fifth Preferred Embodiment

A multilayer substrate 10*d*2 according to a first modified example of the fifth preferred embodiment will be described below with reference to the drawings. FIG. 18 is a side view of the multilayer substrate 10*d*2 according to the first modified example of the fifth preferred embodiment. Ground conductive layers 14*a*, 14*b*, 13R, 13L, 15R, and 15L are seen through in FIG. 18.

The multilayer substrate 10*d*2 is different from the multilayer substrate 10*d*2 in that a solder Sd is provided in hollow portions UFHP, UBHP, DFHP, and DBHP. The solder Sd includes solders Sd1 and Sd2. The solder Sd1 is disposed between the insulating layers 13*a* and 12*a*. The solder Sd1 contacts the insulating layers 13*a* and 12*a* so as to improve the bonding strength between the insulating layers 13*a* and 12*a*. The solder Sd1 also maintains the distance between the insulating layers 13*a* and 12*a* at a fixed distance. This makes it unlikely to change the capacitance between the signal conductive layer SL and the ground conductive layer 14*a*.

The solder Sd2 is disposed between the insulating layers 13*b* and 12*c*. The solder Sd2 contacts the insulating layers 13*b* and 12*c*. In this case, as in the solder Sd1, the solder Sd2 improves the bonding strength between the insulating layers 13*b* and 12*c*. The capacitance between the signal conductive layer SL and the ground conductive layer 14*b* is unlikely to change.

Sixth Preferred Embodiment

Structure of Multilayer Substrate 10*e*

Figures 20, 21:
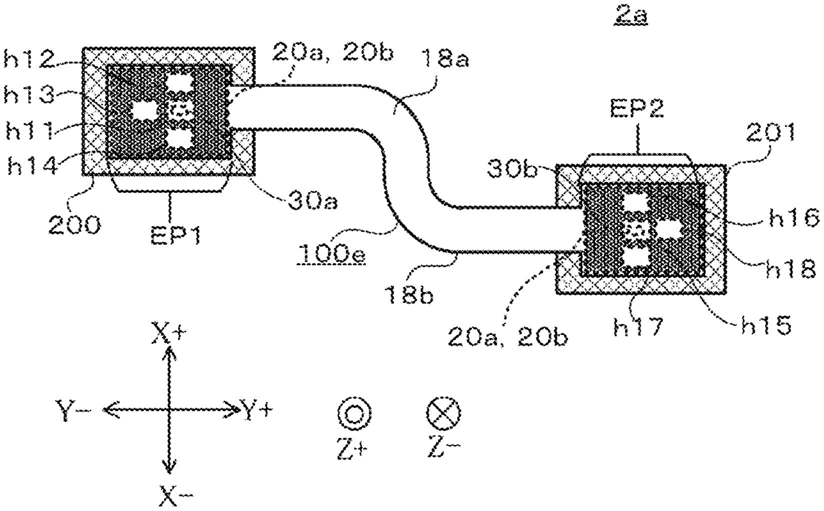
FIG. 20 is a top view of the electronic device including the multilayer substrate of the sixth preferred embodiment of the present invention.
FIG. 21 is a top view of an electronic device including a multilayer substrate of the sixth preferred embodiment of the present invention.

A multilayer substrate 10*e* according sixth preferred embodiment of the present invention will be described below with reference to the drawings. FIG. 19 is a side view of an electronic device 2 including the multilayer substrate 10*e* of the sixth preferred embodiment. FIG. 20 is a top view of the electronic device 2 including the multilayer substrate 10*e* of the sixth preferred embodiment. FIG. 21 is a top view of an electronic device 2*a* including a multilayer substrate 100*e* of the sixth preferred embodiment.

The multilayer substrate 10*e* is different from the multilayer substrate 10 in that it includes spacers 20*a* and 20*b* located in the mounting electrode unit EP1 and EP2.

The multilayer substrate 10*e* will be described below in greater detail. As illustrated in FIGS. 19 and 20, an outer electrode 30*a* (FIG. 20) of the multilayer substrate 10*e* overlaps the spacers 20*a* and 20*b* located in the mounting electrode unit EP1, as viewed in the up-down direction of the multilayer body. As illustrated in FIGS. 19 and 20, in the electronic device 2, an outer electrode 30*b* (FIG. 20) overlaps the spacers 20*a* and 20*b* located in the mounting electrode unit EP2, as viewed in the up-down direction of the multilayer body. That is, the electronic device 2 includes the multilayer substrate 10*e* in which the spacers 20*a* and 20*b* are disposed in the mounting electrode units EP1 and EP2.

As illustrated in FIGS. 19 and 20, the multilayer substrate 10*e* may be bent in the z-axis direction.

In the multilayer substrate 10*e*, the spacers 20*a* and 20*b* may also be disposed in the curved section A2.

The spacers 20*a* and 20*b* may be provided only at positions at which they overlap the outer electrodes 30*a* and 30*b* as seen in the up-down direction of the multilayer body.

As shown in FIG. 21, the multilayer substrate 100*e* curved in an arc shape in the x-axis direction (X+⇔X−) may include spacers 20*a* and 20*b* that overlap the outer electrode 30*a*. In this case, the electronic device 2*a* includes the multilayer substrate 100*e* in which the spacers 20*a* and 20*b* are disposed in the mounting electrode units EP1 and EP2.

The multilayer substrate 100*e* may be further bent in the z-axis direction (Z+⇔Z−).

In the multilayer substrate 100*e*, the spacers 20*a* and 20*b* may also be provided in the curved section B2.

Advantages of Sixth Preferred Embodiment

Using the multilayer substrate 10*e* or 100*e* can reduce the possibility of the occurrence of a mounting failure when the multilayer substrate 10*e* or 100*e* is mounted on a circuit board 200 or 201. Usually, when a circuit board is connected to an outer electrode, pressure is applied to the outer electrode and a mounting electrode unit including the outer electrode. At this time, the mounting electrode unit may be deformed by the applied pressure. In the multilayer substrate 10*e* or 100*e*, the spacers 20*a* and 20*b* overlap the outer electrode 30*a* as seen in the up-down direction of the multilayer body, while the spacers 20*a* and 20*b* also overlap the outer electrode 30*b* as seen in the up-down direction of the multilayer body. In other words, the spacers 20*a* and 20*b* improve the strength of the mounting electrode units EP1 and EP2. This makes it less likely for the mounting electrode units EP1 and EP2 to be deformed by pressure applied to the mounting electrode units EP1 and EP2 when the circuit boards 200 and 201 are respectively connected to the outer electrodes 30*a* and 30*b*. This configuration can reduce the possibility of the occurrence of a mounting failure when the multilayer substrate 10*e* or 100*e* is mounted on the circuit board 200 or 201.

Seventh Preferred Embodiment

Structure of Multilayer Substrate 10*f*

Figure 22:
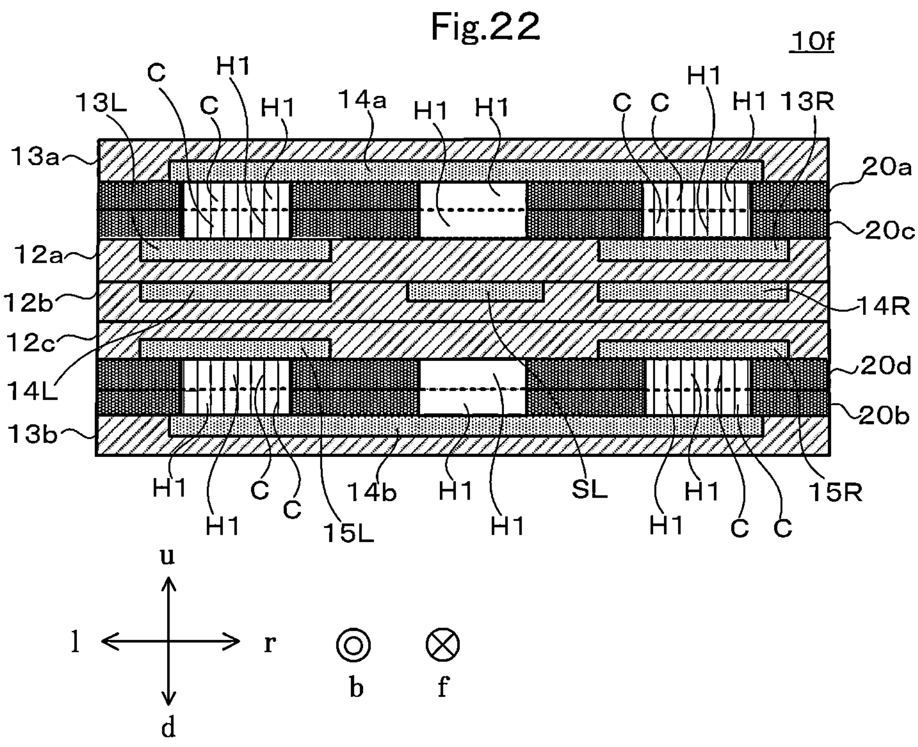
FIG. 22 is a sectional view of a multilayer substrate according to a seventh preferred embodiment of the present invention taken along line A-A in FIG. 1.

A multilayer substrate 10*f* according to a seventh preferred embodiment of the present invention will be described below with reference to the drawings. FIG. 22 is a sectional view of the multilayer substrate 10*f* according to the seventh preferred embodiment taken along line A-A (FIG. 1).

The multilayer substrate 10*f* is different from the multilayer substrate 10 in that multiple spacers are laid on top of each other.

The multilayer substrate 10*f* will be described below in greater detail. The multilayer substrate 10*f* includes a spacer 20*c* positioned below the spacer 20*a* and above the ground conductive layers 13R and 13L. In other words, the multilayer substrate 10*f* includes plural spacers (spacers 20*a* and 20*c*) positioned above the insulating layer 12*a*. In this case, the spacers 20*a* and 20*c* are adjacent to each other.

Similarly, the multilayer substrate 10*f* includes a spacer 20*d* positioned above the spacer 20*b* and below the ground conductive layers 15R and 15L. In other words, the multilayer substrate 10*f* includes plural spacers (spacers 20*b* and 20*d*) positioned below the insulating layer 12*c*. In this case, the spacers 20*b* and 20*d* are adjacent to each other.

The configurations of the other elements of the multilayer substrate 10*f* are the same as or similar to those of the multilayer substrate 10, and an explanation thereof will thus be omitted.

Advantages of Seventh Preferred Embodiment

Using the multilayer substrate 10*f* can reduce the possibility of a breakage of the multilayer substrate 10*f*. More specifically, the multilayer substrate 10*f* includes plural spacers (spacers 20*a* and 20*c*) adjacent to each other and plural spacers (spacers 20*b* and 20*d*) adjacent to each other in the up-down direction of the multilayer body. This configuration improves the strength of the multilayer substrate 10*f*, thus reducing the possibility of a breakage of the multilayer substrate 10*f*.

Eighth Preferred Embodiment

Structure of Multilayer Substrate 10*g*

Figure 23:
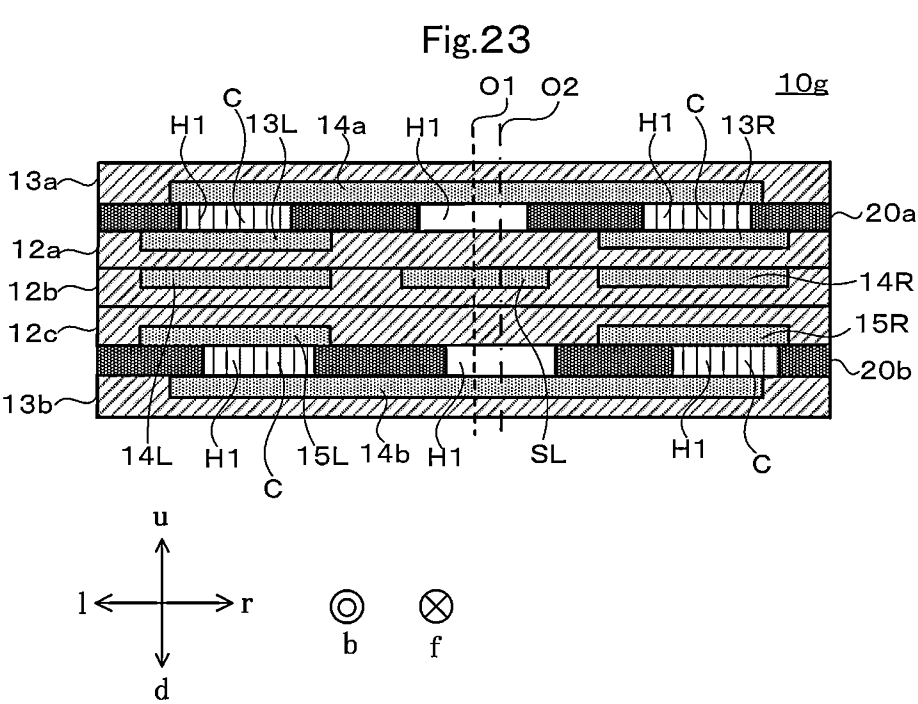
FIG. 23 is a sectional view of a multilayer substrate according to an eighth preferred embodiment of the present invention taken along line A-A in FIG. 1.

A multilayer substrate 10*g* according to an eighth preferred embodiment of the present invention will be described below with reference to the drawings. FIG. 23 is a sectional view of the multilayer substrate 10*g* according to the eighth preferred embodiment taken along line A-A (FIG. 1).

As shown in FIG. 23, the multilayer substrate 10*g* is different from the multilayer substrate 10 in the arrangement of the spacers 20*a* and 20*b*.

The multilayer substrate 10*g* will be described below in greater detail. As viewed in the up-down direction of the multilayer body, the position of the centroid of the through-hole H1 of the spacer 20*a* (through-hole passing through the spacer 20*a* in the up-down direction of the multilayer body) is different from that of the through-hole H1 of the spacer 20*b* (through-hole passing through the spacer 20*b* in the up-down direction of the multilayer body). To put it another way, as seen in the up-down direction of the multilayer body, the through-hole H1 of the spacer 20*a* and that of the spacer 20*b* do not match each other (the position of the through-hole H1 of the spacer 20*a* and that of the through-hole H1 of the spacer 20*b* are displaced from each other, as seen in the up-down direction of the multilayer body).

This configuration will be described more specifically below. As shown in FIG. 23, in the spacer 20*a* positioned above the signal conductive layer SL, a straight line O1 passing through the centroid of the through-hole H1 and extending in the up-down direction of the multilayer body is defined. Then, in the spacer 20*b* positioned below the signal conductive layer SL, a straight line O2 passing through the centroid of the through-hole H1 and extending in the up-down direction of the multilayer body is defined. In the multilayer substrate 10*g*, the position of the straight line O1 and that of the straight line O2 are different from each other, as seen in the left-right direction of the multilayer body. In this case, as seen in the up-down direction of the multilayer body, the position of the centroid of each through-hole H1 of the spacer 20*a* is different from that of each through-hole H1 of the spacer 20*b*.

Advantages of Eighth Preferred Embodiment

Using the multilayer substrate 10*g* can reduce the possibility of a breakage of the multilayer substrate 10*g*. This will be explained more specifically below. The position of the through-hole H1 of the spacer 20*a* and that of the through-hole H1 of the spacer 20*b* are displaced from each other, as viewed in the up-down direction of the multilayer body. With this arrangement, pressure produced in the spacer 20*a* is not concentrated on the same axis (straight line O1, for example) in the up-down direction of the multilayer body. In other words, pressure applied to the multilayer substrate 10*g* can be distributed, thus reducing the possibility of a breakage of the multilayer substrate 10*g*.

First Modified Example of Spacers 20*a* and 20*b*

Figure 24:
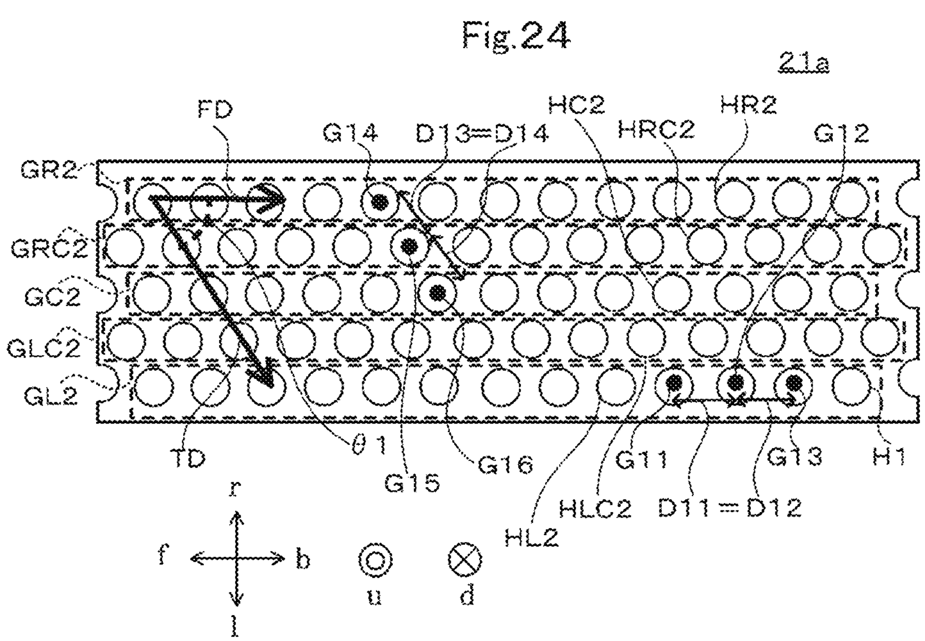
FIG. 24 is a top view of a spacer according to a first modified example of the spacer.

A first modified example of the spacer 20*a* will be described below with reference to the drawings. FIG. 24 is a top view of a spacer 21*a* according to the first modified example of the spacer 20*a*. The spacer 21*a* is different from the spacer 20*a* in that the number of sets of through holes H1 arranged along the direction FD is different and the through-holes H1 are arranged along a direction TD, which is different from the direction FD and the direction SD.

As illustrated in FIG. 24, regarding plural through-holes H1 arranged along the direction FD, the pitch between adjacent through-holes H1 is uniform or substantially uniform, as viewed in the up-down direction of the multilayer body. In other words, regarding plural through-holes H1 arranged along the direction FD, the distance between the centroids of adjacent through-holes H1 is uniform or substantially uniform. For example, as shown in FIG. 24, the respective centroids of three through-holes H1 arranged along the direction FD will be set to the centroids G11, G12, and G13. The through-hole H1 having the centroid G11 and the through-hole H1 having the centroid G12 are adjacent to each other. The through-hole H1 having the centroid G12 and the through-hole H1 having the centroid G13 are adjacent to each other. In this case, as shown in FIG. 24, the distance D11 between the centroid G11 and the centroid G12 becomes equal or substantially equal to the distance D12 between the centroid G12 and the centroid G13.

As shown in FIG. 24, the spacer 21*a* includes five sets of through-holes H1 arranged along the direction FD. The five sets include sets GL2, GLC2, GC2, GRC2, and GR2. As shown in FIG. 24, the sets GR2, GRC2, GC2, GLC2, and GL2 are arranged in this order from the right to the left. The plural through-holes H1 in the set GL2 will be referred to as the "plural through-holes HL2". The plural through-holes H1 in the set GLC2 will be referred to as the "plural through-holes HLC2". The plural through-holes H1 in the set GC2 will be referred to as the "plural through-holes HC2". The plural through-holes H1 in the set GRC2 will be referred to as the "plural through-holes HRC2". The plural through-holes H1 in the set GR2 will be referred to as the "plural through-holes HR2". In this manner, the plural through-holes H1 are arranged in the spacer 21*a* in a matrix structure.

As illustrated in FIG. 24, a set of plural through-holes H1 is arranged along a direction different from the direction FD. For example, as shown in FIG. 24, plural through-holes H1 are arranged along the direction TD, which is a direction extending along the direction FD and extending along the direction SD (FIG. 4). That is, the direction TD includes a direction vector component of the direction FD and a direction vector component of the direction SD. When through-holes H1 are arranged along the direction TD, the acute angle θ1 between the direction TD and the direction FD can be defined. Through-holes H1 in the sets GR2, GRC2, GC2, GLC2, and GL2 are arranged along the direction TD. The extending direction of the direction TD shown in FIG. 24 is only an example. It is not necessary that the direction TD is a direction extending along the direction FD and extending along the direction SD.

Regarding plural through-holes H1 arranged along the direction TD, the pitch between adjacent through-holes H1 is uniform or substantially uniform. In other words, regarding plural through-holes H1 arranged along the direction TD, the distance between the centroids of adjacent through-holes H1 is uniform or substantially uniform. More specifically, as shown in FIG. 24, the respective centroids of three through-holes H1 arranged along the direction TD will be set to the centroids G14, G15, and G16. The through-hole H1 having the centroid G14 and the through-hole H1 having the centroid G15 are adjacent to each other. The through-hole H1 having the centroid G15 and the through-hole H1 having the centroid G16 are adjacent to each other. In this case, as shown in FIG. 24, the distance D13 between the centroid G14 and the centroid G15 becomes equal or substantially equal to the distance D14 between the centroid G15 and the centroid G16.

Advantages of Spacer 21*a*

The spacer 21*a* can easily bend. This circumstance will be explained more specifically below. The spacer 21*a* includes plural sets of through-holes H1, each set including plural through-holes H1, arranged along the direction TD. That is, the spacer 21*a* includes a larger number of through-holes H1. With this arrangement, when the spacer 21*a* is bent, the corners of the spacer 21*a* are likely to overlap through-holes H1 as viewed in the up-down direction of the multilayer body. The spacer 21*a* can thus easily bend.

Modified Example of Spacer 21*a*

Figure 25:
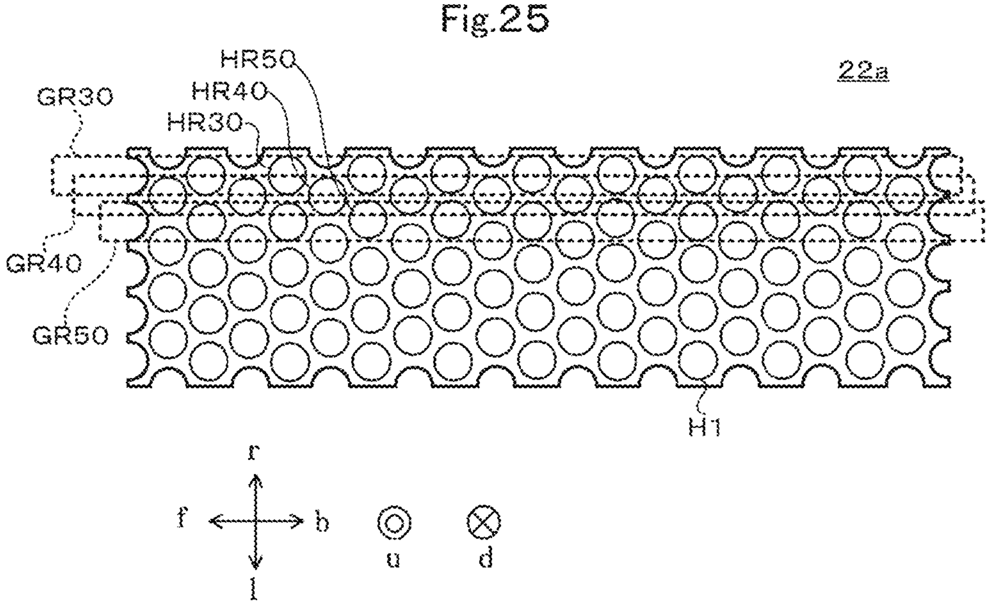
FIG. 25 is a top view of a spacer according to a modified example of the spacer.
Figure 26:
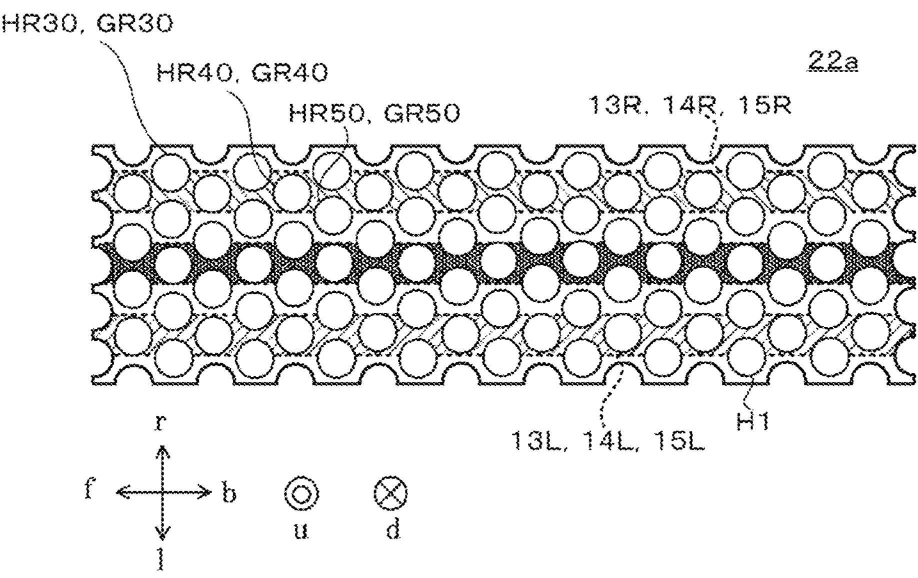
FIG. 26 is a top view of the spacer, a signal conductive layer, ground conductive layers, and ground conductive layers.

A modified example of the spacer 21*a* will be described below with reference to the drawings. FIG. 25 is a top view of a spacer 22*a* according to a modified example of the spacer 21*a*. FIG. 26 is a top view of the spacer 22*a*, signal conductive layer SL, ground conductive layers 13R, 14R, and 15R, ground conductive layers 13L, 14L, and 15L, and conductive member C. The signal conductive layer SL, ground conductive layers 13R, 14R, and 15R, and ground conductive layers 13L, 14L, and 15L are seen through in FIG. 26.

The spacer 22*a* is different from the spacer 21*a* in the arrangement of through-holes disposed along the direction FD. The arrangement of the through-holes H1 of the spacer 22*a* will be described more specifically. In the spacer 22*a*, plural sets of through-holes H1 arranged along the direction FD are defined. Through-holes H1 of a certain set (hereinafter called a first set) overlap those of another set, which is different from the first set, as viewed in the front-back direction (direction FD) of the multilayer body.

This configuration will be described in greater detail below. As shown in FIG. 25, in the spacer 22*a*, plural sets of through-holes arranged in the front-back direction of the multilayer body can be defined. For example, as shown in FIG. 25, sets GR30, GR40, and GR50 of through-holes arranged in the left-right direction of the multilayer body can be defined. The sets GR30, GR40, and GR50 are arranged toward the left direction of the multilayer body in this order. The through-holes of the set GR30 will be called the through-holes HR30. The through-holes of the set GR40 will be called the through-holes HR40. The through-holes of the set GR50 will be called the through-holes HR50.

In this case, as illustrated in FIG. 25, the through-holes HR40 overlap the through holes HR30 and HR50, as viewed in the front-back direction of the multilayer body. Similarly, as shown in FIG. 25, the through-holes HR30 overlap the through-holes HR40, as viewed in the front-back direction of the multilayer body. Similarly, as shown in FIG. 25, the through-holes HR50 overlap the through-holes HR40, as viewed in the front-back direction of the multilayer body.

Advantages of Spacer 22*a*

Using the spacer 22*a* can reduce or prevent the possibility that the characteristic impedance of a multilayer substrate deviates from a desired characteristic impedance. This circumstance will be explained in greater detail. A larger number of through-holes H1 overlap the signal conductive layer SL and the ground conductive layers 13R and 13L as seen from the up-down direction of the multilayer body. This will be described more specifically. In the spacer 22*a* shown in FIG. 26, the through-holes HR30 of the set GR30, the through-holes HR40 of the set GR40, and the through-holes HR50 of the set GR50 overlap the ground conductive layers 13R, 14R, and 15R, as seen from the up-down direction of the multilayer body. Similarly, in the spacer 22*a* shown in FIG. 26, plural sets of through-holes H1 overlap the signal conductive layer SL. Similarly, in the spacer 22*a* shown in FIG. 26, plural sets of through-holes H1 overlap the ground conductive layers 13L, 14L, and 15L. With this configuration, when the spacer 22*a* is stacked on the insulating layer 13*a*, even if the stacking position of the spacer 22*a* on the insulating layer 13*a* is displaced, the total area of the through-holes H1 that overlap the signal conductive layer SL and the ground conductive layers 13R and 13L as viewed in the up-down direction of the multilayer body is unlikely to change. It is thus possible to reduce the possibility that the characteristic impedance of a multilayer substrate including the spacer 22*a* will deviate from a predetermined characteristic impedance.

Second Modified Example of Spacer 20*a*

Figure 27:
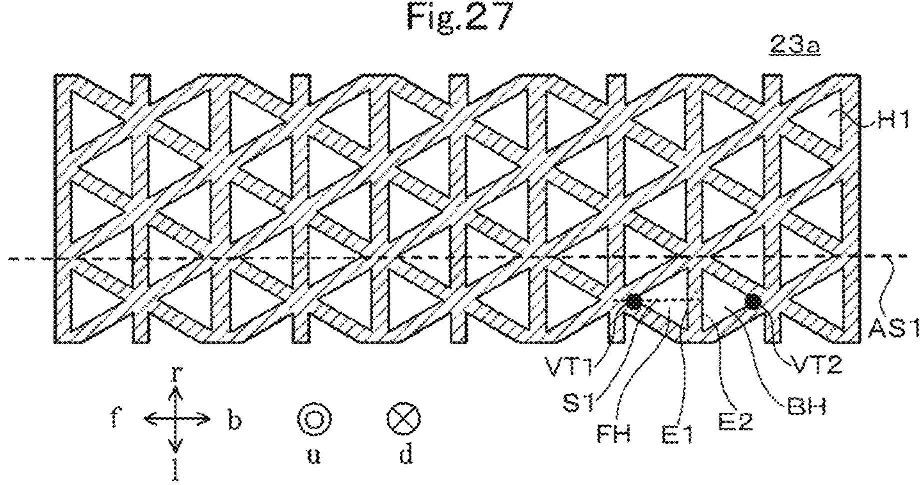
FIG. 27 is a top view of a spacer according to a second modified example of the spacer.
Figure 28:
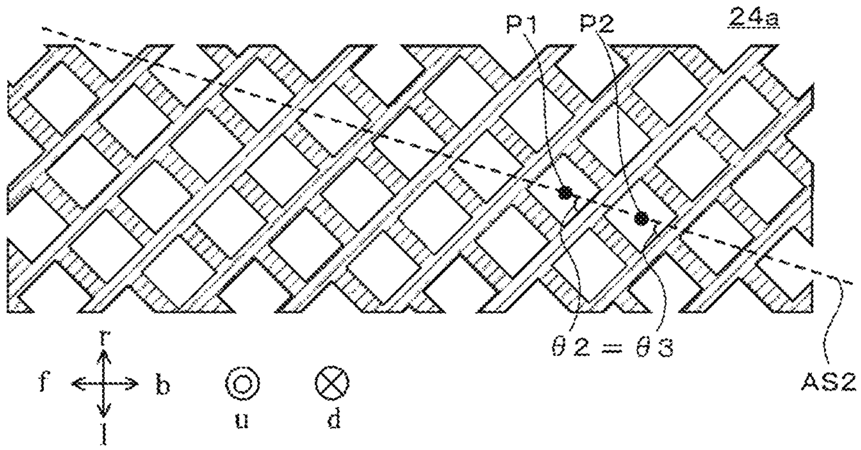
FIG. 28 is a top view of a spacer according to the second modified example of the spacer.
Figure 29:
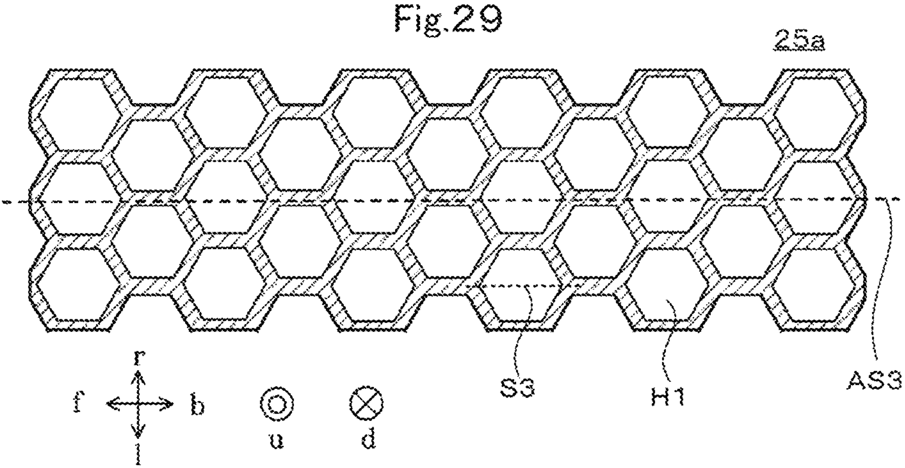
FIG. 29 is a top view of a spacer according to the second modified example of the spacer.

A second modified example of the spacer 20*a* will be described below with reference to the drawings. FIG. 27 is a top view of a spacer 23*a* according to the second modified example of the spacer 20*a*. FIG. 28 is a top view of a spacer 24*a* according to the second modified example of the spacer 20*a*. FIG. 29 is a top view of a spacer 25*a* according to the second modified example of the spacer 20*a*. In FIGS. 27, 28, and 29, the spacers 23*a*, 24*a*, and 25*a* are indicated by respective dot patterns.

The spacers 23*a*, 24*a*, and 25*a* are different from the spacer 20*a* in that the shapes of the through-holes H1 (FIG. 27) are different from the through-holes H1 of the spacer 20*a*. More specifically, the shape of the through-holes H1 of the spacer 20*a* is circular or substantially circular as viewed in the up-down direction of the multilayer body, while the shapes of the through-holes H1 of the spacers 23*a*, 24*a*, and 25*a* are regular polygons as viewed in the up-down direction of the multilayer body. In other words, the shape of the through-holes H1 on the top surface and the bottom surface of each of the spacers 23*a*, 24*a*, and 25*a* is a regular polygon having symmetry properties.

For example, as shown in FIG. 27, the shape of the through-holes H1 of the spacer 23*a* as viewed in the up-down direction of the multilayer body is an equilateral triangle or substantially equilateral triangle. In other words, the shape of the through-holes H1 on the top surface and the bottom surface of the spacer 23*a* is an equilateral triangle or substantially equilateral triangle.

Similarly, as shown in FIG. 28, the shape of the through-holes H1 of the spacer 24*a* as viewed in the up-down direction of the multilayer body is a square or substantially a square. In other words, the shape of the through-holes H1 on the top surface and the bottom surface of the spacer 24*a* is a square or substantially a square.

Similarly, as shown in FIG. 29, the shape of the through-holes H1 of the spacer 25*a* as viewed in the up-down direction of the multilayer body is a regular hexagon. In other words, the shape of the through-holes H1 on the top surface and the bottom surface of the spacer 25*a* is a regular hexagon.

The length of the side (the length of one side of a polygon) of each of the through-holes H1 having a regular polygonal shape of the spacers 23*a*, 24*a*, and 25*a* is smaller than the width of the signal conductive layer SL in the left-right direction of the multilayer body.

The length of the side of each of the through-holes H1 having a regular polygonal shape of the spacers 23*a*, 24*a*, and 25*a* is larger than the thickness of the spacers 22*a*, 23*a*, and 24*a* in the up-down direction of the multilayer body.

The through-holes H1 having a regular polygonal shape have symmetry properties as viewed in the up-down direction of the multilayer body. More specifically, the regular polygons of the through-holes H1 have line-symmetry properties or point-symmetry properties.

A regular polygon having line-symmetry properties will be described below in greater detail. For example, as shown in FIG. 27, the through-hole H1 having an equilateral triangular shape in the spacer 23*a* is line-symmetrical with respect to the axis of symmetry S1. As shown in FIG. 27, the axis of symmetry S1 connects a vertex VT1 of the equilateral triangle and an opposite side E1 of the vertex. A line AS1 extending along the signal conductive layer SL is set in the spacer 23*a*, as shown in FIG. 27. In this case, the axes of symmetry S1 of plural through-holes H1 arranged along the signal conductive layer SL are positioned on the line AS1.

As in the example in FIG. 27, the heading directions of the triangles positioned on the line AS1 may be different from each other. For instance, as illustrated in FIG. 27, the through-holes H1 positioned on the line AS1 include a through-hole FH whose triangular vertex VI1 is positioned farther frontward than the opposite side E1 in the front-back direction of the multilayer body and a through-hole BH whose triangular vertex VT2 is positioned farther backward than the opposite side E2 in the front-back direction of the multilayer body.

The heading directions of the triangles of all of the through-holes H1 may be the same. More specifically, the through-holes H1 positioned on the line AS1 may include only the through-holes FH. Similarly, the through-holes H1 positioned on the line AS1 may include only the through-holes BH.

Additionally, as shown in FIG. 29, when the shape of the through-holes H1 of the spacer 25*a* is a regular hexagon as seen in the up-down direction of the multilayer body, the through-holes H1 also have line-symmetry properties as seen in the up-down direction of the multilayer body. More specifically, as shown in FIG. 29, the through-hole H1 having a regular hexagonal shape is line-symmetrical with respect to the axis of symmetry S3.

In this case, a straight line AS3 extending along the signal conductive layer SL can be set in the spacer 25*a*. The axes of symmetry S3 of the plural through-holes H1 arranged along the signal conductive layer SL are positioned on the straight line AS3 extending along the signal conductive layer SL.

In FIG. 29, the axis of symmetry S3 is positioned on two opposing vertices of a regular hexagon. If the shape of the through-hole H1 is a regular hexagon, the axis of symmetry S3 may be located on the midpoint of one side and the midpoint of another side parallel or substantially parallel with each other of the regular hexagon.

A regular polygon having point-symmetry properties will be described below in greater detail. For example, as shown in FIG. 28, the through hole H1 having a square or substantially square shape in the spacer 24*a* is point-symmetrical with respect to a point of symmetry P1 (or P2). In this case, as shown in FIG. 28, the point of symmetry P1 of a through-hole H1 and the point of symmetry P2 of another through-hole H1 are positioned on a line AS2 extending along the signal conductive layer SL. In FIG. 28, the line AS2 is a straight line extending in the left-right direction of the multilayer body.

The angle, which is about 90° or smaller, between the line AS2 and the side of a regular polygon which intersects with the line AS2 as seen in the up-down direction of the multilayer body is set. In this case, the angle between the line AS2 and the side of a through-hole H1 intersecting with the line AS2 and the angle between the line AS2 and the side of another through-hole H1 intersecting with the line AS2 have the same or substantially the same angle.

For example, as shown in FIG. 28, in the through-hole H1 having the point P1 set as the point of symmetry, the angle θ2 between the straight line AS2 and the side intersecting with the line AS2 as seen in the up-down direction of the multilayer body is set. In the through-hole H1 having the point P2 set as the point of symmetry, the angle θ3 between the straight line AS2 and the side intersecting with the straight line AS2 as seen in the up-down direction of the multilayer body is also set. The degrees of the angles θ2 and 03 are about 90° or smaller and have the same degree of angle.

Advantages of Second Modified Example of Spacer 20*a*

Using the spacers 23*a*, 24*a*, and 25*a* can reduce the possibility of a breakage of the spacers 23*a*, 24*a*, and 25*a*. This circumstance will be explained more specifically below. The shapes of the through-holes H1 as seen in the up-down direction of the multilayer body are regular polygons having symmetry properties. In this case, the lengths of the portions of each of the spacers 23*a*, 24*a*, and 25*a* between the through-holes H1 are uniform. Thus, the strength of each of the spacers 23*a*, 24*a*, and 25*a* is not varied depending on the portion of each of the spacers 23*a*, 24*a*, and 25*a*. As a result, the spacers 23*a*, 24*a*, and 25*a* are unlikely to be broken.

In the spacers 23*a*, 24*a*, and 25*a* having through-holes of a regular polygonal shape, the through-holes H1 can be disposed in closer proximity with each other than the through-holes H1 (circular shape) of the spacer 20*a*. This is likely to enhance the void ratio of the spacers 23*a*, 24*a*, and 25*a* compared with the spacer 20*a*.

With the above-described configuration, even when the void ratio of the spacers 23*a*, 24*a*, and 25*a* and that of the spacer 20*a* are the same or substantially the same, the strength of the spacers 23*a*, 24*a*, and 25*a* becomes higher than that of the spacer 20*a*.

Using the spacer 25*a* can reduce the possibility of a breakage of the spacer 25*a*. More specifically, when the shape of through-holes are a regular hexagon, the angle of the through-holes H1 is an obtuse angle. The corners of the through-holes H1 are less likely to be broken when pressure is applied thereto. It is thus possible to reduce the possibility of a breakage of the spacer 25*a*.

Using the spacer 25*a* is likely to improve the void ratio. This will be explained below by comparing the spacer 25*a* including through-holes H1 having a regular hexagonal shape with a spacer including through-holes H1 having a regular pentagonal shape (regular pentagon having obtuse angles). Hereinafter, such a spacer will be referred to as a third comparative example. In the third comparative example in which the angles of a regular pentagon are obtuse angles, the spacer can still be less likely to be broken, as in the spacer 25*a*. In the third comparative example, however, it is not possible to dispose the through-holes H1 in close proximity with each other. In contrast, when the shape of the through-holes H1 is a regular hexagon, the through-holes H1 can be disposed in close proximity with each other. The void ratio of the spacer 25*a* can be improved over the entire spacer 25*a*. Since the entire spacer 25*a* has a high void ratio, the void ratio of the spacer 25*a* is unlikely to vary depending on the portion of the spacer 25*a*. As a result, a range of variations of the void ratio of a multilayer substrate including the spacer 25*a* becomes small.

Using the spacers 23*a*, 24*a*, and 25*a* can reduce the possibility that the through-holes H1 are closed. This will be explained more specifically below. The length of the sides of a regular polygon of the through-hole H1 is larger than the thickness of the spacers 23*a*, 24*a*, and 25*a* in the up-down direction of the multilayer body. That is, the size of the through-holes H1 with respect to the thickness of the spacers 23*a*, 24*a*, and 25*a* can be increased. Thus, when the spacers 23*a*, 24*a*, and 25*a* are bent, for example, the through-holes H1 are unlikely to be closed.

The multilayer substrate 10 (FIGS. 1-3) including any of the spacers 23*a*, 24*a*, and 25*a* (FIGS. 27-29) can reduce the possibility that the characteristic impedance of the signal conductive layer SL will deviate. This will be explained more specifically below. The length of the sides of a regular polygon of the through-hole H1 is smaller than the width R2 (FIG. 5) of the signal conductive layer SL in the left-right direction of the multilayer body. In this case, the distance between the through-holes HCC that overlap the signal conductive layer SL as seen in the up-down direction of the multilayer body and the through-holes HGR that overlap the ground conductive layer 13R as seen in the up-down direction of the multilayer body becomes larger. Accordingly, as illustrated in FIG. 5, the distance between the through-holes HCC and the conductive members CR provided in the through-holes HGR becomes larger, as seen in the up-down direction of the multilayer body. With this arrangement, for example, even when the conductive member CR leaks from the through-hole HGR, the leaked conductive member CR is less likely to enter the through-hole HCC. Similarly, even when the conductive member CL leaks from the through-hole HGL, the leaked conductive member CL is less likely to enter the through-hole HCC. This can reduce the possibility that the conductive member CR having leaked from the through-hole HGR and the conductive member CL having leaked from the through-hole HGL will cause a deviation of the characteristic impedance of the signal conductive layer SL of the multilayer substrate 10.

In the multilayer substrate 10 including any of the spacers 23*a*, 24*a*, and 25*a*, it is possible to reduce a deviation of the characteristic impedance of the signal conductive layer SL. This will be explained more specifically below. The length of each side of a regular polygon of the through-hole H1 is smaller than the distance between the right edge of the signal conductive layer SL and the left edges of the ground conductive layers 13R, 14R, and 15R in the left-right direction of the multilayer body. The length of each side of a regular polygon of the through-hole H1 is smaller than the distance between the left edge of the signal conductive layer SL and the right edges of the ground conductive layers 13L, 14L, and 15L in the left-right direction of the multilayer body. With this arrangement, no through-hole H1 overlaps both of the signal conductive layer SL and the ground conductive layers 13R and 13L, as viewed in the up-down direction of the multilayer body. Thus, the conductive members C connected to the ground conductive layer 13R or 13L are less likely to approach the signal conductive layer SL. As a result, the multilayer substrate 10 can reduce a deviation of the characteristic impedance of the signal conductive layer SL.

Third Modified Example of Spacer 20*a*

Figure 30:
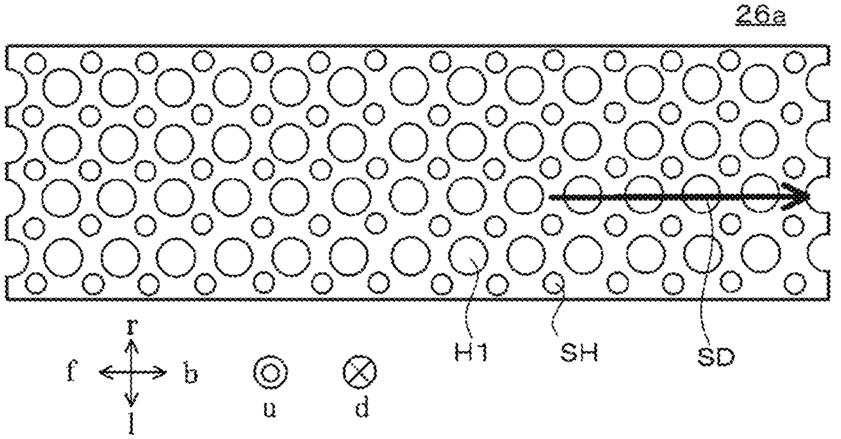
FIG. 30 is a top view of a spacer according to a third modified example of the spacer.

A modified example of the spacer 20*a* will be described below with reference to the drawings. FIG. 30 is a top view of a spacer 26*a* according to a third modified example of the spacer 20*a*.

The spacer 26*a* is different from the spacer 20*a* in that through-holes having a shape different from the through-holes H1 are provided.

As shown in FIG. 30, through-holes having a shape different from the through-holes H1 (hereinafter through-holes having a different shape will be called sub-through-holes SH) are provided in the spacer 26*a*. The sub-through-holes SH pass through the spacer 26*a* in the up-down direction of the multilayer body.

As shown in FIG. 30, the diameter of the sub-through-holes SH is smaller than that of the through-holes H1.

The sub-through-holes SH of the spacer 26*a* are located at positions at which they do not overlap the through-holes H1 of the spacer 26*a*. For example, in FIG. 30, a sub-through-hole SH of the spacer 26*a* is located at a position surrounded by four through-holes H1 as viewed in the up-down direction of the multilayer body.

As shown in FIG. 30, the plural sub-through-holes SH are arranged along the direction SD. As in the through-holes H1, regarding plural sub-through-holes H1, the pitch between adjacent sub-through-holes SH is uniform or substantially uniform. In other words, regarding plural sub-through-holes SH, the distance between the centroids of adjacent sub-through-holes SH is uniform or substantially uniform.

The shape of the sub-through-holes SH of the spacer 26*a* may be other than a circle or a substantial circle (for example, may be a polygon).

Advantages of Third Modified Example of Spacer 20*a*

Using the spacer 26*a* can reduce the transmission loss of a radio-frequency signal transmitted through the multilayer substrate 10. This will be explained in greater detail below. The spacer 26*a* includes sub-through-holes SH having a shape different from the through-holes H1. That is, with the sub-through-holes SH, more through-holes filled with air can be provided in the spacer. The void ratio of the multilayer substrate 10 including the spacer 26*a* can thus be increased. Increasing the void ratio of the multilayer substrate 10 can reduce the transmission loss of a radio-frequency signal transmitted through the multilayer substrate 10.

Other Preferred Embodiments

The multilayer substrates according to the present invention are not restricted to the multilayer substrates 10, 10*a* through 10*r*, 10*a*2, 10*c*2, 10*d*2, 11, 100, and 100*e* according to preferred embodiments. The multilayer substrates 10, 10*a* through 10*r*, 10*a*2, 10*c*2, 10*d*2, 11, 100, and 100*e* may be changed within the scope and spirit of the present invention. The configurations of the multilayer substrates 10, 10*a* through 10*r*, 10*a*2, 10*c*2, 10*d*2, 11, 100, and 100*e* may be combined in a desired manner.

Figure 31:
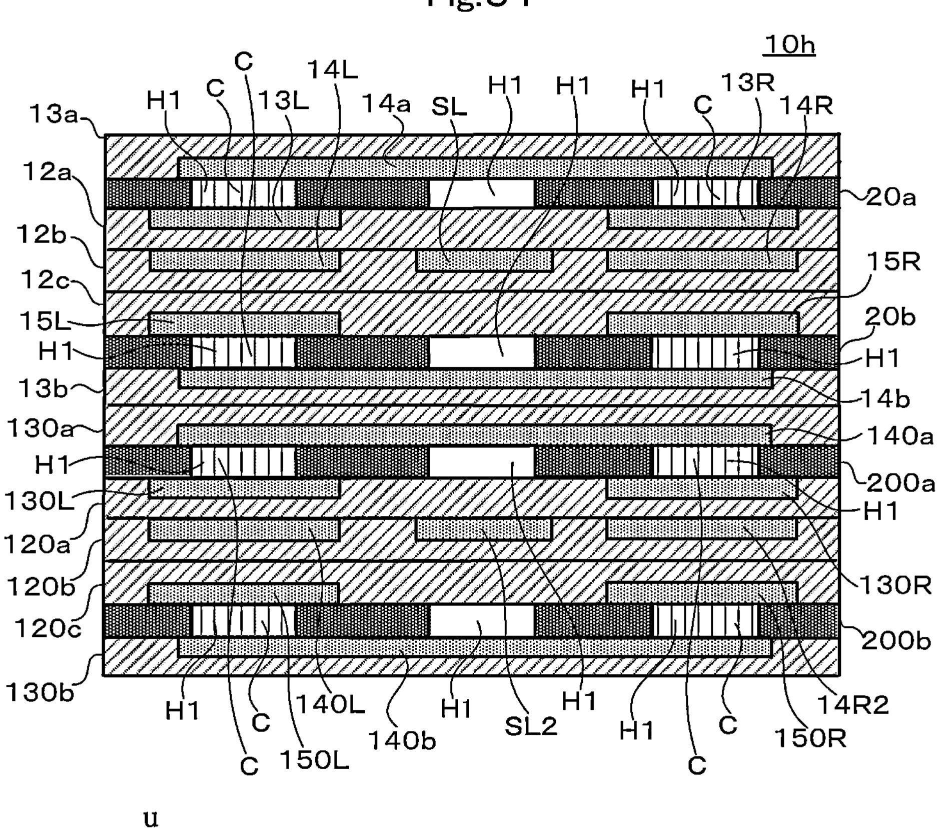
FIG. 31 is a sectional view of a multilayer substrate according to another preferred embodiment of the present invention taken along line A-A in FIG. 1.

A multilayer substrate 10*h* according to another preferred embodiment of the present invention will be described below with reference to FIG. 31. FIG. 31 is a sectional view of the multilayer substrate 10*h* according to another preferred embodiment taken along line A-A (FIG. 1).

In one example, as illustrated in FIG. 31, the multilayer substrate 10*h* may have a structure in which plural multilayer substrates are superimposed on each other in the up-down direction of the multilayer body. In the multilayer substrate 10*h*, two multilayer substrates are superimposed on each other. In the multilayer substrate 10*h*, three or more multilayer substrates may be superimposed on each other. More specifically, as illustrated in FIG. 3, the multilayer substrate 10*h* additionally includes insulating layers 120*a*, 120*b*, 120*c*, 130*a*, and 130*b*, ground conductive layers 140*a*, 140*b*, 130R, 130L, 140R, 140L, 150R, and 150L, a signal conductive layer SL2, and spacers 200*a* and 200*b*.

Figure 32:
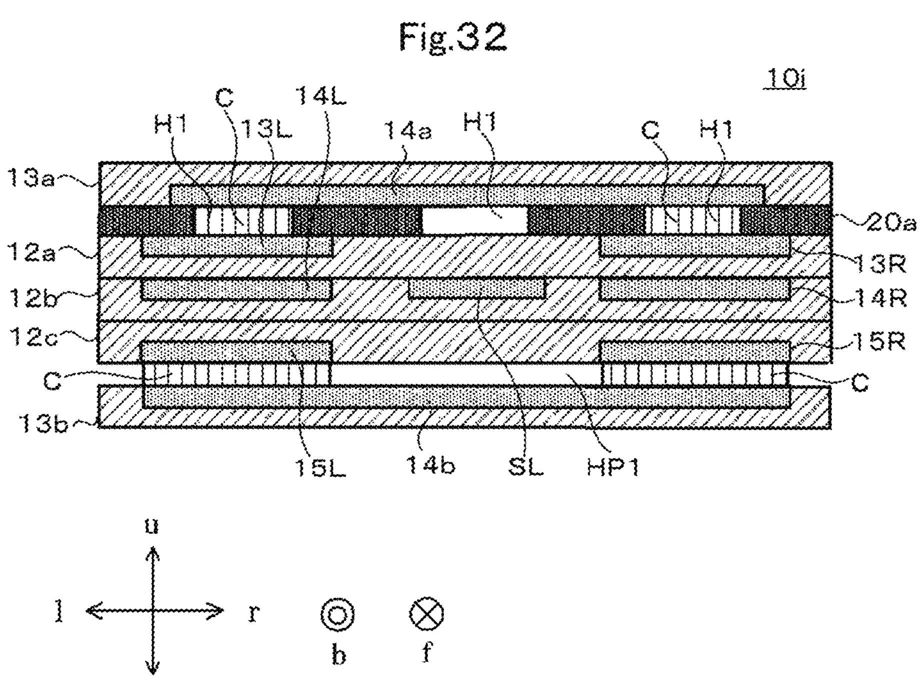
FIG. 32 is a sectional view of a multilayer substrate according to another preferred embodiment of the present invention taken along line A-A in FIG. 1.

A multilayer substrate 10*i* according to another preferred embodiment of the present invention will be described below with reference to FIG. 32. FIG. 32 is a sectional view of the multilayer substrate 10*i* according to another preferred embodiment taken along line A-A (FIG. 1).

In one example, as illustrated in FIG. 32, a multilayer substrate may be the multilayer substrate 10*i* including conductive members C instead of the spacer 20*b*. In this case, because of the thickness of the conductive members C in the up-down direction of the multilayer body, the multilayer substrate 10*i* becomes thicker in the up-down direction of the multilayer body. A hollow portion HP1 filled with air is provided in the multilayer substrate 10*i*, as shown in FIG. 32. The conductive members C, which are used instead of the spacer 20*b*, are made of a solder, for example.

Figure 33:
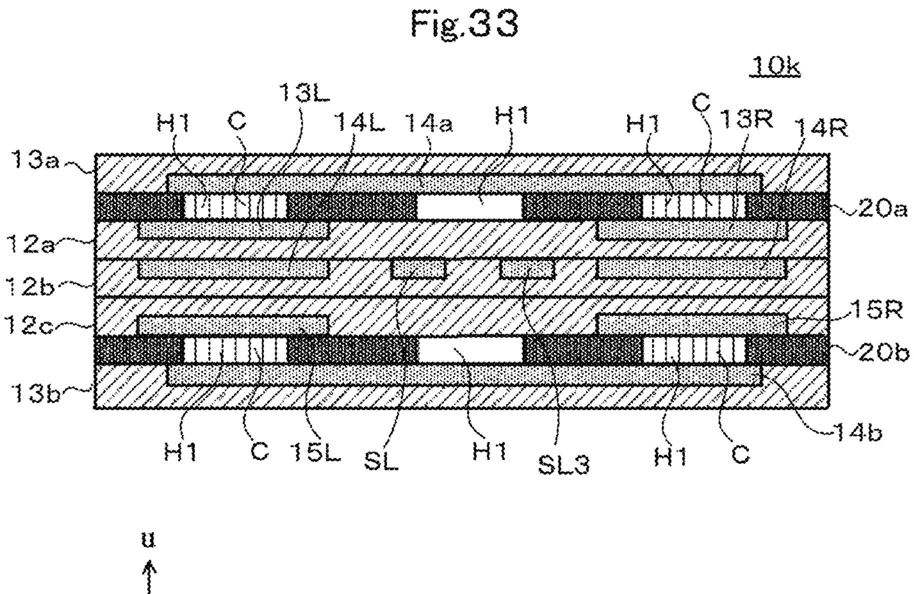
FIG. 33 is a sectional view of a multilayer substrate according to another preferred embodiment of the present invention taken along line A-A in FIG. 1.

A multilayer substrate 10*k* according to another preferred embodiment of the present invention will be described below with reference to FIG. 33. FIG. 33 is a sectional view of the multilayer substrate 10*k* according to another preferred embodiment taken along line A-A (FIG. 1).

In one example, as illustrated in FIG. 33, a multilayer substrate may be the multilayer substrate 10*k* further including a signal conductive layer SL3. That is, the multilayer substrate 10*k* includes the signal conductive layer SL and the signal conductive layer SL3. The signal conductive layer SL and the signal conductive layer SL3 are positioned farther rightward than the ground conductive layer 14L. The signal conductive layer SL and the signal conductive layer SL3 are positioned farther leftward than the ground conductive layer 14R. The signal conductive layer SL and the signal conductive layer SL3 are sequentially arranged in the left-right direction of the multilayer body. In other words, the multilayer substrate 10*k* includes differential lines defined by the signal conductive layer SL and the signal conductive layer SL3.

Figure 34:
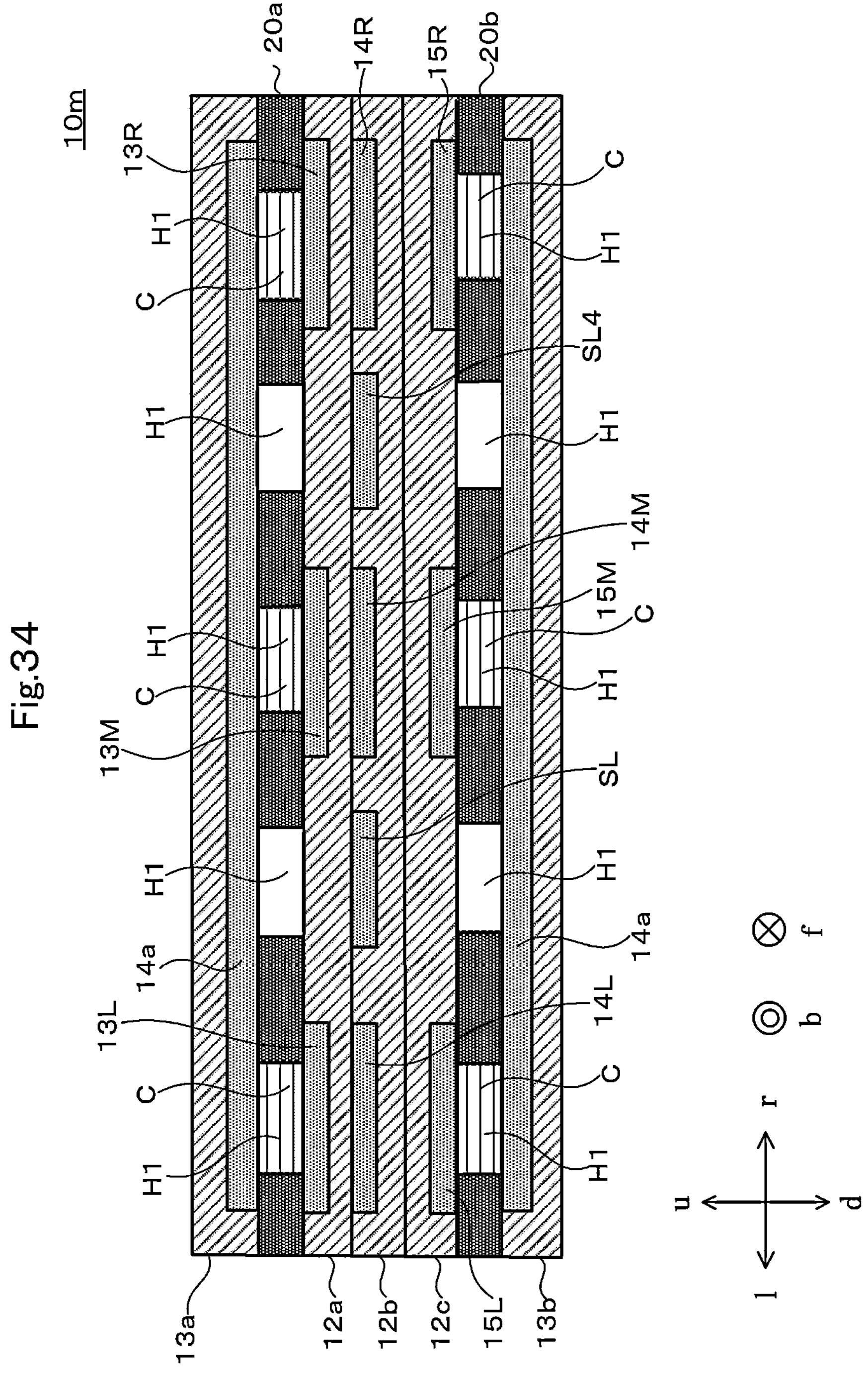
FIG. 34 is a sectional view of a multilayer substrate according to another preferred embodiment of the present invention taken along line A-A in FIG. 1.

A multilayer substrate 10*m* according to another preferred embodiment of the present invention will be described below with reference to FIG. 34. FIG. 34 is a sectional view of the multilayer substrate 10*m* according to another preferred embodiment taken along line A-A (FIG. 1).

In one example, as illustrated in FIG. 34, a multilayer substrate may be the multilayer substrate 10*m* further including a transmission line in the left-right direction of the multilayer body. In this case, the multilayer substrate 10*m* becomes longer than the multilayer substrate 10 in the left-right direction of the multilayer body. The multilayer substrate 10*m* includes a signal conductive layer SL4 and ground conductive layers 13M, 14M, and 15M. The ground conductive layers 13L, 14L, and 15L, signal conductive layer SL, ground conductive layers 13M, 14M, and 15M, signal conductive layer SL4, and ground conductive layers 13R, 14R, and 15R are arranged in this order in the left-right direction of the multilayer body. In other words, the multilayer substrate 10*m* includes multiple lines, which are arranged in the left-right direction of the multilayer body, to transmit a radio-frequency signal therethrough.

Figure 35:
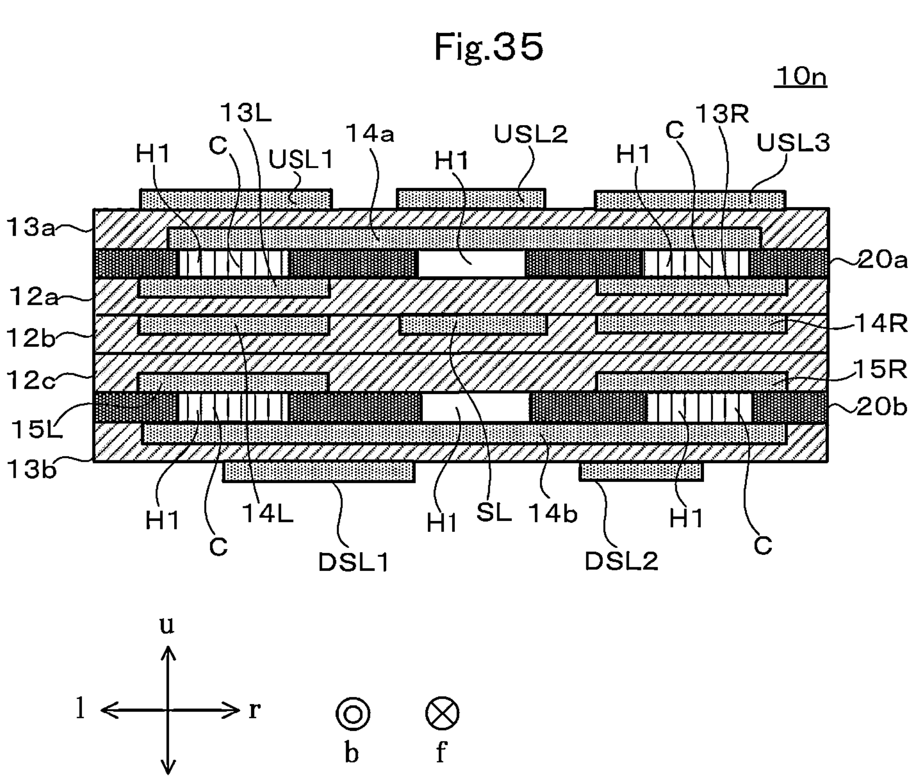
FIG. 35 is a sectional view of a multilayer substrate according to another preferred embodiment of the present invention taken along line A-A in FIG. 1.

A multilayer substrate 10*n* according to another preferred embodiment of the present invention will be described below with reference to FIG. 35. FIG. 35 is a sectional view of the multilayer substrate 10*n* according to another preferred embodiment taken along line A-A (FIG. 1).

In one example, as in the multilayer substrate 10*n* shown in FIG. 35, desired wiring pattern layers defining circuits may be provided outside regions shielded by the ground conductive layers 14*a* and 14*b*. For example, as illustrated in FIG. 35, the multilayer substrate 10*n* includes wiring pattern layers USL1, USL2, and USL3 above the insulating layer 13*a* and wiring pattern layers DSL1 and DSL2 below the insulating layer 13*b*. In FIG. 35, the wiring pattern layers USL1, USL2, and USL3 are arranged in this order towards the right direction of the multilayer body. In FIG. 35, the wiring pattern layers DSL1 and DSL2 are arranged in this order towards the right direction of the multilayer body. In the multilayer substrate 10*n*, the number of wiring pattern layers, the width of the wiring pattern layers in the left-right direction of the multilayer body, and the height of the wiring pattern layers in the up-down direction of the multilayer body, for example, can be determined as desired. Examples of the wiring pattern layers are ground patterns, signal patterns, and antenna patterns.

Figure 36:
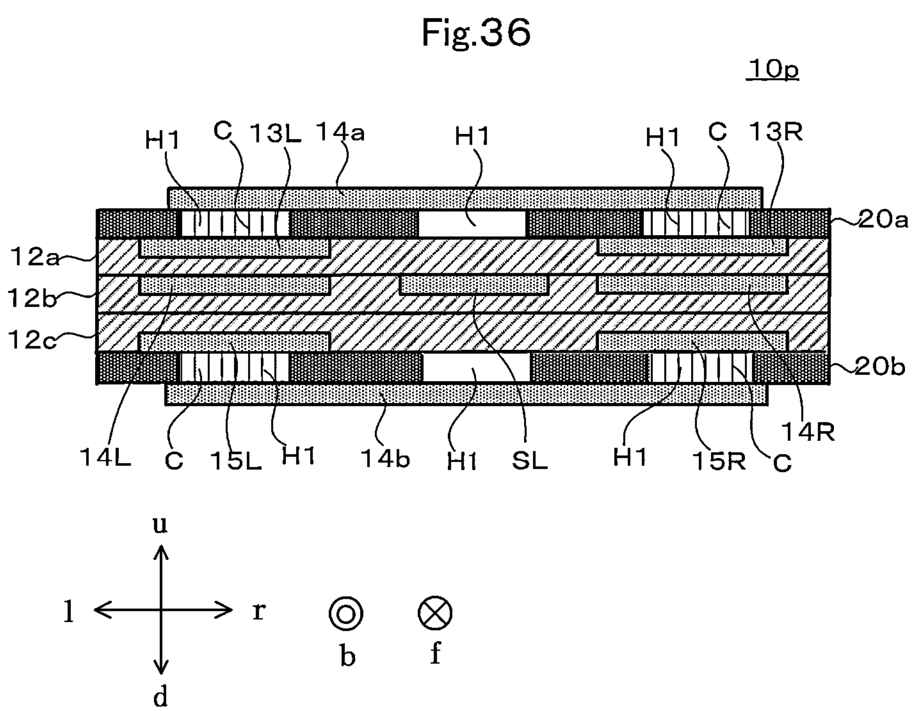
FIG. 36 is a sectional view of a multilayer substrate according to another preferred embodiment of the present invention taken along line A-A in FIG. 1.

A multilayer substrate 10*p* according to another preferred embodiment of the present invention will be described below with reference to FIG. 36. FIG. 36 is a sectional view of the multilayer substrate 10*p* according to another preferred embodiment taken along line A-A (FIG. 1).

As illustrated in FIG. 36, a multilayer substrate may be the multilayer substrate 10*p* without the insulating layers 13*a* and 13*b*. Without the insulating layers 13*a* and 13*b*, the multilayer substrate 10*p* can be manufactured at lower cost. In the multilayer substrate 10*p*, the spacer 20*a* and the ground conductive layer 14*a* are formed by processing, such as transferring of a copper foil cladded to a carrier film, for example.

Figure 37:
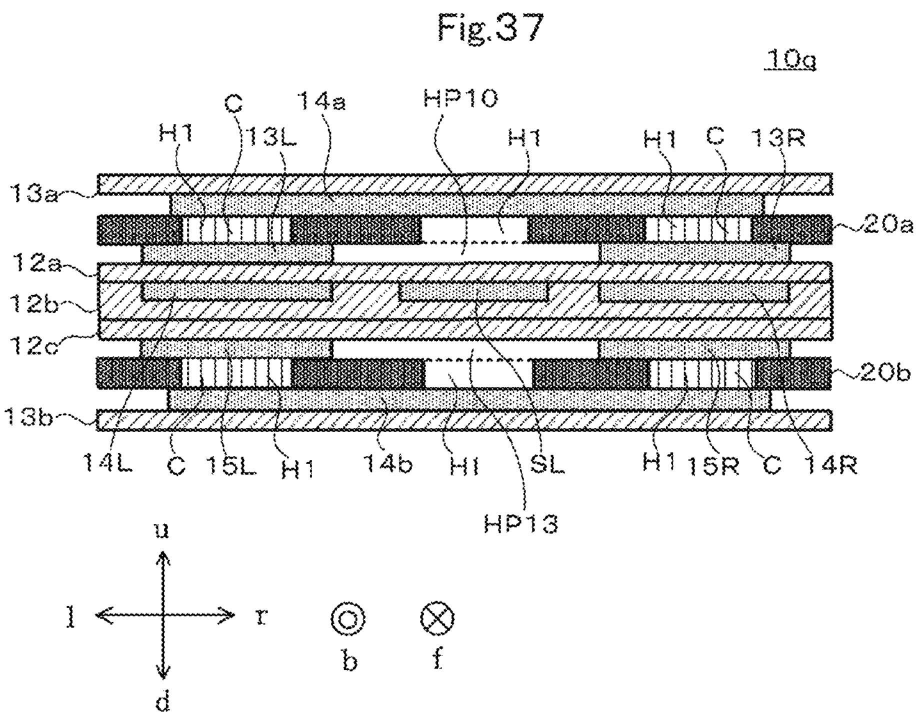
FIG. 37 is a sectional view of a multilayer substrate according to another preferred embodiment of the present invention taken along line A-A in FIG. 1.
Figure 38:
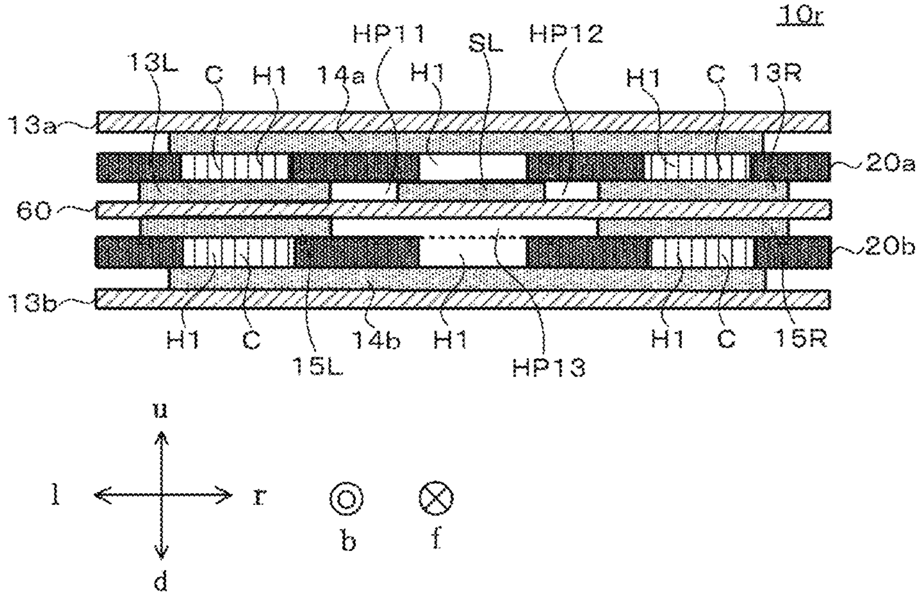
FIG. 38 is a sectional view of a multilayer substrate according to another preferred embodiment of the present invention taken along line A-A in FIG. 1.

Multilayer substrates 10*q* and 10*r* according to other preferred embodiments of the present invention will be described below with reference to FIGS. 37 and 38. FIG. 37 is a sectional view of the multilayer substrate 10*q* according to another preferred embodiment taken along line A-A (FIG. 1). The multilayer substrate 10*q* is a modified example of the multilayer substrate 10. FIG. 38 is a sectional view of the multilayer substrate 10*r* according to another preferred embodiment taken along line A-A (FIG. 1). The multilayer substrate 10*r* is a modified example of the multilayer substrate 10*b*.

As illustrated in FIG. 37, it is not necessary that the electrode layers (ground conductive layers 14*a*, 14*b*, 13R, 13L, 14R, 14L, 15R, and 15L and signal conductive layer SL) of a multilayer substrate are embedded in insulating layers. More specifically, as shown in FIG. 37, in the multilayer substrate 10*q*, electrode layers are not embedded in the insulating layers 13*a*, 13*b*, 12*a*, 12*b*, and 12*c*. In other words, in the multilayer substrate 10*q*, the insulating layers 13*a*, 13*b*, 12*a*, 12*b*, and 12*c* are not provided for electrode layers in the direction extending from the right edges and the left edges of electrode layers. For example, the insulating layer 12*a* is not provided for the ground conductive layers 13R and 13L in the direction extending from the right edges and the left edges of the ground conductive layers 13R and 13L.

In the multilayer substrate 10*q*, more regions filled with air are provided. For example, a hollow portion HP10 filled with air is provided between the ground conductive layers 13R and 13L. Similarly, a hollow portion HP13 filled with air is provided between the ground conductive layers 15R and 15L.

In the multilayer substrate 10*q*, more regions (hollow portions HP10 and HP13, for example) filled with air, which has a low dielectric constant, are provided. The multilayer substrate 10*q* can thus reduce the dielectric loss of a signal.

In a manner similar to the multilayer substrate 10*q*, as illustrated in FIG. 38, it is not necessary that the electrode layers (ground conductive layers 14*a*, 14*b*, 13R, 13L, 15R, and 15L and signal conductive layer SL) of the multilayer substrate 10*r* are embedded in insulating layers 13*a* and 60. In this case, as in the multilayer substrate 10*q*, hollow portions HP11, HP12, and HP13 are provided in the multilayer substrate 10*r*. The hollow portion HP11 is provided between the ground conductive layer 13L and the signal conductive layer SL, while the hollow portion HP12 is provided between the ground conductive layer 13R and the signal conductive layer SL. More regions defined by hollow portions are provided in the multilayer substrate 10*q*, and the dielectric loss of a signal in the multilayer substrate 10*r* can be reduced.

A bonding member made of a material having adhesiveness may be applied to (or attached to) the top main surfaces and the bottom main surfaces of the spacers 20*a* and 20*b*. In this case, the spacer 20*a* including the through-holes H1 and the insulating layers 13*a* and 12*a* are bonded to each other by an adhesive. This makes it difficult for the spacer 20*a* and the insulating layers 13*a* and 12*a* to separate from each other. Similarly, the spacer 20*b* including the through-holes H1 and the insulating layers 13*b* and 12*c* are bonded to each other by an adhesive. This configuration makes it difficult for the spacer 20*b* and the insulating layers 13*b* and 12*c* to separate from each other.

In the multilayer substrates 10, 10*a* through 10*r*, 10*a*2, 10*c*2, 10*d*2, 11, 100, and 100*e*, it is not necessary that the diameter of the through-holes H1 and the length of each side of the through-holes H1 are smaller than the width of the signal conductive layer SL in the left-right direction of the multilayer body.

The multilayer substrates 10, 10*a* through 10*r*, 10*a*2, 10*c*2, 10*d*2, 11, 100, and 100*e* may include only one of the spacers 20*a* and 20*b*.

In the multilayer substrates 10, 10*a* through 10*r*, 10*a*2, 10*c*2, 10*d*2, 11, 100, and 100*e*, the ground conductive layers 14R and 14L may be omitted.

In the multilayer substrates 10, 10*a* through 10*r*, 10*a*2, 10*c*2, 10*d*2, 11, 100, and 100*e*, it is not necessary that the diameter and the side length of the through-holes H1 in the left-right direction of the multilayer body is longer than the thickness of the spacers 20*a* and 20*b* in the up-down direction of the multilayer body.

In the multilayer substrates 10, 10*a* through 10*r*, 10*a*2, 10*c*2, 10*d*2, 11, 100, and 100*e*, it is not necessary that the diameter of the through-holes H1 and the length of each side of the through-holes H1 in the left-right direction of the multilayer body are smaller than the distance R4 between the right edge of the signal conductive layer SL and the left edges of the ground conductive layers 13R, 14R, and 15R in the left-right direction of the multilayer body. It is not necessary that the diameter and the side length of the through-holes H1 is smaller than the distance R5 between the left edge of the signal conductive layer SL and the right edges of the ground conductive layers 13L, 14L, and 15L in the left-right direction of the multilayer body.

In the multilayer substrates 10, 10*a* through 10*r*, 10*a*2, 10*c*2, 10*d*2, 11, 100, and 100*e*, it is not necessary that, regarding plural conductive members C arranged in the extending direction of the signal conductive layer SL, the distance between the centroids of adjacent conductive members C is uniform or substantially uniform.

In the multilayer substrates 10, 10*a* through 10*r*, 10*a*2, 10*c*2, 10*d*2, 11, 100, and 100*e*, it is not necessary that the sectional area of the through-holes H1 in a plane perpendicular or substantially perpendicular to the up-down direction of the multilayer body becomes larger as the through-hole H1 gets closer to the signal conductive layer SL.

In the multilayer substrates 10, 10*a* through 10*r*, 10*a*2, 10*c*2, 10*d*2, 11, 100, and 100*e*, it is not necessary that the material for the spacers 20*a* and 20*b* is the same as that of the insulating layers 12*a*, 12*b*, 12*c*, 13*a*, and 13*b*.

The material for the spacers 20*a* and 20*b* may be a material other than a thermoplastic resin, such as polyimide and liquid crystal polymer, for example.

The spacers 20*a* and 20*b* may be made of a material having a lower dielectric constant or a lower dissipation factor than the material for the insulating layers 12*a*, 12*b*, 12*c*, 13*a*, and 13*b*. For example, if the material for the insulating layers 12*a*, 12*b*, 12*c*, 13*a*, and 13*b* is polyimide, the material for the spacers 20*a* and 20*b* may be a fluorine resin, such as liquid crystal polymer or PTFE, for example. This can reduce the transmission loss of a radio-frequency signal transmitted through the multilayer substrates 10 and 10*a* through 10*n*.

The material for the spacers 20*a* and 20*b* may be a material (such as FR-4 or PTFE with glass) having a higher elastic modulus than the material for the insulating layers 12*a*, 12*b*, 12*c*, 13*a*, and 13*b*. In this case, the strength of the spacers 20*a* and 20*b* is enhanced and the through-holes H1 are thus unlikely to be deformed.

The material 1 for the spacers 20*a* and 20*b* may be a material having a lower elastic modulus than the material for the insulating layers 12*a*, 12*b*, 12*c*, 13*a*, and 13*b*. For example, if the material for the insulating layers 12*a*, 12*b*, 12*c*, 13*a*, and 13*b* is polyimide, the material for the spacers 20*a* and 20*b* may be a fluorine resin, such as liquid crystal polymer or PTFE, for example. In this case, the flexibility of the spacers 20*a* and 20*b* is enhanced. For example, the spacers 20*a* and 20*b* can be bent without being damaged.

The insulating layers of the multilayer substrates 10, 10*a* through 10*r*, 10*a*2, 10*c*2, 10*d*2, 11, 100, and 100*e* may be without through-holes.

The spacers 20*a*, 20*a*1, 20*b*, 21*a*, 22*a*, 23*a*, 24*a*, and 25*a* may include sub-through-holes SH having a shape different from the through-holes H1.

It is not necessary that the multilayer substrates 10, 10*a* through 10*r*, 10*a*2, 10*c*2, 10*d*2, 11, 100, and 100*e* include a curved section A2.

If the multilayer substrates 10, 10*a* through 10*r*, 10*a*2, 10*c*2, 10*d*2, 11, 100, and 100*e* include a curved section A2, the spacers 20*a* and 20*b* may be located outside the curved section A2.

It is not necessary that the multilayer substrates 10, 10*a* through 10*r*, 10*a*2, 10*c*2, 10*d*2, 11, 100, and 100*e* include a curved section B2.

If the multilayer substrates 10, 10*a* through 10*r*, 10*a*2, 10*c*2, 10*d*2, 11, 100, and 100*e* include a curved section B2, the spacers 20*a* and 20*b* may be located outside the curved section B2.

In the multilayer substrates 10, 10*a* through 10*r*, 10*a*2, 10*c*2, 10*d*2, 11, 100, and 100*e*, the spacers 20*a* and 20*b* may be located outside the mounting electrode units EP1 and EP2.

In the multilayer substrates 10, 10*a* through 10*r*, 10*a*2, 10*c*2, 10*d*2, 11, 100, and 100*e*, it is not necessary that plural spacers are adjacent to each other in the up-down direction of the multilayer body.

The shape of the through-holes H1 on the top surface and the bottom surface of each of the spacers 20*a* and 20*b* may be other than a circle, a substantial circle or a regular polygon.

The number of sets of plural through-holes H1 arranged along the direction FD is not restricted to three or five.

The plural through-holes HGR in the spacer 20*a* are not necessary. Similarly, the plural through-holes HGL in the spacer 20*a* are not necessary.

In this specification, the centroid is a geometric center. More specifically, the centroid in the specification is the center of a figure in a two-dimensional plane. The centroid of a through-hole H1 is determined in the following manner, for example. A plane which is perpendicular or substantially perpendicular to the up-down direction of the multilayer body and which is positioned between the top surface and the bottom surface of each of the spacers 20*a*, 20*b*, 20*a*1, 20*a*2, 20*b*2, 20*a*3, 20*b*3, 20*c*, 20*d*, 21*a*, 22*a*, 23*a*, 24*a*, 25*a*, and 26*a* (hereinafter, such a plane is called the "plane X") is defined. For example, the plane X positioned at the center (hereinafter called the "center Y") between the top surface and the bottom surface of each of the spacers 20*a*, 20*b*, 20*a*1, 20*a*2, 20*b*2, 20*a*3, 20*b*3, 20*c*, 20*d*, 21*a*, 22*a*, 23*a*, 24*a*, 25*a*, and 26*a* is defined. The portion of the through-hole H1 located on the plane X is set to be provided on a two-dimensional plane. In this case, the centroid of the through-hole H1 is the centroid of the portion of the through-hole H1 provided on the two-dimensional plane. Thus, if, for example, the shape of the through-hole H1 is circular or substantially circular as seen in the up-down direction of the multilayer body, the portion of the through-hole H1 located on the plane X is circular or substantially circular. In this case, the centroid of the through-hole H1 is the centroid of the circle on the plane X.

The distance between the centroids of through-holes H1 is measured in the following manner, for example. At the center Y, surfaces of the spacers 20*a*, 20*b*, 20*a*1, 20*a*2, 20*b*2, 20*a*3, 20*b*3, 20*c*, 20*d*, 21*a*, 22*a*, 23*a*, 24*a*, 25*a*, and 26*a* are cut in the direction perpendicular or substantially perpendicular to the up-down direction of the multilayer body. In this case, the cut surfaces of the spacers 20*a*, 20*b*, 20*a*1, 20*a*2, 20*b*2, 20*a*3, 20*b*3, 20*c*, 20*d*, 21*a*, 22*a*, 23*a*, 24*a*, 25*a*, and 26*a* are the plane X. On each cut surface, the centroids of adjacent through-holes H1 are measured. After the measurements of the centroids of the plural through-holes H1, the distance between the centroids of adjacent through-holes H1 is measured.

The plane X is not necessarily positioned at the center between the top surface and the bottom surface of each of the spacers 20*a*, 20*b*, 20*a*1, 20*a*2, 20*b*2, 20*a*3, 20*b*3, 20*c*, 20*d*, 21*a*, 22*a*, 23*a*, 24*a*, 25*a*, and 26*a*. The plane X may be located at any position between the top surface and the bottom surface of each of the spacers 20*a*, 20*b*, 20*a*1, 20*a*2, 20*b*2, 20*a*3, 20*b*3, 20*c*, 20*d*, 21*a*, 22*a*, 23*a*, 24*a*, 25*a*, and 26*a*.

Regarding the plural through-holes H1, the distance between the centroids of adjacent through-holes H1 in each of the spacers 20*a*, 20*b*, 20*a*1, 20*a*2, 20*b*2, 20*a*3, 20*b*3, 20*c*, 20*d*, 21*a*, 22*a*, 23*a*, 24*a*, 25*a*, and 26*a* is uniform but may be different within a range of manufacturing variations. For example, the distance D1 and the distance D2 are the same in FIG. 4 but may be different within a range of manufacturing variations. Similarly, the distance D3 and the distance D4 are the same in FIG. 4 but may be different within a range of manufacturing variations.

The manufacturing variations may be explained in the following manner, for example. Three adjacent through-holes H1 are set to first, second, and third through-holes. The first, second, and third through-holes are arranged in numerical order along the direction FD, for example. In this case, the distance between the first and second through-holes is set to be a first distance, while the distance between the second and third through-holes is set to be a second distance. The manufacturing variations are about 20% or lower of the average of the first distance and the second distance. For example, in FIG. 4, the through-hole H1 having the centroid G1, the through-hole H1 having the centroid G2, and the through-hole H1 having the centroid G3 are arranged in this order in the direction FD. In this case, for example, the distance between the back edge of the through-hole H1 having the centroid G1 and the front edge of the through-hole H1 having the centroid G2 is the first distance. Additionally, for example, the distance between the back edge of the through-hole H1 having the centroid G2 and the front edge of the through-hole H1 having the centroid G3 is the second distance. In FIG. 4, the manufacturing variations are about 20% or lower of the average of the distance between the back edge of the through-hole H1 having the centroid G1 and the front edge of the through-hole H1 having the centroid G2 and the distance between the back edge of the through-hole H1 having the centroid G2 and the front edge of the through-hole H1 having the centroid G3.

The manufacturing variations may be values based on first, second, and third through-holes arranged in the direction SD. For example, in FIG. 4, the through-hole H1 having the centroid G6, the through-hole H1 having the centroid G5, and the through-hole H1 having the centroid G4 are arranged in this order in the direction SD. In this case, for example, the distance between the left edge of the through-hole H1 having the centroid G6 and the right edge of the through-hole H1 having the centroid G5 is the first distance. Additionally, for example, the distance between the left edge of the through-hole H1 having the centroid G5 and the right edge of the through-hole H1 having the centroid G4 is the second distance. In this case, in FIG. 4, the manufacturing variations may be about 20% or lower of the average of the distance between the left edge of the through-hole H1 having the centroid G6 and the right edge of the through-hole H1 having the centroid G5 and the distance between the left edge of the through-hole H1 having the centroid G5 and the right edge of the through-hole H1 having the centroid G4.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
a multilayer body;
a plurality of layers stacked on each other in an up-down direction of the multilayer body; wherein
the plurality of layers include:
at least one insulating layer;
a first spacer;
a first ground conductive layer located above the first spacer in the up-down direction of the multilayer body; and
a signal conductive layer overlapping the first ground conductive layer and located below the first spacer, as viewed in the up-down direction of the multilayer body;
a plurality of first through-holes passing through the first spacer in the up-down direction of the multilayer body are provided in the first spacer;
a first direction that is parallel or substantially parallel with a first straight line extends along the first spacer, as viewed in the up-down direction of the multilayer body;
a second direction that is parallel or substantially parallel with a second straight line, which is not parallel with the first straight line, extends along the first spacer, as viewed in the up-down direction of the multilayer body;
at least two of the plurality of the first through-holes are adjacent to each other and arranged along the first direction as viewed in the up-down direction of the multilayer body;
a distance between centroids of the at least two of the plurality of first through-holes that are adjacent to each other and arranged along the first direction is uniform or substantially uniform as viewed in the up-down direction of the multilayer body;

the plurality of the first through-holes include a first plurality of sets of first through-holes in the first spacer;

the plurality of the first through-holes include a second plurality of sets of first through-holes arranged along the second direction;

at least three of the plurality of the first through-holes are adjacent to each other and arranged along the second direction as viewed in the up-down direction of the multilayer body;

a distance between centroids of the at least three of the plurality of first through-holes that are adjacent to each other and arranged along the second direction is uniform or substantially uniform as viewed in the up-down direction of the multilayer body; and at least one of the plurality of first through-holes is a first hollow through-hole overlapping the signal conductive layer as viewed in the up-down direction of the multilayer body.

2. The multilayer substrate according to claim 1, further comprising:

a second ground conductive layer located below the first spacer in the up-down direction of the multilayer body; and a plurality of first conductors provided in first through-holes among the plurality of the first through-holes provided in the first spacer and electrically connecting the first ground conductive layer and the second ground conductive layer to each other.

3. The multilayer substrate according to claim 2, wherein the first through-holes include a plurality of second through-holes in which the plurality of first conductors are provided;

at least three of the plurality of second through-holes are arranged along an extending direction of the signal conductive layer;

the at least three of the plurality of second through-holes are adjacent to each other and provided in the first spacer, as viewed in the up-down direction of the multilayer body; and a distance between centroids of the at least three of the plurality of second-through holes is uniform or substantially uniform.

4. The multilayer substrate according to claim 2, wherein the at least one insulating layer includes a third insulating layer located below the signal conductive layer and the second ground conductive layer in the up-down direction of the multilayer body; and a plurality of third through-holes passing through the third insulating layer in the up-down direction of the multilayer body are provided in the third insulating layer.

5. The multilayer substrate according to claim 4, wherein at least one of the plurality of the third through-holes overlaps the first hollow through-hole as viewed in the up-down direction of the multilayer body.

6. The multilayer substrate according to claim 2, wherein a direction which is perpendicular or substantially perpendicular to the up-down direction of the multilayer body and perpendicular or substantially perpendicular to an extending direction of the signal conductive layer is defined as a left-right direction of the multilayer body;

a diameter of the first through-holes is smaller than a distance between a right edge of the signal conductive layer and a left edge of the second ground conductive layer in the left-right direction of the multilayer body and is smaller than a distance between a left edge of the signal conductive layer and a right edge of the first ground conductive layer in the left-right direction of the multilayer body; and when a shape of the first through-holes on a top surface and a bottom surface of the first spacer is a regular polygon, a length of a side of the regular polygon of each of the first through-holes is smaller than the distance between the right edge of the signal conductive layer and the left edge of the second ground conductive layer in the left-right direction of the multilayer body and is smaller than the distance between the left edge of the signal conductive layer and the right edge of the first ground conductive layer in the left-right direction of the multilayer body.

7. The multilayer substrate according to claim 1, wherein a sectional area of the plurality of first through-holes in a plane perpendicular or substantially perpendicular to the up-down direction of the multilayer body increases as the first through-holes get closer to the signal conductive layer.

8. The multilayer substrate according to claim 1, further comprising:

at least two insulating layers; wherein the at least two insulating layers include:

a first insulating layer located above the signal conductive layer and below the first spacer in the up-down direction of the multilayer body; and a second insulating layer located below the signal conductive layer in the up-down direction of the multilayer body; and a material of the first spacer is identical to a material of the first insulating layer or a material of the second insulating layer.

9. The multilayer substrate according to claim 1, wherein a sub-through-hole is provided in the first spacer, and a shape of the sub-through-hole is different from a shape of the plurality of first through-holes.

10. The multilayer substrate according to claim 1, wherein the multilayer substrate includes an uncurved section, which is not curved, and a curved section, which is curved in an arc shape or is bent;

a direction which is perpendicular or substantially perpendicular to the up-down direction of the multilayer body and perpendicular or substantially perpendicular to an extending direction of the signal conductive layer is defined as a left-right direction of the multilayer body;

the up-down direction of the multilayer body in a region where the uncurved section is provided is defined as an up-down direction;

the left-right direction of the multilayer body in a region where the uncurved section is provided is defined as a left-right direction; and the multilayer substrate is bent in the up-down direction in the curved section or is curved in an arc shape in a left-right direction in the curved section.

11. The multilayer substrate according to claim 10, wherein the first spacer is located in the curved section.

12. The multilayer substrate according to claim 11, wherein a hollow portion, which is a portion sealed by the at least one insulating layer, is provided in the uncurved section.

13. The multilayer substrate according to claim 1, further comprising:

an outer electrode electrically connected to the signal conductive layer; wherein the outer electrode is structured to electrically connect the multilayer substrate to a circuit board outside the multilayer substrate; and the first spacer overlaps the outer electrode as viewed in the up-down direction of the multilayer body.

14. The multilayer substrate according to claim 1, further comprising:

a plurality of the first spacers; wherein the plurality of the first spacers are adjacent to each other in the up-down direction of the multilayer body.

15. The multilayer substrate according to claim 1, further comprising:

a second spacer located below the signal conductive layer in the up-down direction of the multilayer body; wherein a plurality of fourth through-holes passing through the second spacer in the up-down direction of the multilayer body are provided in the second spacer;

the plurality of the fourth through-holes are arranged along an extending direction of the signal conductive layer;

regarding the plurality of the fourth through-holes arranged along the extending direction of the signal conductive layer, a distance between centroids of fourth through-holes adjacent to each other of the plurality of fourth through-holes is uniform or substantially uniform as viewed in the up-down direction of the multilayer body; and positions of the first through-holes are different from positions of the fourth through-holes as viewed in the up-down direction of the multilayer body.

16. The multilayer substrate according to claim 1, wherein a shape of the first through-holes on a top surface and a bottom surface of the first spacer is a circle or a regular polygon.

17. The multilayer substrate according to claim 16, wherein the circle or the regular polygon is line-symmetrical with respect to an axis of symmetry or is point-symmetrical with respect to a point of symmetry, the point of symmetry being a point positioned at a center of the circle or the regular polygon.

18. The multilayer substrate according to claim 17, wherein a first line extends along the signal conductive layer;

when the circle or the regular polygon is line-symmetrical, the axis of symmetry is positioned on the first line with respect to each of a plurality of the at least two of the plurality of the first through-holes arranged along the first line;

when the regular polygon is point-symmetrical, the point of symmetry is positioned on the first line with respect to each of a plurality of the at least two of the plurality of the first through-holes arranged along the first line;

when the regular polygon is point-symmetrical, an angle between the first line and a side of the regular polygon which intersects with the first line is set as viewed in the up-down direction of the multilayer body, the angle is about 90 degrees or smaller; and when the regular polygon is point-symmetrical, the angle of the regular polygon of each of the first through-holes is identical or substantially identical.

19. The multilayer substrate according to claim 1, wherein a diameter of the first through-holes is smaller than a width of the signal conductive layer in a left-right direction of the multilayer body, as viewed in the up-down direction of the multilayer body; and when a shape of the first through-holes on a top surface and a bottom surface of the first spacer is a regular polygon, a length of a side of the regular polygon of each of the first through-holes is smaller than the width of the signal conductive layer in the left-right direction of the multilayer body, as viewed in the up-down direction of the multilayer body.

20. The multilayer substrate according to claim 1, wherein a diameter of the first through-holes is larger than a thickness of the first spacer in the up-down direction of the multilayer body; and when a shape of the first through-holes on a top surface and a bottom surface of the first spacer is a regular polygon, a length of a side of the regular polygon of each of the first through-holes is larger than the thickness of the first spacer in the up-down direction of the multilayer body.

21. The multilayer substrate according to claim 1, wherein the plurality of the first through-holes have a same or substantially a same shape.

22. The multilayer substrate according to claim 1, wherein a shape of the first through-holes on a top surface and a bottom surface of the first spacer is a regular hexagon.

23. An electronic device comprising:

the multilayer substrate according to claim 1.

* * * * *